United States Patent
Morisaki et al.

(10) Patent No.: US 11,271,043 B2
(45) Date of Patent: Mar. 8, 2022

(54) SEMICONDUCTOR MODULE AND POWER CONVERSION APPARATUS

(71) Applicant: Mitsubishi Electric Corporation, Chiyoda-ku (JP)

(72) Inventors: Shota Morisaki, Chiyoda-ku (JP); Yoshiko Tamada, Chiyoda-ku (JP); Junichi Nakashima, Chiyoda-ku (JP); Daisuke Oya, Chiyoda-ku (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 45 days.

(21) Appl. No.: 16/488,752

(22) PCT Filed: Apr. 11, 2018

(86) PCT No.: PCT/JP2018/015198
§ 371 (c)(1),
(2) Date: Aug. 26, 2019

(87) PCT Pub. No.: WO2018/193929
PCT Pub. Date: Oct. 25, 2018

(65) Prior Publication Data
US 2020/0266240 A1    Aug. 20, 2020

(30) Foreign Application Priority Data
Apr. 19, 2017   (JP) .............................. JP2017-083088

(51) Int. Cl.
*H01L 27/30*    (2006.01)
*H01L 27/108*   (2006.01)
(Continued)

(52) U.S. Cl.
CPC ...... *H01L 27/301* (2013.01); *H01L 27/10867* (2013.01); *H01L 27/302* (2013.01);
(Continued)

(58) Field of Classification Search
CPC . H01L 27/301; H01L 27/302; H01L 29/7398; H01L 29/7394; H01L 29/7395;
(Continued)

(56) References Cited

U.S. PATENT DOCUMENTS 5,635,823 A * 6/1997 Murakami ......... H03K 17/0822
                                                    323/277
6,147,368 A * 11/2000 Kon ........................ H01L 24/72
                                                    257/146
(Continued)

FOREIGN PATENT DOCUMENTS

JP    2009-259990 A    11/2009
JP    2010-027710      *  2/2010 ............. H01L 25/18
(Continued)

OTHER PUBLICATIONS

Decentralized active gate control for current balancing of parallel connected IGBT modules, Y. Lobsiger et al., Proceedings of the 2011 14th European Conference on Power Electronics and Applications, 2011, pp. 1-10. (Year: 2011).*

(Continued)

*Primary Examiner* — S M Sohel Imtiaz
(74) *Attorney, Agent, or Firm* — Xsensus LLP

(57) ABSTRACT

An emitter interconnection connecting the emitter of a semiconductor switching element to a negative electrode is different in one or both of length and width from an emitter interconnection connecting the emitter of a semiconductor switching element to the negative electrode. At the time of switching, an induced electromotive force is generated at a gate control wire, or at a gate pattern, or at an emitter wire, by at least one of a current flowing through a positive electrode and a current flowing through the negative electrode, so as to reduce the difference between the emitter potential of the semiconductor switching element and the (Continued)

emitter potential of the semiconductor switching element caused by the difference.

17 Claims, 41 Drawing Sheets

(51) Int. Cl.
*H02M 7/48* (2007.01)
*H01L 29/739* (2006.01)
(52) U.S. Cl.
CPC ...... *H01L 29/7393* (2013.01); *H01L 29/7394* (2013.01); *H01L 29/7395* (2013.01); *H01L 29/7398* (2013.01); *H02M 7/48* (2013.01)
(58) Field of Classification Search
CPC ........... H01L 29/7393; H01L 27/10867; H01L 24/06; H01L 24/48; H01L 2924/10272; H01L 2924/1033; H01L 24/49; H01L 25/072; H01L 2224/49111; H01L 2224/49113; H01L 25/18; H02M 7/48; H02M 7/003; H02M 1/088
See application file for complete search history.

(56) References Cited

U.S. PATENT DOCUMENTS

| | | | |
|---|---|---|---|
| 6,194,884 B1* | 2/2001 | Kesler | G05F 3/222 |
| | | | 323/285 |
| 9,130,476 B2* | 9/2015 | Takizawa | H02M 7/487 |
| 10,049,968 B2* | 8/2018 | Sato | H01L 23/49562 |
| 10,056,309 B2* | 8/2018 | Bando | H01L 23/50 |
| 10,123,443 B2* | 11/2018 | Nakamura | H01L 23/5227 |
| 10,153,708 B2* | 12/2018 | Maruyama | H01L 25/115 |
| 2001/0007252 A1* | 7/2001 | Ito | F02P 3/0554 |
| | | | 123/630 |
| 2012/0119256 A1* | 5/2012 | Okita | H01L 25/072 |
| | | | 257/140 |
| 2012/0280728 A1* | 11/2012 | Hussein | H03K 17/168 |
| | | | 327/155 |
| 2015/0060940 A1* | 3/2015 | Muto | H01L 25/165 |
| | | | 257/140 |
| 2017/0213811 A1* | 7/2017 | Das | H02M 1/084 |

FOREIGN PATENT DOCUMENTS

| | | |
|---|---|---|
| JP | 2010-27710 A | 2/2010 |
| JP | 2013-131590 A | 7/2013 |

OTHER PUBLICATIONS

International Search Report dated Jun. 26, 2018 in PCT/JP2018/015198 filed Apr. 11, 2018.

* cited by examiner

SEMICONDUCTOR MODULE AND POWER CONVERSION APPARATUS

TECHNICAL FIELD

The present invention relates to a semiconductor module and a power conversion apparatus, particularly to a semiconductor module having semiconductor switching elements, and to a power conversion apparatus including such a semiconductor module.

BACKGROUND ART

When a plurality of semiconductor switching elements are connected in parallel, the emitter interconnection distance from an electrode terminal (i.e., a contact surface with an external electrode) differs between the plurality of semiconductor switching elements. This causes a difference in parasitic inductance due to the emitter interconnection, thus disadvantageously deteriorating the reliability of the semiconductor elements.

When an induced electromotive force is generated between the gate and emitter of each semiconductor switching element by a principal current, a difference in gate-emitter voltage arises between the semiconductor switching elements. This unequalizes the currents flowing through the semiconductor switching elements, thus disadvantageously deteriorating the reliability of the semiconductor module.

As an example means to avoid these problems, in PTL 1, semiconductor switching elements are arranged in such a manner that the emitter interconnection lengths are equal between semiconductor switching elements; and that the voltage of induced electromotive force generated by a principal current at the gate control interconnection for each semiconductor switching element is equal to the voltage of induced electromotive force generated by the principal current at the emitter interconnection for the semiconductor switching element.

CITATION LIST

Patent Literature

PTL 1: Japanese Patent Laying-Open No. 2010-027710

SUMMARY OF INVENTION

Technical Problem

The structure described in PTL 1 is effective in a configuration in which the emitter interconnection lengths are equal between semiconductor switching elements.

However, a power semiconductor module, which switches a high current, needs to include a circuit having a plurality of semiconductor elements connected in parallel in accordance with the magnitude of the current. In the case of a plurality of semiconductor switching elements connected in parallel, a larger number of parallel elements leads to a greater difference in interconnection distance from an electrode terminal (i.e., a contact surface with an external electrode). This causes a difference in parasitic inductance between the plurality of semiconductor switching elements, thus deteriorating the reliability of the power semiconductor module.

Therefore, an object of the present invention is to provide a highly reliable semiconductor module and power conversion apparatus by reducing the influences of the difference in parasitic inductance between a plurality of semiconductor switching elements.

Solution to Problem

In order to achieve the object, the present invention includes: a positive electrode; a negative electrode; a first semiconductor switching element and a second semiconductor switching element provided on an insulating plate and connected in parallel between the positive electrode and the negative electrode; a gate control electrode configured to control the gate of the first semiconductor switching element and the gate of the second semiconductor switching element; a gate pattern connected to the gate control electrode; a first gate control wire connecting the gate of the first semiconductor switching element to the gate pattern; a second gate control wire connecting the gate of the second semiconductor switching element to the gate pattern; an emitter pattern connected to the negative electrode; a first emitter wire connecting the emitter of the first semiconductor switching element to the emitter pattern; and a second emitter wire connecting the emitter of the second semiconductor switching element to the emitter pattern. A first emitter interconnection connecting the emitter of the first semiconductor switching element to the negative electrode is different in one or both of length and width from a second emitter interconnection connecting the emitter of the second semiconductor switching element to the negative electrode. At a time of switching, an induced electromotive force is generated at the first gate control wire and the second gate control wire, or at the gate pattern, or at the first emitter wire and the second emitter wire, by at least one of a current flowing through the positive electrode and a current flowing through the negative electrode, so as to reduce the difference between the emitter potential of the first semiconductor switching element and the emitter potential of the second semiconductor switching element caused by the difference.

Advantageous Effects of Invention

The present invention generates an induced electromotive force at the gate control wire or the emitter wire of two semiconductor switching elements connected in parallel, so as to reduce the difference in gate-emitter voltage based on the parasitic inductance between the two semiconductor switching elements. This improves the reliability of the semiconductor module and power conversion apparatus.

DESCRIPTION OF EMBODIMENTS

Embodiments of the present invention are hereinafter described with reference to the drawings.

Embodiment 1

Figure 1:
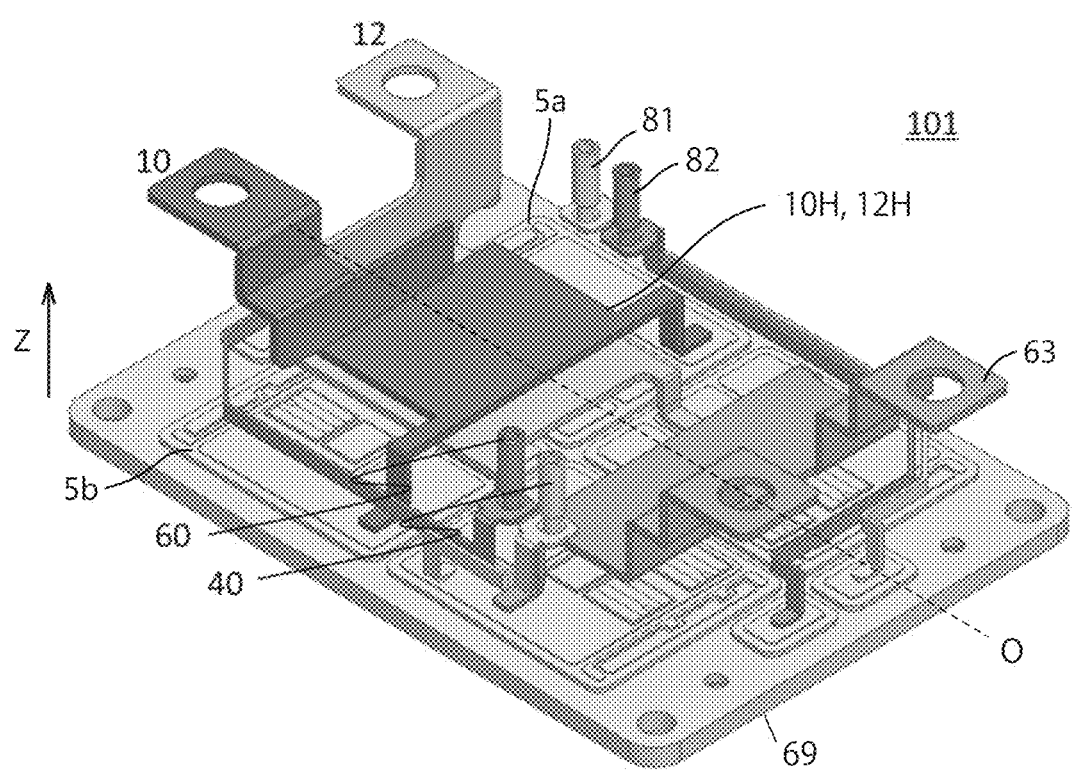
FIG. 1 is a perspective view showing an internal interconnection structure of a semiconductor module according to embodiment 1.
Figure 2:
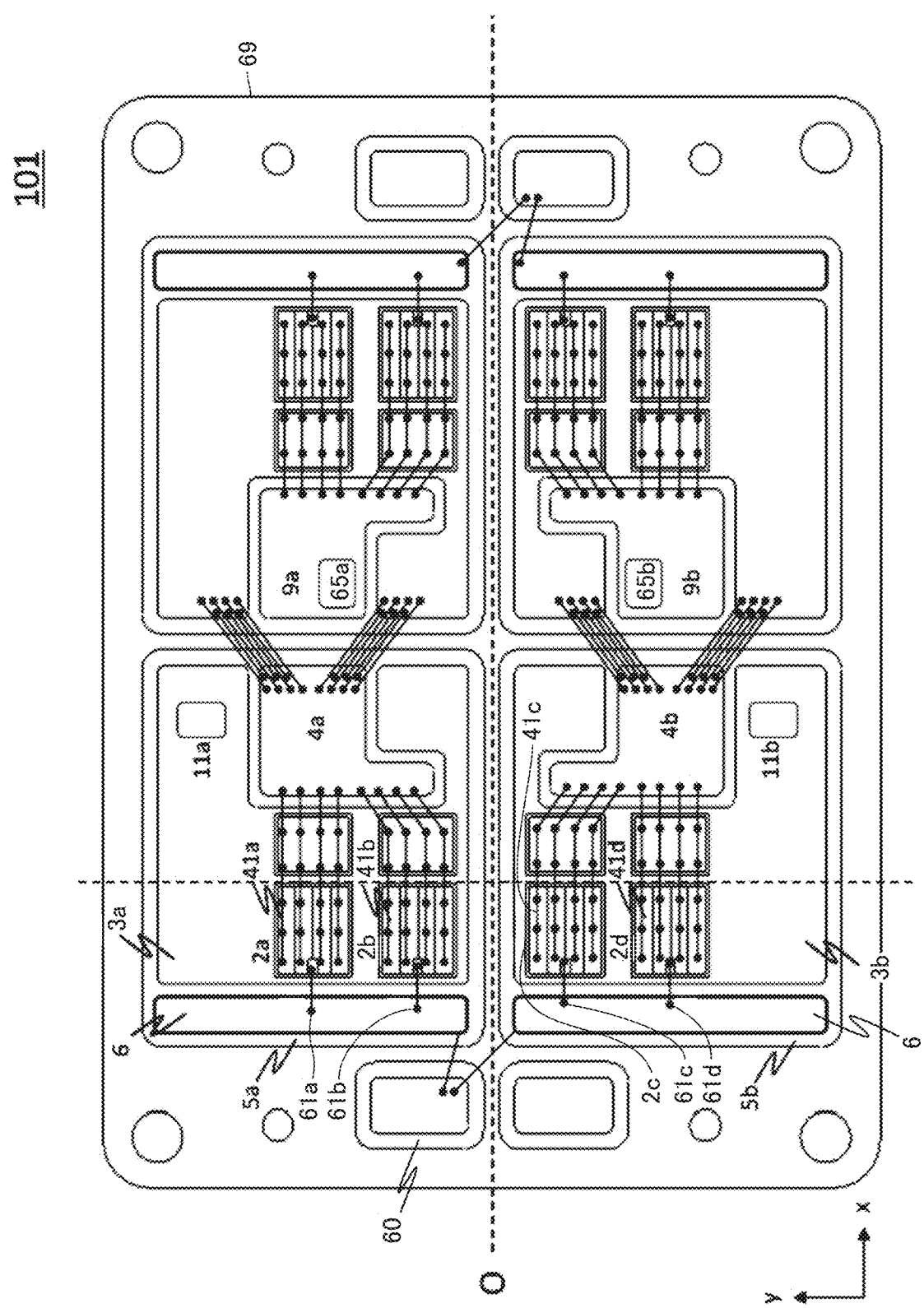
FIG. 2 is a top view of the semiconductor module in embodiment 1, but without an electrode portion.
Figure 3:
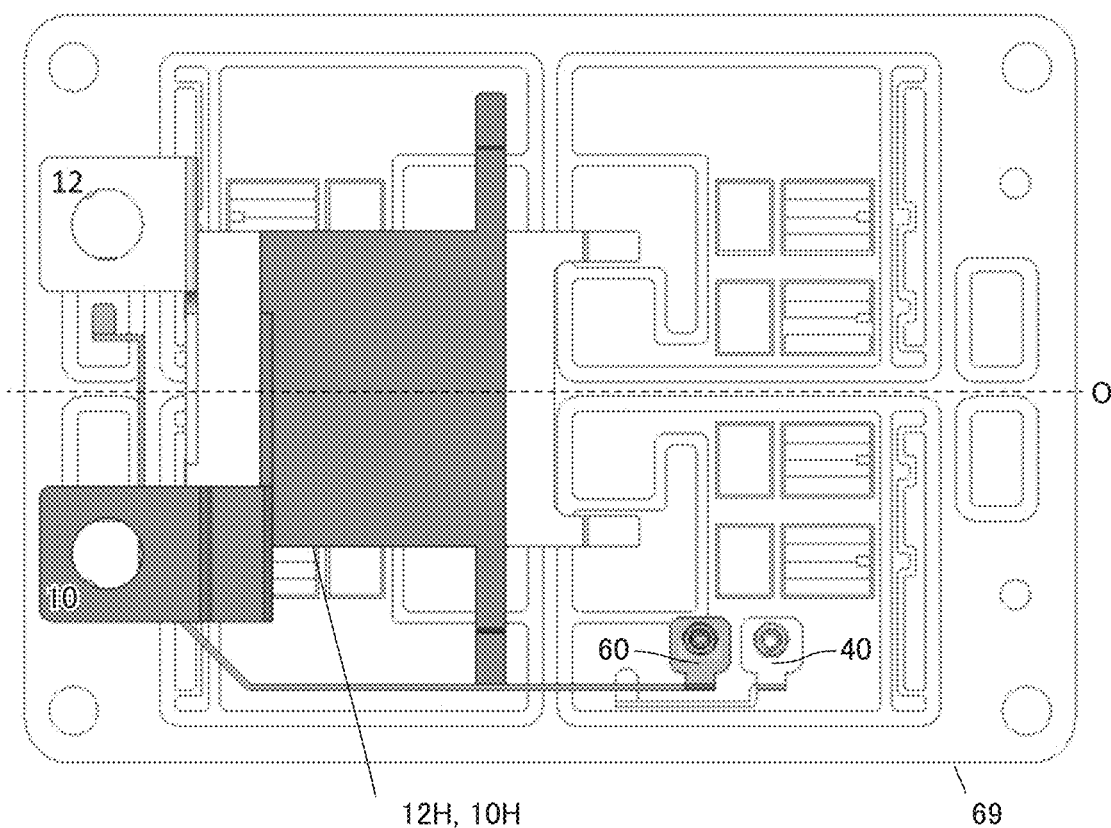
FIG. 3 is a top view of the semiconductor module in embodiment 1 including the electrode portion.
Figure 4:
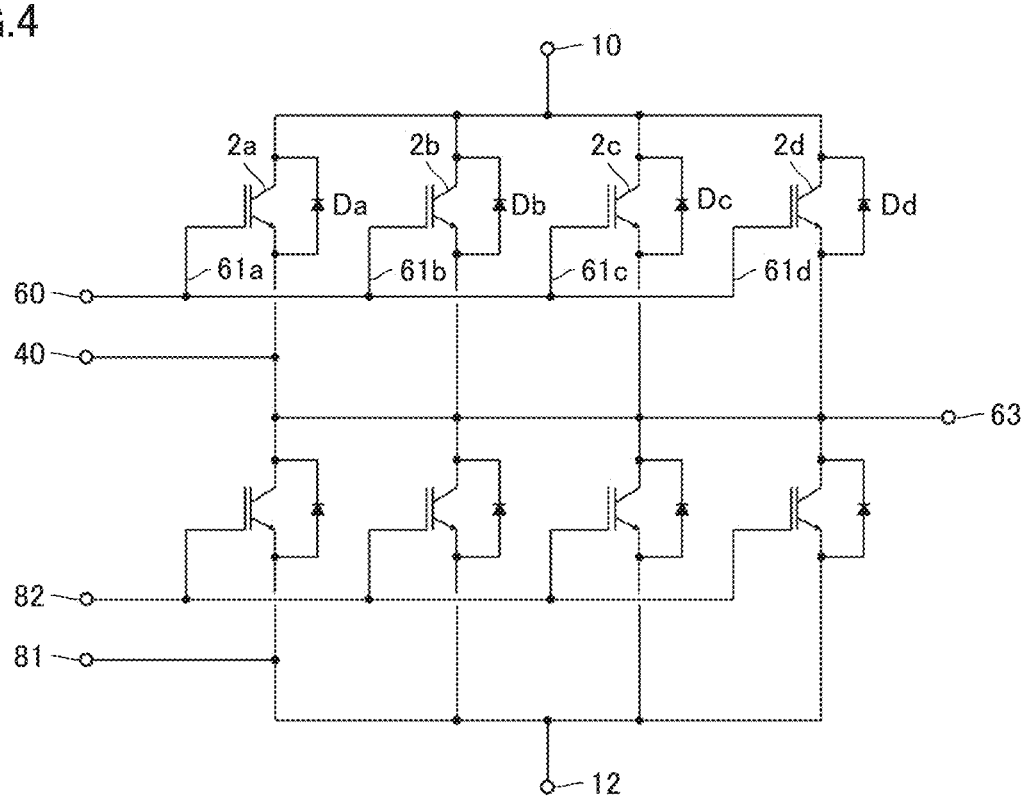
FIG. 4 is a circuit diagram of the main configuration of the semiconductor module in embodiment 1.

FIG. 1 is a perspective view showing an internal interconnection structure of a semiconductor module 101 according to embodiment 1. FIG. 2 is a top view of semiconductor module 101 in embodiment 1, but without an electrode portion. FIG. 3 is a top view of semiconductor module 101 in embodiment 1 including the electrode portion. FIG. 4 is a circuit diagram of the main configuration of semiconductor module 101 in embodiment 1.

With reference to FIG. 4, semiconductor module 101 includes a positive electrode 10, a negative electrode 12, and an output electrode 63. As to an upper arm, semiconductor module 101 further includes a gate control electrode 60, an emitter control electrode 40, semiconductor switching elements 2a, 2b, 2c, 2d, and diodes Da, Db, Dc, Dd.

Semiconductor switching elements 2a, 2b, 2c, 2d are connected in parallel between positive electrode 10 and negative electrode 12b. Diodes Da, Db, Dc, Dd are connected in parallel to semiconductor switching elements 2a, 2b, 2c, 2d.

Gate control electrode 60 is connected to semiconductor switching elements 2a, 2b, 2c, 2d through gate control wires 61a, 61b, 61c, 61d. Gate control electrode 60 controls the gates of semiconductor switching elements 2a, 2b, 2c, 2d.

Emitter control electrode 40 controls the emitters of semiconductor switching elements 2a, 2b, 2c, 2d.

As to a lower arm, semiconductor module 101 has a configuration similar to that of the upper arm. FIG. 1 shows a gate control electrode 82 and an emitter control electrode 81 for the lower arm. In the following, the elements of the upper arm are described. Since the lower arm has the same configuration as the upper arm, the explanation is not repeated for the lower arm.

FIG. 1 shows a three-dimensional configuration including: a base plate 69; positive electrode 10; negative electrode 12; insulating plates 5a, 5b; output electrode 63; gate control electrode 60 and emitter control electrode 40 of the upper arm; and gate control electrode 82 and emitter control electrode 81 of the lower arm.

In FIG. 2, the lengthwise direction of base plate 69 is defined as an x-axis direction, and the widthwise direction of base plate 69 is defined as a y-axis direction. Semiconductor switching elements 2a, 2b, made of insulated gate bipolar transistor (IGBT) chips or the like, are disposed on a collector pattern 3a on insulating plate 5a. Semiconductor switching elements 2c, 2d are disposed on a collector pattern 3b on insulating plate 5b. The collectors of semiconductor switching elements 2a, 2b are connected to collector pattern 3a via solder or the like. The collectors of semiconductor switching elements 2c, 2d are connected to collector pattern 3b via solder or the like. Collector patterns 3a, 3b are disposed on insulating plates 5a, 5b.

The emitters of semiconductor switching elements 2a, 2b, 2c, 2d are connected to emitter patterns 4a, 4b via emitter wires 41a, 41b, 41c, 41d. Emitter patterns 4a, 4b are disposed on insulating plates 5a, 5b.

Emitter interconnections EMA, EMB, EMC, EMD for semiconductor switching elements 2a, 2b, 2c, 2d are interconnections that connect the emitters of semiconductor switching elements 2a, 2b, 2c, 2d to negative electrode 12. Emitter interconnections EMA, EMB, EMC, EMD include emitter wires 41a, 41b, 41c, 41d.

Positive electrode 10 is connected to collector patterns 3a, 3b via positive electrode joints 11a, 11b.

Negative electrode 12 is connected to emitter patterns 9a, 9b for the semiconductor switching elements of the opposite arm (lower arm) via negative electrode joints 65a, 65b.

With reference to FIG. 1, the direction which is perpendicular to base plate 69, insulating plate 5a, and insulating plate 5b, and in which insulating plates 5a, 5b are placed is defined as a vertical direction (z-axis direction).

A part (part 10H) of positive electrode 10 that is parallel to insulating plates 5a, 5b coincides in position with a part (part 12H) of negative electrode 12 that is parallel to insulating plates 5a, 5b, as seen in the vertical direction. The layer where part 12H is disposed is located below the layer where part 10H is disposed. Therefore, part 12H is located closer to insulating plates 5a, 5b than part 10H is. In embodiment 1, part 12H is defined as a proximal electrode part.

With reference to FIG. 2, gate control electrode 60 for controlling semiconductor switching elements 2a, 2b, 2c, 2d is connected to a gate pattern 6. Gate pattern 6 is connected to the gates of semiconductor switching elements 2a, 2b, 2c, 2d via gate control wires 61a, 61b, 61c, 61d.

Further, emitter control electrode 40 for controlling semiconductor switching elements 2a, 2b, 2c, 2d is connected to emitter pattern 4a.

The positions of semiconductor switching elements 2a, 2b, 2c, 2d in the x-axis direction are the same.

The operation of semiconductor module 101 shown in embodiment 1 at the time of turn-on is described with reference to FIG. 5, FIG. 6, and FIG. 7. In particular, the main circuit pattern on insulating plates 5a, 5b, and the part of positive electrode 10 and the part of negative electrode 12 that coincide in position with each other are generally symmetrical with respect to symmetry line O. Thus, semiconductor switching elements 2a, 2b are focused on and described.

In embodiment 1, emitter interconnection EMA connecting the emitter of semiconductor switching element 2a to negative electrode 12 may be different from emitter interconnection EMB connecting the emitter of semiconductor switching element 2b to negative electrode 12 in interconnection length or interconnection width, or in both interconnection length and interconnection width. In such a case, a difference may arise between the parasitic inductances (i.e., emitter inductances) on emitter interconnections EMA and EMB for semiconductor switching elements 2a and 2b.

Figure 5:
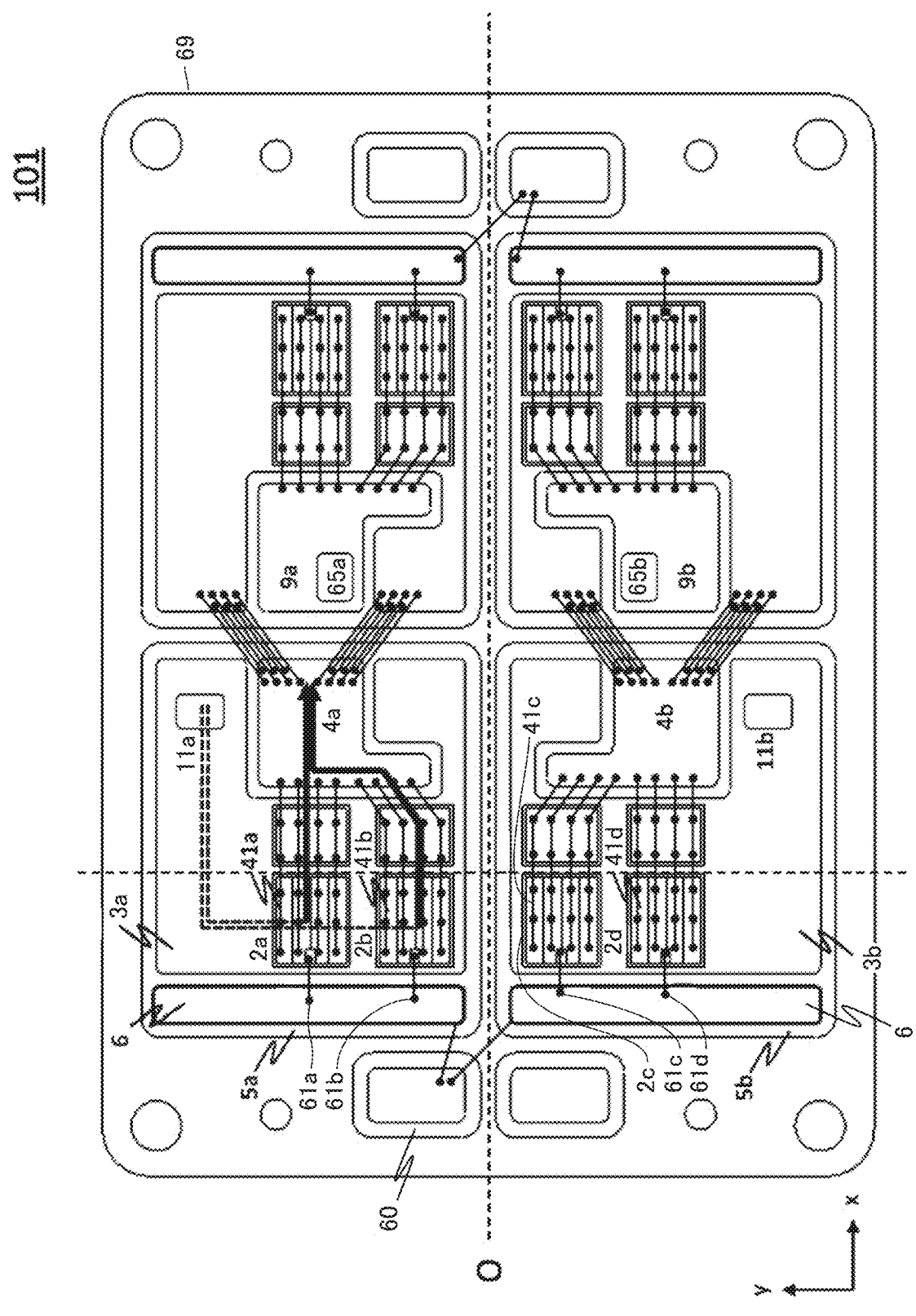
FIG. 5 is a diagram showing a place where a difference in emitter inductance arises between semiconductor switching elements in the semiconductor module in embodiment 1.
Figure 6:
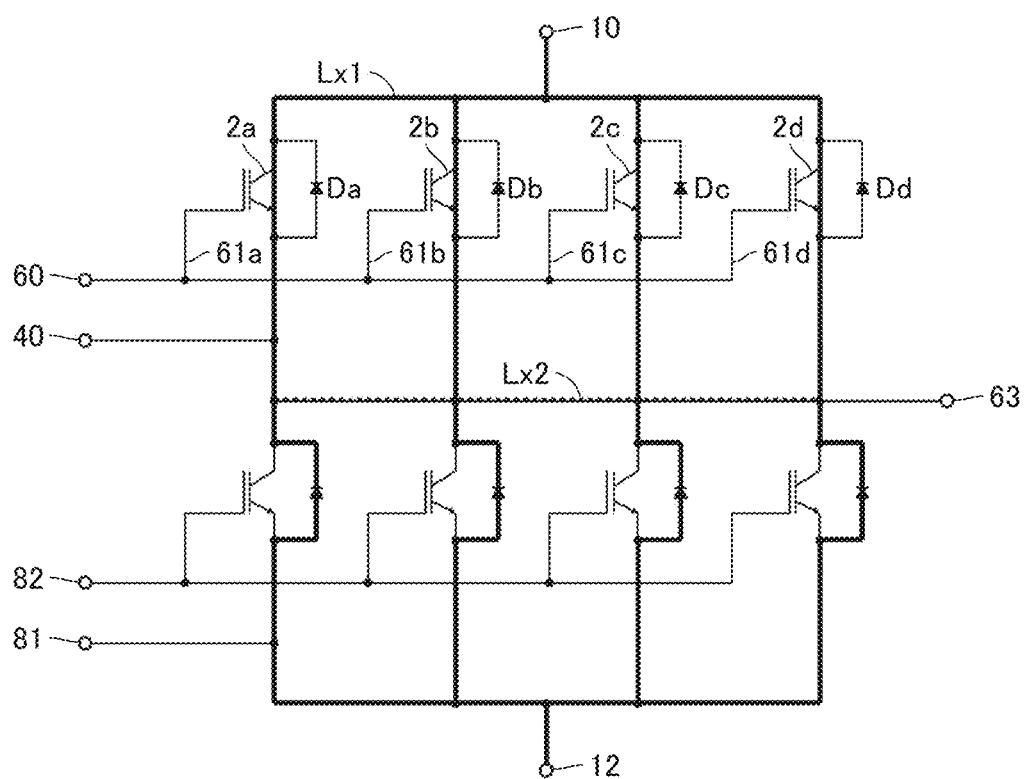
FIG. 6 is a diagram showing a current path in the semiconductor module.

As shown in FIG. 5, at the thick arrow portions, there is a path length difference between the path from the emitter of semiconductor switching element 2b to negative electrode 12, and the path from the emitter of semiconductor switching element 2a to negative electrode 12. Accordingly, the emitter inductance of semiconductor switching element 2b is higher than the emitter inductance of semiconductor switching element 2a. That is, La<Lb is satisfied, where La denotes the emitter inductance of semiconductor switching element 2a, and Lb denotes the emitter inductance of semiconductor switching element 2b.

At this time, when semiconductor module 101 is turned on, a pulsed voltage is applied to the gates of semiconductor switching elements 2a to 2d simultaneously. Then, a current i flowing from positive electrode 10 to negative electrode 12 (hereinafter also referred to as a principal current) varies with time. That is, a current change di/dt occurs. FIG. 6 is a diagram showing a current path in semiconductor module 101. In FIG. 6, the thick line indicates current path LX1 of principal current i. Principal current i flowing through the dotted line portion is negligibly small in the configuration of the present embodiment.

When current change di/dt occurs, an induced electromotive force Va=La×di/dt is generated at emitter interconnection EMA for semiconductor switching element 2a, based on emitter inductance La of semiconductor switching element 2a and current change di/dt. Also, an induced electromotive force Vb=Lb×di/dt is generated at emitter interconnection EMB for semiconductor switching element 2b, based on emitter inductance Lb of semiconductor switching element 2b and current change di/dt. Since La<Lb is satisfied, Va<Vb is satisfied. That is, where the emitter potential of semiconductor switching element 2a is denoted by Vea, and the emitter potential of semiconductor switching element 2b is denoted by Veb, Vea is lower than Veb due to the difference between the induced electromotive forces generated at emitter interconnections EMA and EMB for semiconductor switching elements 2a and 2b, thus satisfying Vea<Veb. A difference in emitter potential between two semiconductor switching elements 2a and 2b will cause a difference in gate-emitter voltage between two semiconductor switching elements 2a and 2b, thus unequalizing the currents flowing through semiconductor switching elements 2a and 2b connected in parallel.

Figure 7:
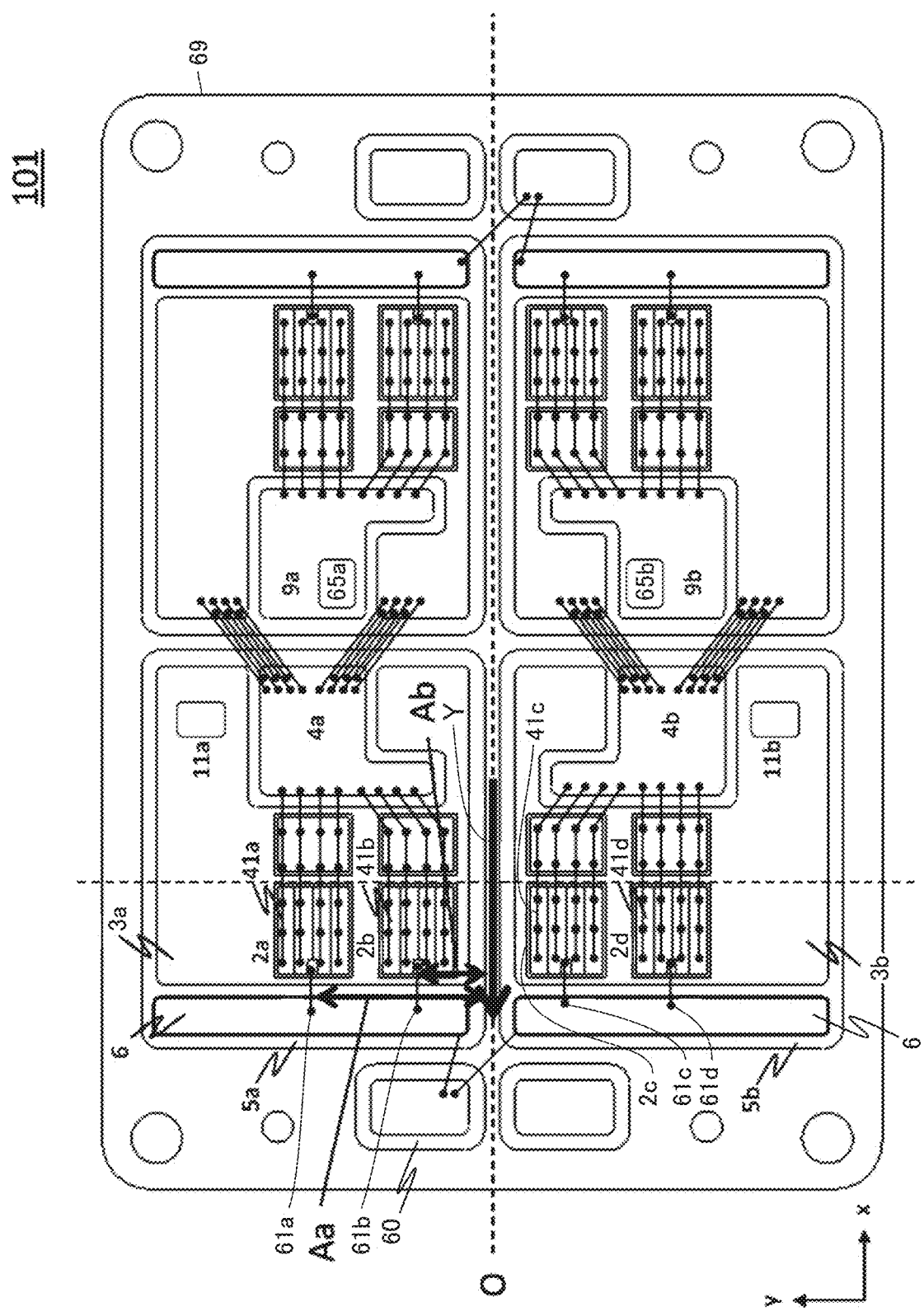
FIG. 7 is a diagram showing a current path of principal current in a proximal electrode part included in a negative electrode in embodiment 1.

In view of the above, in embodiment 1, gate control wires 61a, 61b for semiconductor switching elements 2a, 2b are arranged parallel to current path Y of principal current in proximal electrode part 12H included in negative electrode 12, as shown in FIG. 7. The direction of current through the current path of principal current in proximal electrode part 12H (the negative direction in the x-axis) is opposite to the direction of current flowing through gate control wire 61a and gate control wire 61b (the positive direction in the x-axis).

Further, gate control wires 61a, 61b are arranged so that Aa>Ab is satisfied, where Aa denotes the distance from current path Y of principal current in proximal electrode part 12H included in negative electrode 12 to gate control wire 61a for semiconductor switching element 2a, and Ab denotes the distance from current path Y of principal current in proximal electrode part 12H included in negative electrode 12 to gate control wire 61b for semiconductor switching element 2b.

Figure 8:
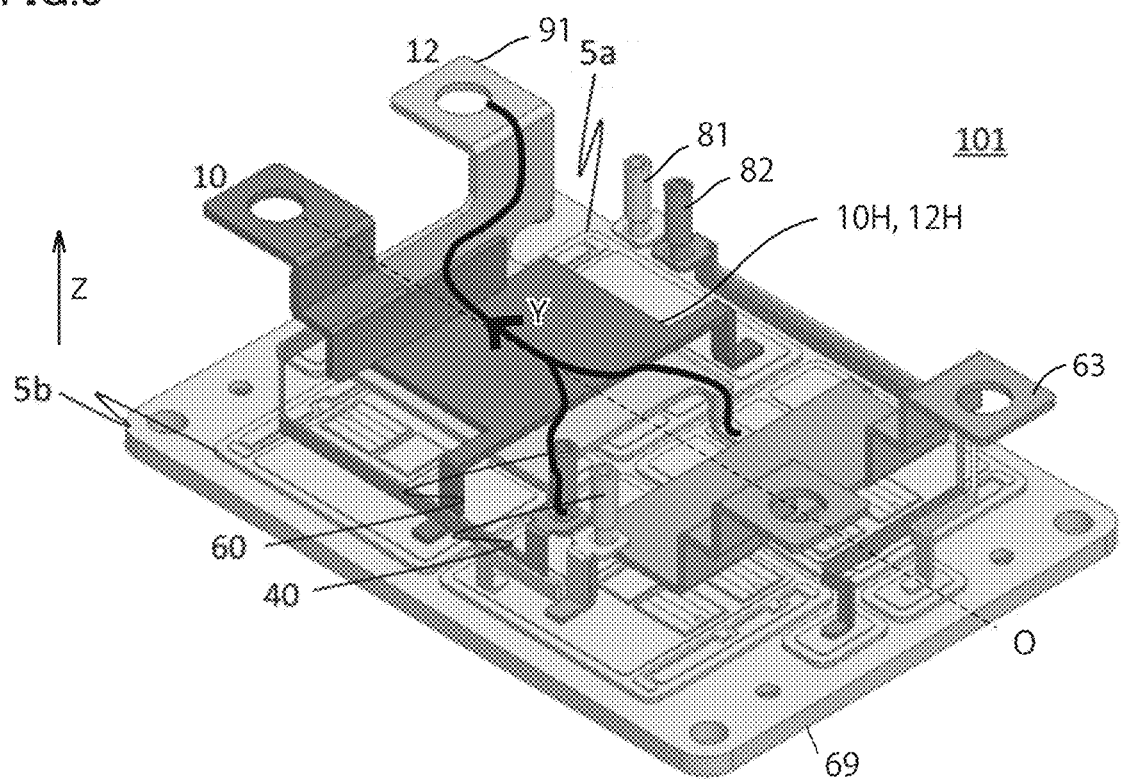
FIG. 8 is a diagram showing a current path of principal current in the negative electrode in embodiment 1.
Figure 9:
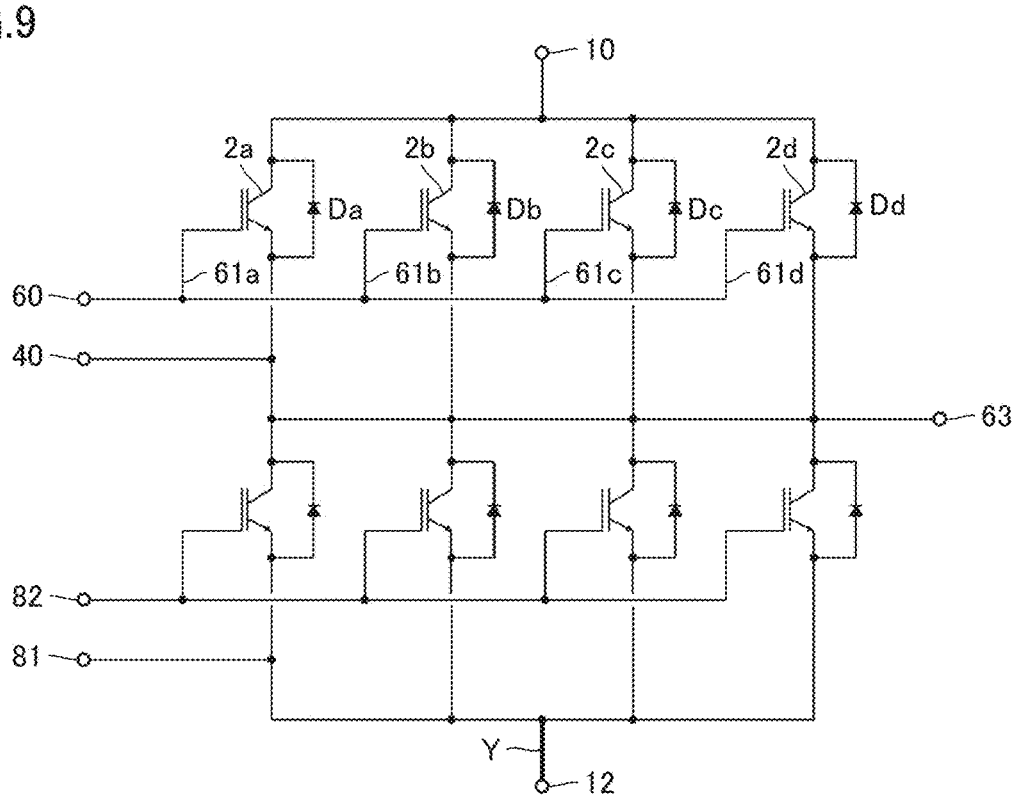
FIG. 9 is a diagram showing a current path of principal current in the negative electrode in embodiment 1.

FIG. 8 and FIG. 9 are diagrams showing a current path of principal current in negative electrode 12 in embodiment 1.

In FIG. 8 and FIG. 9, as indicated by the thick line, the current path of principal current in negative electrode 12 is the path from negative electrode joints 65a, 65b to a terminal 91 of negative electrode 12. Proximal electrode part 12H included in negative electrode 12 is symmetric with respect to symmetry line O. Therefore, the current density is highest at symmetry line O as the center line of proximal electrode part 12H. The place where the current density is highest in proximal electrode part 12H of negative electrode 12 is defined as current path Y of principal current in proximal electrode part 12H.

With gate control wires 61a, 61b for semiconductor switching elements 2a, 2b being arranged in such a manner, when gate control wires 61a, 61b are linked with magnetic fluxes due to a variation with time of principal current flowing through current path Y in proximal electrode part 12H of negative electrode 12, then an induced electromotive force Ga is generated at gate control wire 61a for semiconductor switching element 2a, and an induced electromotive force Gb is generated at gate control wire 61b for semiconductor switching element 2b. At this time, induced electromotive forces Ga, Gb are generated so that the potential is higher at the gates of semiconductor switching elements 2a, 2b than at gate pattern 6. At this time, the generation of induced electromotive force increases with decreasing distance from the principal current flowing through current path Y in proximal electrode part 12H to gate control wires 61a, 61b for semiconductor switching elements 2a, 2b. Therefore, Ga<Gb is satisfied for induced electromotive forces Ga, Gb generated on gate control wires 61a, 61b connected to semiconductor switching elements 2a, 2b.

Since gate pattern 6 connecting gate control wires 61a, 61b for semiconductor switching elements 2a, 2b is orthogonal to current path Y of principal current in proximal electrode part 12H of negative electrode 12, an induced electromotive force is not generated on gate pattern 6. Accordingly, gate pattern 6 has almost the same potential. Therefore, gate potential Vga of semiconductor switching element 2a is lower than gate potential Vgb of semiconductor switching element 2b, thus satisfying Vga<Vgb.

Figure 10:
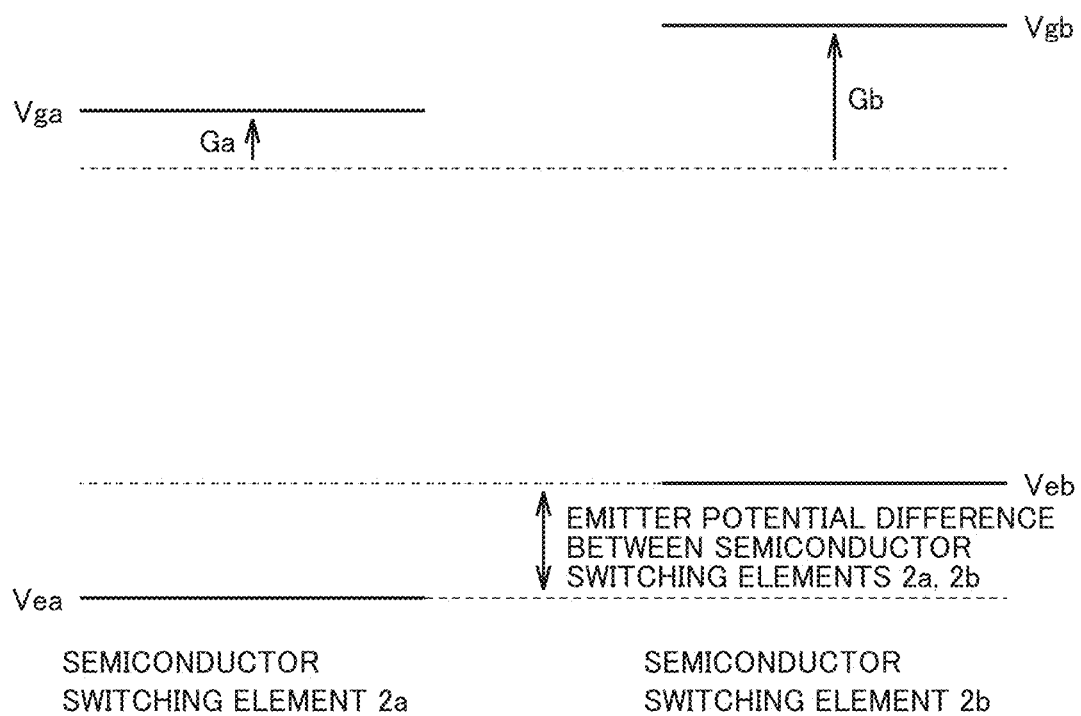
FIG. 10 is a diagram showing potentials of two semiconductor switching elements according to embodiment 1.

Thus, as shown in FIG. 10, the difference (Vgb−Vga) arises between the induced electromotive forces generated at gate control wires 61a and 61b for semiconductor switching elements 2a and 2b, so as to reduce the difference (Veb−Vea) in gate-emitter voltage caused by the emitter inductance difference between semiconductor switching elements 2a and 2b. This results in reduction of the difference (Veb−Vea) in gate-emitter voltage between semiconductor switching elements 2a and 2b, thus equalizing the currents flowing through semiconductor switching elements 2a and 2b.

The above description considers the influences of current path Y of principal current in proximal electrode part 12H of negative electrode 12, but does not consider the influences of the current path of principal current in positive electrode 10. This is because the upper electrode in the vertical direction is remoter from the gate control wires than the lower electrode is. In other words, the upper electrode produces a much lower induced electromotive force at the gate control wires than the lower electrode.

As described above, the present embodiment can equalize the currents flowing through the semiconductor switching elements, thus providing a long-life, reliable semiconductor module. Also, since an excessive current does not flow, the energy consumption can be reduced.

Further, the present embodiment can equalize the heat generation among the semiconductor switching elements, preventing partially high heat generation from a particular semiconductor switching element. Accordingly, a small cooling structure suffices, thus reducing the weight. This can also reduce the size of the entire apparatus, thus reducing the size of the package. Such a small-size apparatus is eco-friendly because it produces less waste when discarded.

Embodiment 2

A semiconductor module 102 in embodiment 2 is substantially similar in configuration to semiconductor module 101 in embodiment 1.

In embodiment 2, the emitter inductance of semiconductor switching element 2a is lower than the emitter inductance of semiconductor switching element 2b, as in embodiment 1. That is, La<Lb is satisfied, where La denotes the emitter inductance of semiconductor switching element 2a, and Lb denotes the emitter inductance of semiconductor switching element 2b. At this time, as in embodiment 1, when the semiconductor module is turned on and the main circuit current varies with time, gate-emitter voltage Vea of semiconductor switching element 2a is lower than gate-emitter voltage Veb of semiconductor switching element 2b, thus satisfying Vea<Veb.

In embodiment 1, gate control wires 61a, 61b for semiconductor switching elements 2a, 2b are arranged parallel to current path Y of principal current in proximal electrode part 12H of negative electrode 12, and the distance from current path Y of principal current in proximal electrode part 12H to gate control wire 61a for semiconductor switching element 2a is longer than the distance from current path Y of principal current in proximal electrode part 12H to gate control wire 61b for semiconductor switching element 2b.

Figure 11:
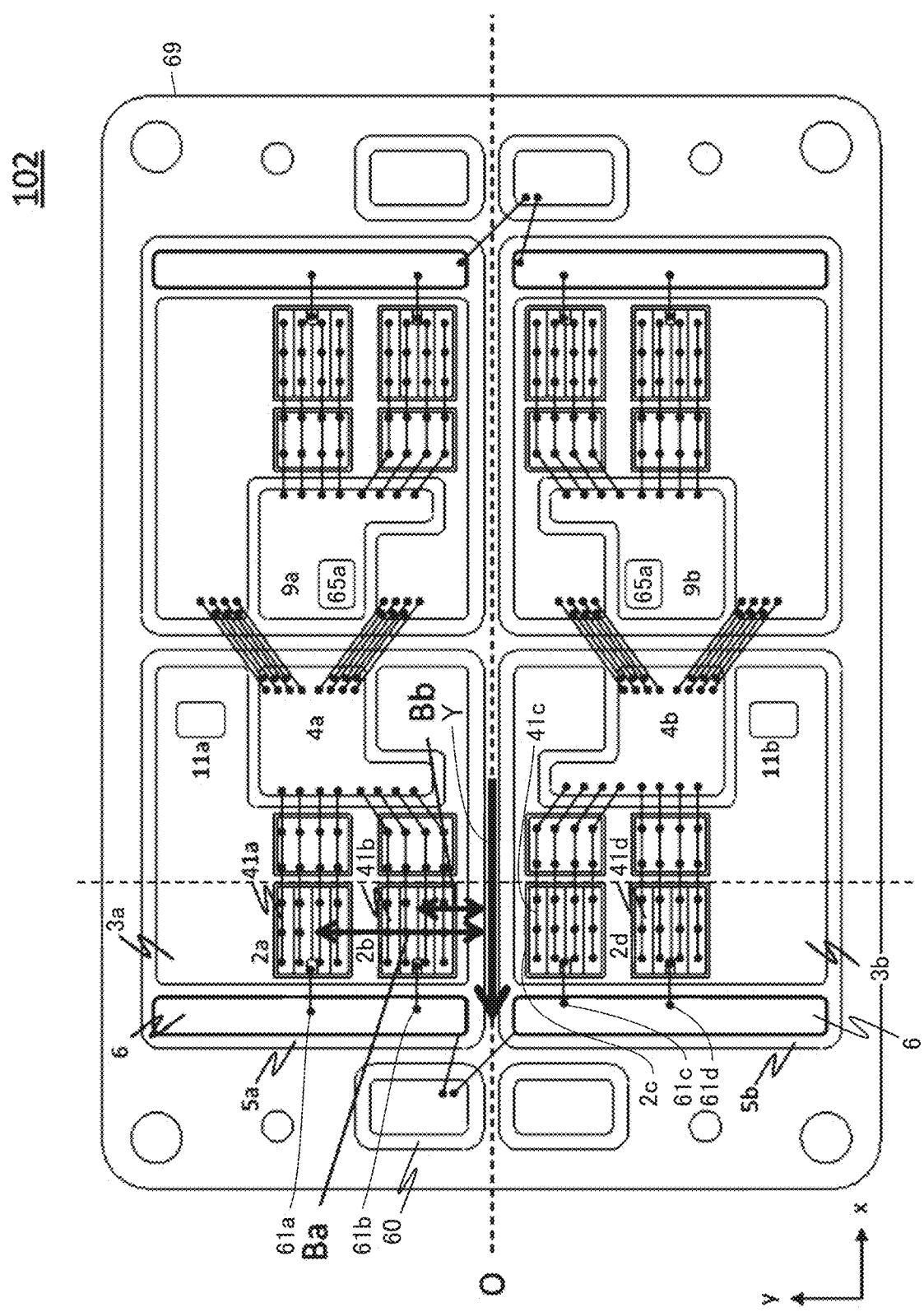
FIG. 11 is a diagram showing a current path of principal current in a proximal electrode part included in a negative electrode in embodiment 2.

In embodiment 2, however, emitter wires 41a, 41b for semiconductor switching elements 2a, 2b are arranged parallel to current path Y of principal current in proximal electrode part 12H, as shown in FIG. 11. The direction of principal current through current path Y in proximal electrode part 12H (the negative direction in the x-axis) is opposite to the direction of current flowing through emitter wire 41a and emitter wire 41b (the positive direction in the x-axis). Further, emitter wires 41a, 41b are arranged so that Ba>Bb is satisfied, where Ba denotes the distance from current path Y of principal current in proximal electrode part 12H to emitter wire 41a for semiconductor switching element 2a, and Bb denotes the distance from current path Y of principal current in proximal electrode part 12H to emitter wire 41b for semiconductor switching element 2b.

With emitter wires 41a, 41b for semiconductor switching elements 2a, 2b being arranged in such a manner, when emitter wires 41a, 41b are linked with magnetic fluxes due to a variation with time of principal current flowing through current path Y in proximal electrode part 12H, then an induced electromotive force Ea is generated at emitter wire 41a for semiconductor switching element 2a, and an induced electromotive force Eb is generated at emitter wire 41b for semiconductor switching element 2b. At this time, induced electromotive forces Ea, Eb are generated so that the potential is higher at emitter pattern 4a than at the emitters of semiconductor switching elements 2a, 2b. At this time, the generation of induced electromotive force increases with decreasing distance from the principal current flowing through current path Y in proximal electrode part 12H to emitter wires 41a, 41b for semiconductor switching elements 2a, 2b. Therefore, Ea<Eb is satisfied for induced electromotive forces Ea, Eb generated on emitter wires 41a, 41b for semiconductor switching elements 2a, 2b.

Figure 12:
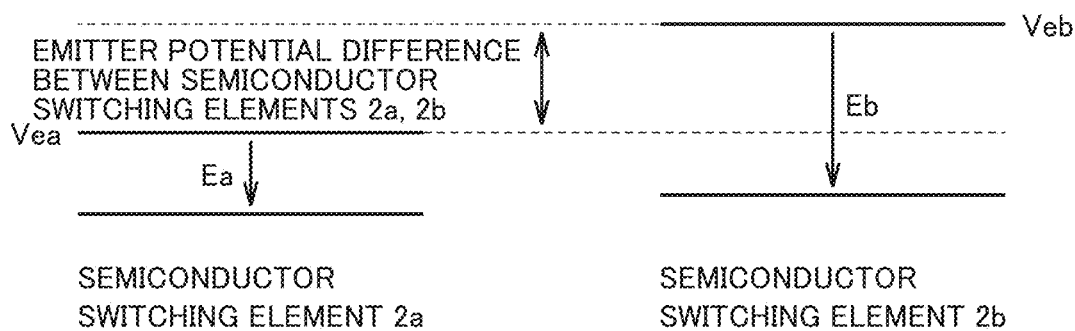
FIG. 12 is a diagram showing potentials of two semiconductor switching elements according to embodiment 2.

Thus, as shown in FIG. 12, the difference (Eb−Ea) arises between the induced electromotive forces generated at emitter wires 41a and 41b for semiconductor switching elements 2a and 2b, so as to reduce the difference (Veb−Vea) in gate-emitter voltage caused by the emitter inductance difference between semiconductor switching elements 2a and 2b. This results in reduction of the difference (Veb−Vea) in gate-emitter voltage between semiconductor switching elements 2a and 2b, thus equalizing the currents flowing through semiconductor switching elements 2a and 2b.

Further, since current change di/dt at emitter wires 41b, 41c for semiconductor switching elements 2b, 2c is parallel to and in the opposite direction to current change di/dt at negative electrode 12, the magnetic fluxes cancel each other to reduce the inductance.

As described above, the present embodiment can equalize the currents flowing through the semiconductor switching elements, thus providing a long-life, reliable semiconductor module. Also, the present embodiment can reduce the internal inductance of the semiconductor module.

Embodiment 3

Figure 13:
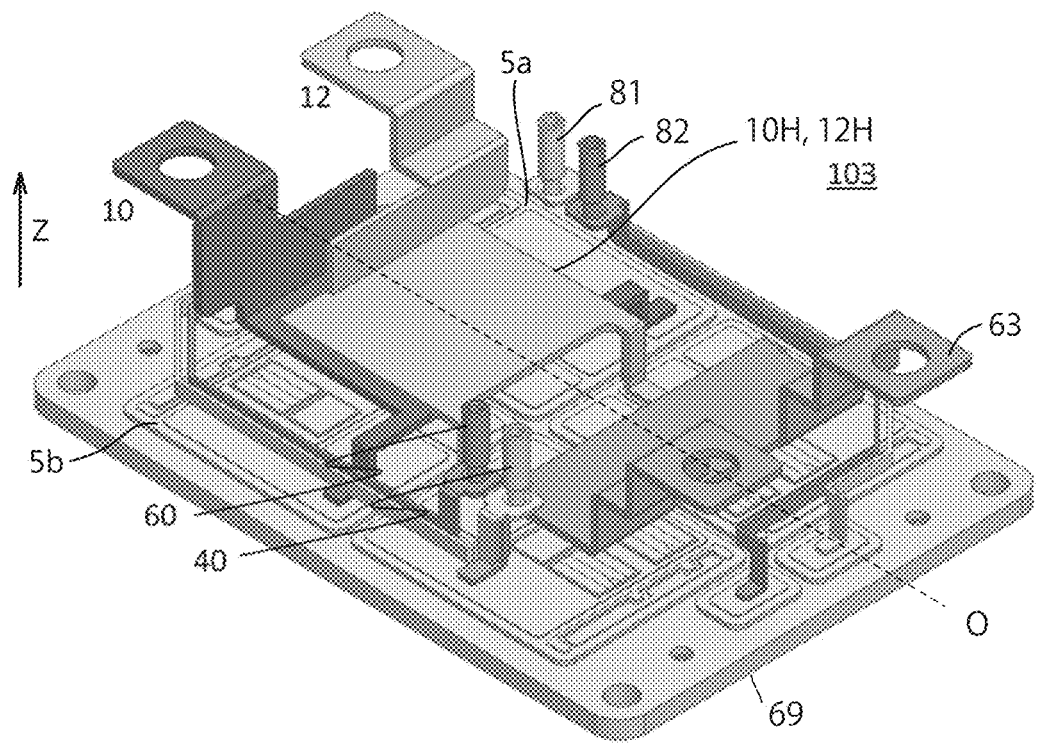
FIG. 13 is a perspective view showing an internal interconnection structure of a semiconductor module according to embodiment 3.
Figure 14:
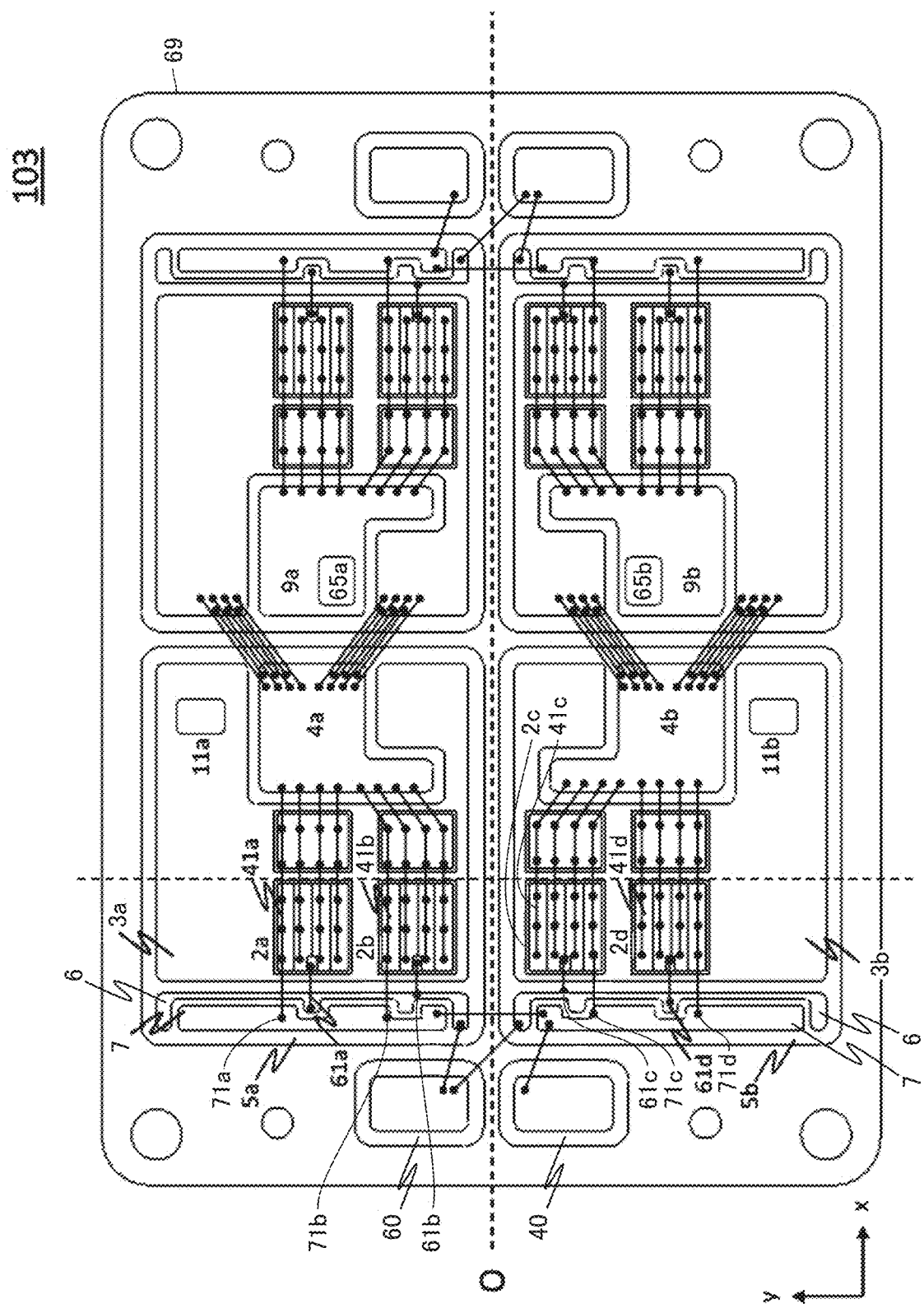
FIG. 14 is a top view of the semiconductor module in embodiment 3, but without an electrode portion.

FIG. 13 is a perspective view showing an internal interconnection structure of a semiconductor module 103 according to embodiment 3. FIG. 14 is a top view of semiconductor module 103 in embodiment 3, but without an electrode portion.

Semiconductor module 103 in embodiment 3 is different from semiconductor module 101 in embodiment 1 in that semiconductor module 103 further includes an emitter control pattern and emitter control wires. Specifically, emitter control electrode 40 for controlling semiconductor switching elements 2a, 2b, 2c, 2d is connected to an emitter control pattern 7. Emitter control pattern 7 is connected to the emitters of semiconductor switching elements 2a, 2b, 2c, 2d via emitter control wires 71a, 71b, 71c, 71d.

Semiconductor module 103 in embodiment 3 is different from semiconductor module 101 in embodiment 1 in configuration of positive electrode 10 and negative electrode 12. A part (part 10H) of positive electrode 10 that is parallel to insulating plates 5a, 5b coincides in position with a part (part 12H) of negative electrode 12 that is parallel to insulating plates 5a, 5b, as seen in the vertical direction. The layer where part 12H is disposed is located above the layer where part 10H is disposed. Therefore, part 10H is located closer to insulating plates 5a, 5b than part 12H is. In embodiment 3, part 10H is defined as a proximal electrode part.

The other configuration in FIG. 13 is similar to that in FIG. 1, and thus the identical or corresponding parts are identically denoted, and the explanation of such parts is not repeated.

Figure 15:
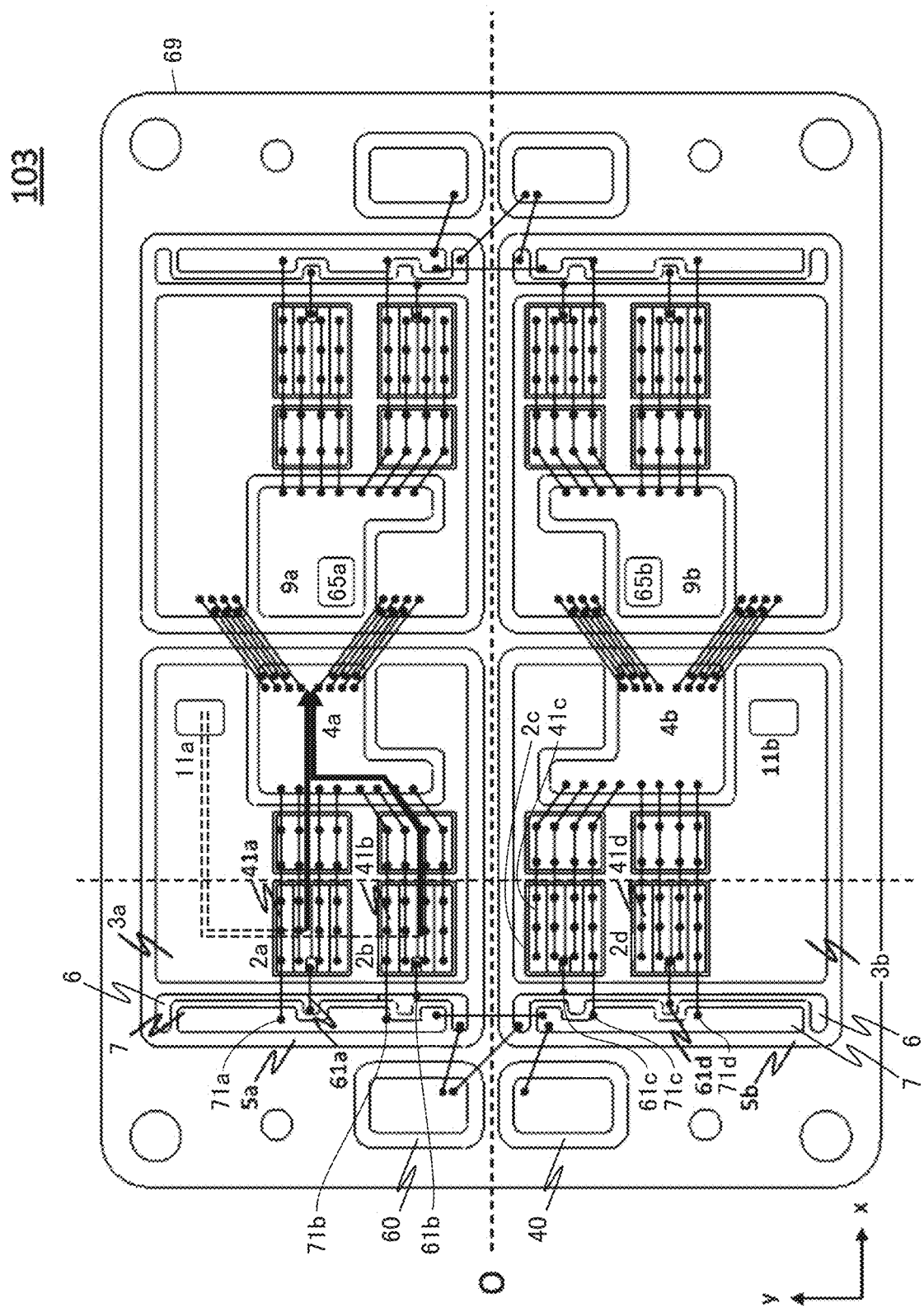
FIG. 15 is a diagram showing a place where a difference in emitter inductance arises between semiconductor switching elements in the semiconductor module in embodiment 3.

The operation of semiconductor module 103 shown in embodiment 3 at the time of turn-on is described with reference to FIG. 15. Semiconductor switching elements 2a, 2b are focused on and described, as in embodiment 1.

In embodiment 3, the emitter inductance of semiconductor switching element 2a is lower than the emitter inductance of semiconductor switching element 2b, as in embodiment 1. That is, La<Lb is satisfied, where La denotes the emitter inductance of semiconductor switching element 2a, and Lb denotes the emitter inductance of semiconductor switching element 2b. At this time, as in embodiment 1, when the semiconductor module is turned on and the main circuit current varies with time, gate-emitter voltage Vea of semiconductor switching element 2a is lower than gate-emitter voltage Veb of semiconductor switching element 2b, thus satisfying Vea<Veb.

Figure 16:
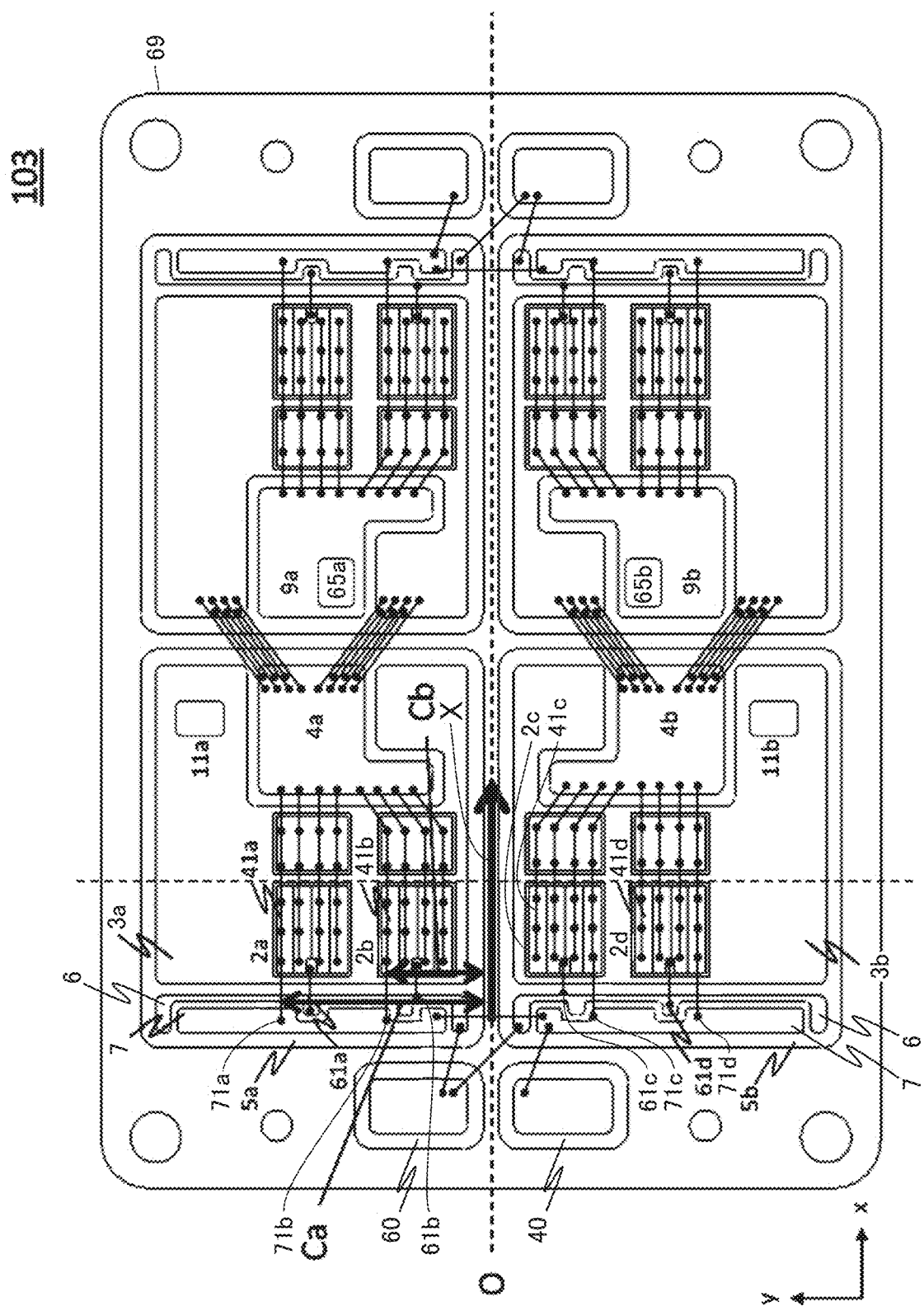
FIG. 16 is a diagram showing a current path of principal current in a proximal electrode part included in a positive electrode in embodiment 3.

In view of the above, in embodiment 3, emitter control wires 71a, 71b for semiconductor switching elements 2a, 2b are arranged parallel to current path X of principal current in proximal electrode part 10H of positive electrode 10, as shown in FIG. 16. The direction of principal current through current path X in proximal electrode part 10H (the positive direction in the x-axis) is opposite to the direction of current flowing through emitter control wire 71a and emitter control wire 71b (the negative direction in the x-axis).

Further, emitter control wires 71a, 71b are arranged so that Ca>Cb is satisfied, where Ca denotes the distance from current path X of principal current in proximal electrode part 10H of positive electrode 10 to emitter control wire 71a for semiconductor switching element 2a, and Cb denotes the distance from current path X of principal current in proximal electrode part 10H of positive electrode 10 to emitter control wire 71b for semiconductor switching element 2b.

Figure 17:
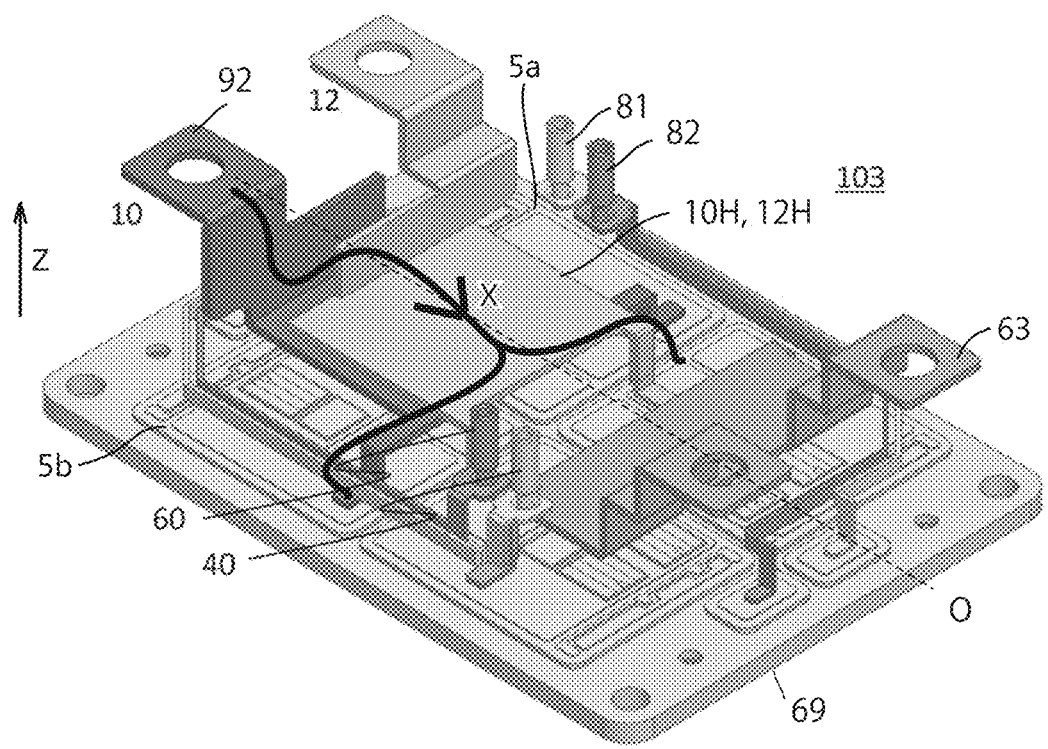
FIG. 17 is a diagram showing a current path of principal current in the positive electrode in embodiment 3.
Figure 18:
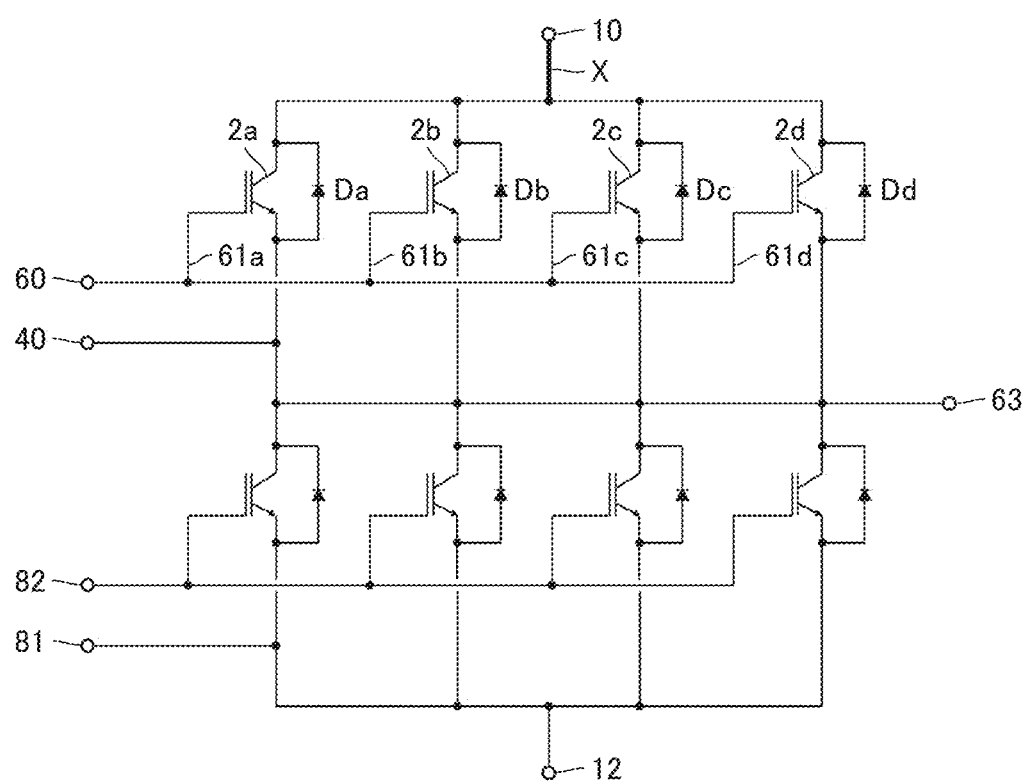
FIG. 18 is a diagram showing a current path of principal current in the positive electrode in embodiment 3.

FIG. 17 and FIG. 18 are diagrams showing a current path of principal current in positive electrode 10 in embodiment 3.

In FIG. 17 and FIG. 18, as indicated by the thick line, the current path of principal current in positive electrode 10 is the path from a terminal 92 of positive electrode 10 to positive electrode joints 11a, 11b. Proximal electrode part 10H included in positive electrode 10 is symmetric with respect to symmetry line O. Therefore, the current density is highest at symmetry line O as the center line of proximal electrode part 10H. The place where the current density is highest in proximal electrode part 10H of positive electrode 10 is defined as current path X of principal current in proximal electrode part 10H.

With emitter control wires 71a, 71b for semiconductor switching elements 2a, 2b being arranged in such a manner, when emitter control wires 71a, 71b are linked with magnetic fluxes due to a variation with time of principal current flowing through current path X in proximal electrode part 10H of positive electrode 10, then an induced electromotive force Esa is generated at emitter control wire 71a for semiconductor switching element 2a, and an induced electromotive force Esb is generated at emitter control wire 71b for semiconductor switching element 2b. At this time, induced electromotive forces Esa, Esb are generated so that the potential is higher at emitter control pattern 7 than at the emitters of semiconductor switching elements 2a, 2b. At this time, the generation of induced electromotive force increases with decreasing distance from the principal current flowing through current path X in proximal electrode part 10H to emitter control wires 71a, 71b for semiconductor switching elements 2a, 2b. Therefore, Esa<Esb is satisfied for induced electromotive forces Esa, Esb generated on emitter control wires 71a, 71b connected to semiconductor switching elements 2a, 2b.

Since emitter pattern 7 connecting emitter control wires 71a, 71b for semiconductor switching elements 2a, 2b is orthogonal to current path X in proximal electrode part 10H, an induced electromotive force is not generated on emitter pattern 7. Accordingly, emitter pattern 7 has almost the same potential.

Figure 19:
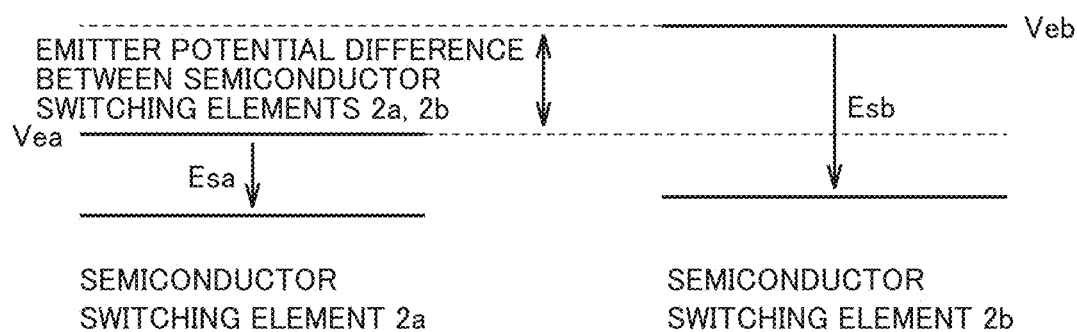
FIG. 19 is a diagram showing potentials of two semiconductor switching elements according to embodiment 3.

Thus, as shown in FIG. 19, the difference (Esb−Esa) arises between the induced electromotive forces generated at emitter control wires 71a and 71b for semiconductor switching elements 2a and 2b, so as to reduce the difference (Veb−Vea) in gate-emitter voltage caused by the emitter inductance difference between the semiconductor switching elements. This results in reduction of the difference (Veb−Vea) in gate-emitter voltage between semiconductor switching elements 2a and 2b, thus equalizing the currents flowing through semiconductor switching elements 2a and 2b.

As described above, the present embodiment can equalize the currents flowing through the semiconductor switching elements in a semiconductor module having emitter control wires. Thus, a long-life, reliable semiconductor module can be provided.

Embodiment 4

Figure 20:
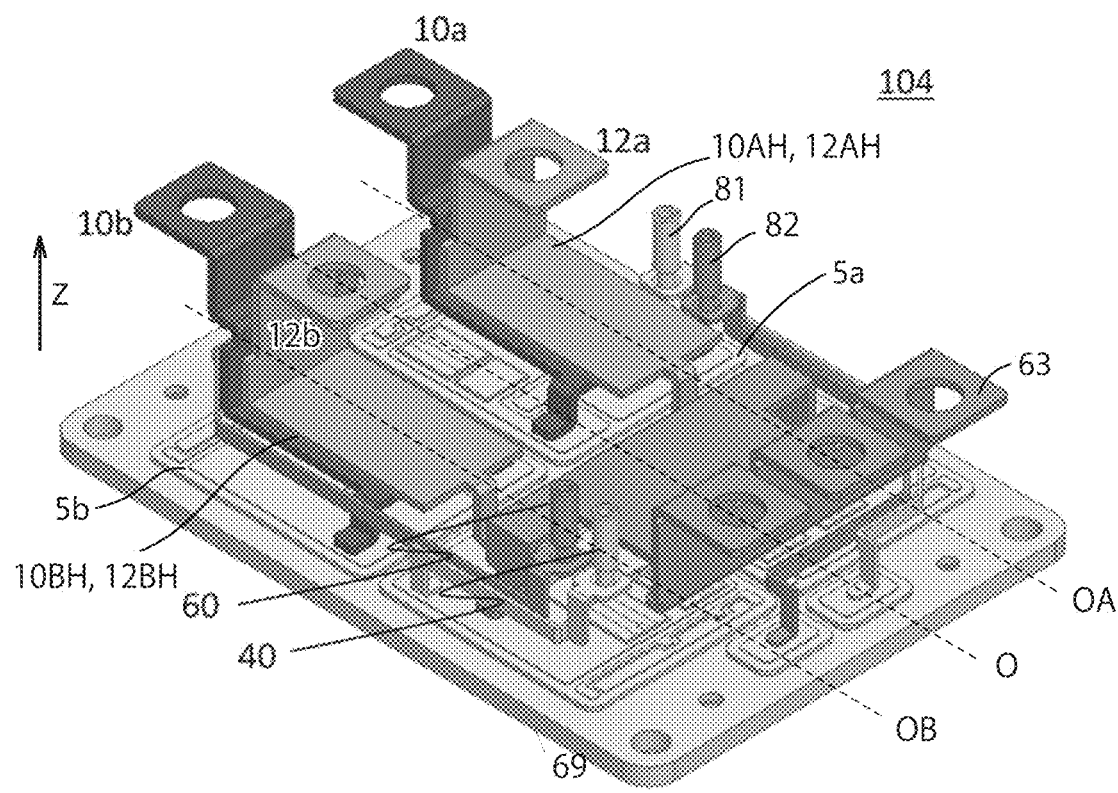
FIG. 20 is a perspective view showing an internal interconnection structure of a semiconductor module according to embodiment 4.
Figure 21:
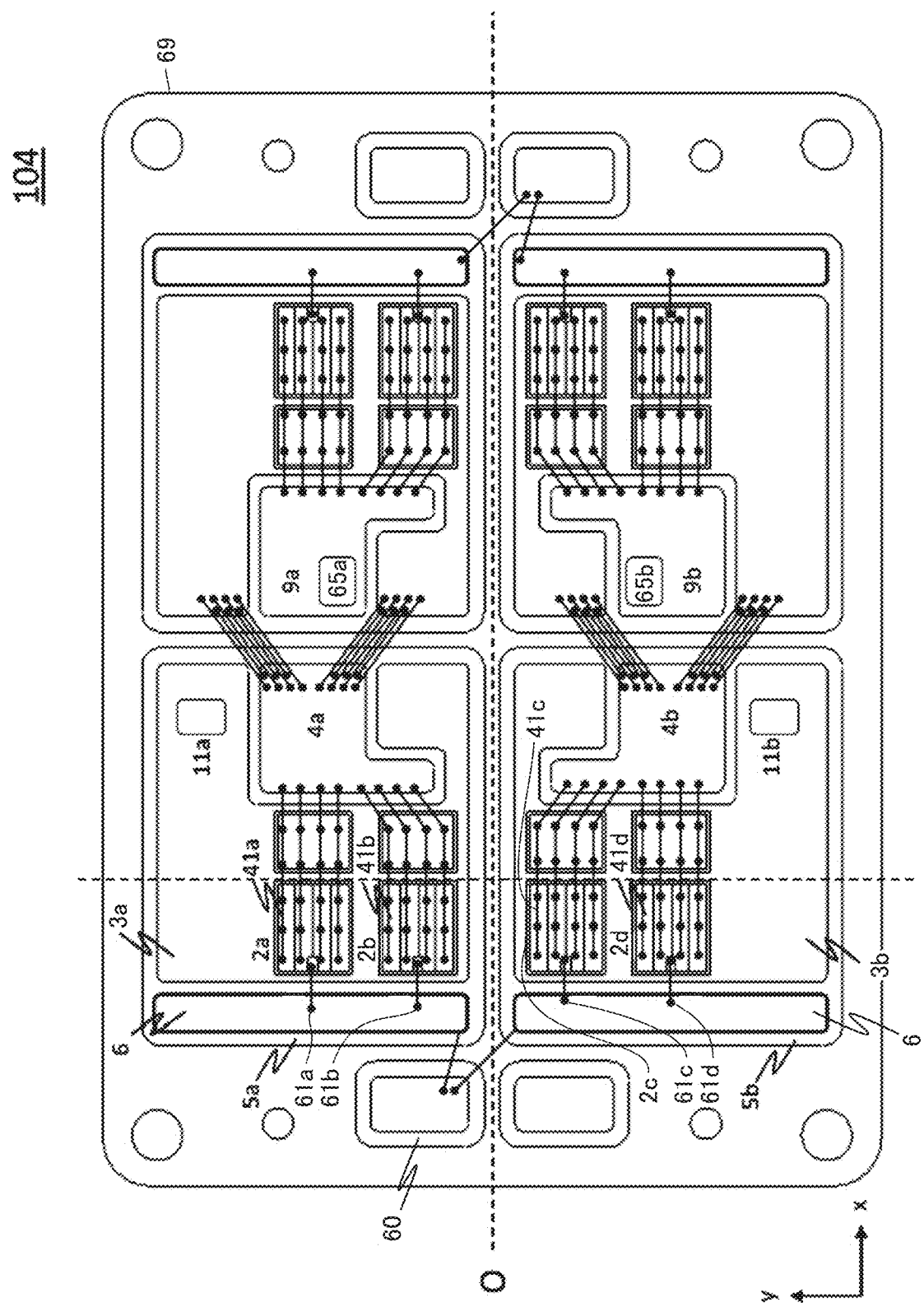
FIG. 21 is a top view of the semiconductor module in embodiment 4, but without an electrode portion.
Figure 22:
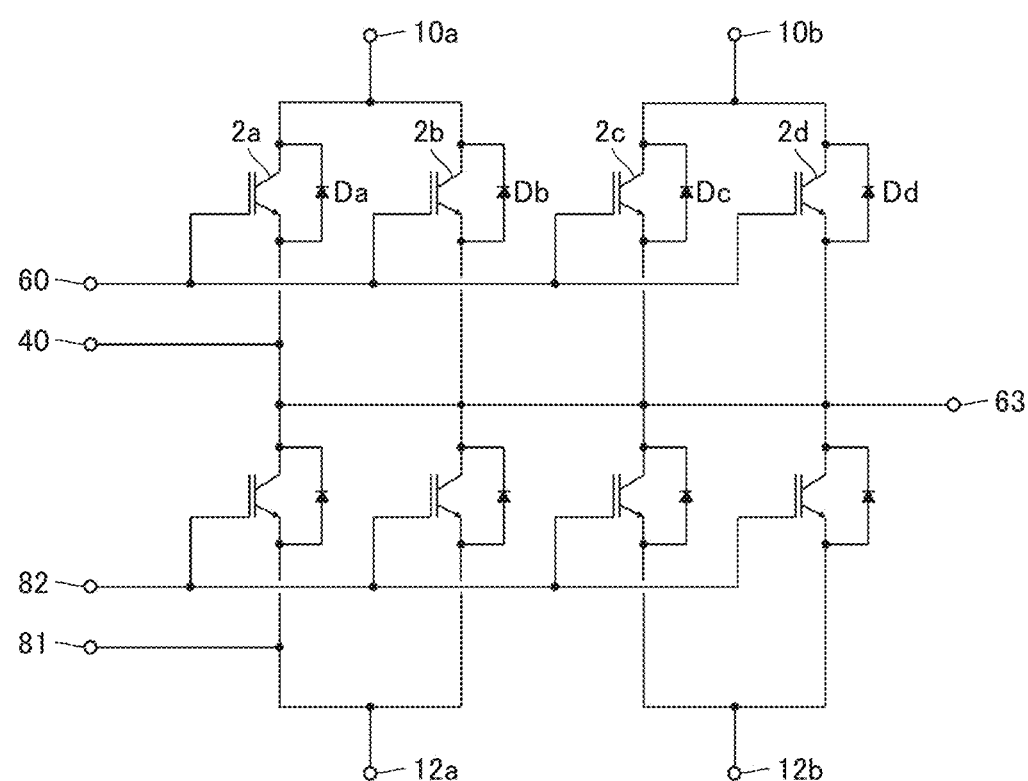
FIG. 22 is a circuit diagram of the main configuration of the semiconductor module in embodiment 4.

FIG. 20 is a perspective view showing an internal interconnection structure of a semiconductor module 104 according to embodiment 4. FIG. 21 is a top view of semiconductor module 104 in embodiment 4, but without an electrode portion. FIG. 22 is a circuit diagram of the main configuration of semiconductor module 104 in embodiment 4.

With reference to FIG. 22, semiconductor module 104 in embodiment 4 is different from semiconductor module 101 in embodiment 1 in that semiconductor module 104 includes positive electrodes 10a, 10b and negative electrodes 12a, 12b.

Semiconductor switching element 2a and semiconductor switching element 2b connected in parallel are disposed between positive electrode 10a and negative electrode 12a. Semiconductor switching element 2c and semiconductor switching element 2d connected in parallel are disposed between positive electrode 10b and negative electrode 12b.

Positive electrode 10a is connected to collector pattern 3a. Positive electrode 10b is connected to collector pattern 3b. Negative electrode 12a is connected to an emitter pattern 9a for the semiconductor switching elements of the opposite arm. Negative electrode 12b is connected to an emitter pattern 9b for the semiconductor switching elements of the opposite arm. Providing two positive electrodes 10a, 10b and two negative electrodes 12a, 12b can increase the current capacity.

As shown in FIG. 20, a part (part 10AH) of positive electrode 10a that is parallel to insulating plate 5a coincides in position with a part (part 12AH) of negative electrode 12a that is parallel to insulating plate 5a, as seen in the vertical direction. The layer where part 10AH is disposed is located below the layer where part 12AH is disposed. Therefore, part 10AH is located closer to insulating plate 5a than part 12AH is. Similarly, a part (part 10BH) of positive electrode 10b that is parallel to insulating plate 5b coincides in position with a part (part 12BH) of negative electrode 12b that is parallel to insulating plate 5b, as seen in the vertical direction. The layer where part 10BH is disposed is located below the layer where part 12BH is disposed. Therefore, part 10BH is located closer to insulating plate 5b than part 12BH is. In embodiment 4, part 10AH and part 10BH are defined as proximal electrode parts.

The other configuration in FIG. 20 is similar to that in FIG. 1, and thus the identical or corresponding parts are identically denoted, and the explanation of such parts is not repeated.

Figure 23:
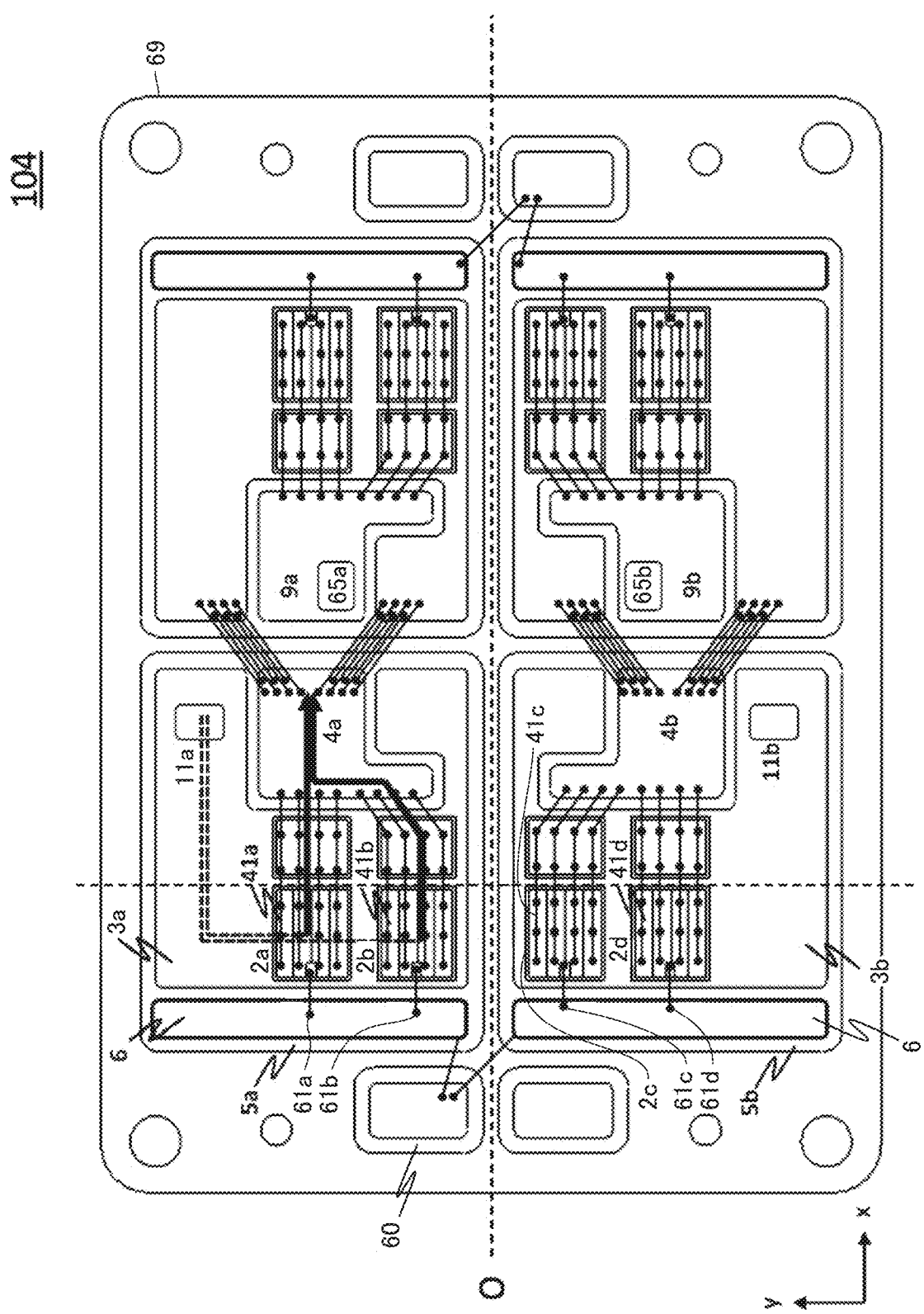
FIG. 23 is a diagram showing a place where a difference in emitter inductance arises between semiconductor switching elements in the semiconductor module in embodiment 4.

The operation of semiconductor module 104 shown in embodiment 4 at the time of turn-on is described with reference to FIG. 23. Semiconductor switching elements 2a, 2b are focused on and described, as in embodiment 1.

In embodiment 4, the emitter inductance of semiconductor switching element 2a is lower than the emitter inductance of semiconductor switching element 2b, as in embodiment 1. That is, La<Lb is satisfied, where La denotes the emitter inductance of semiconductor switching element 2a, and Lb denotes the emitter inductance of semiconductor switching element 2b. At this time, as in embodiment 1, when the semiconductor module is turned on and the main circuit current varies with time, gate-emitter voltage Vea of semiconductor switching element 2a is lower than gate-emitter voltage Veb of semiconductor switching element 2b, thus satisfying Vea<Veb.

Figure 24:
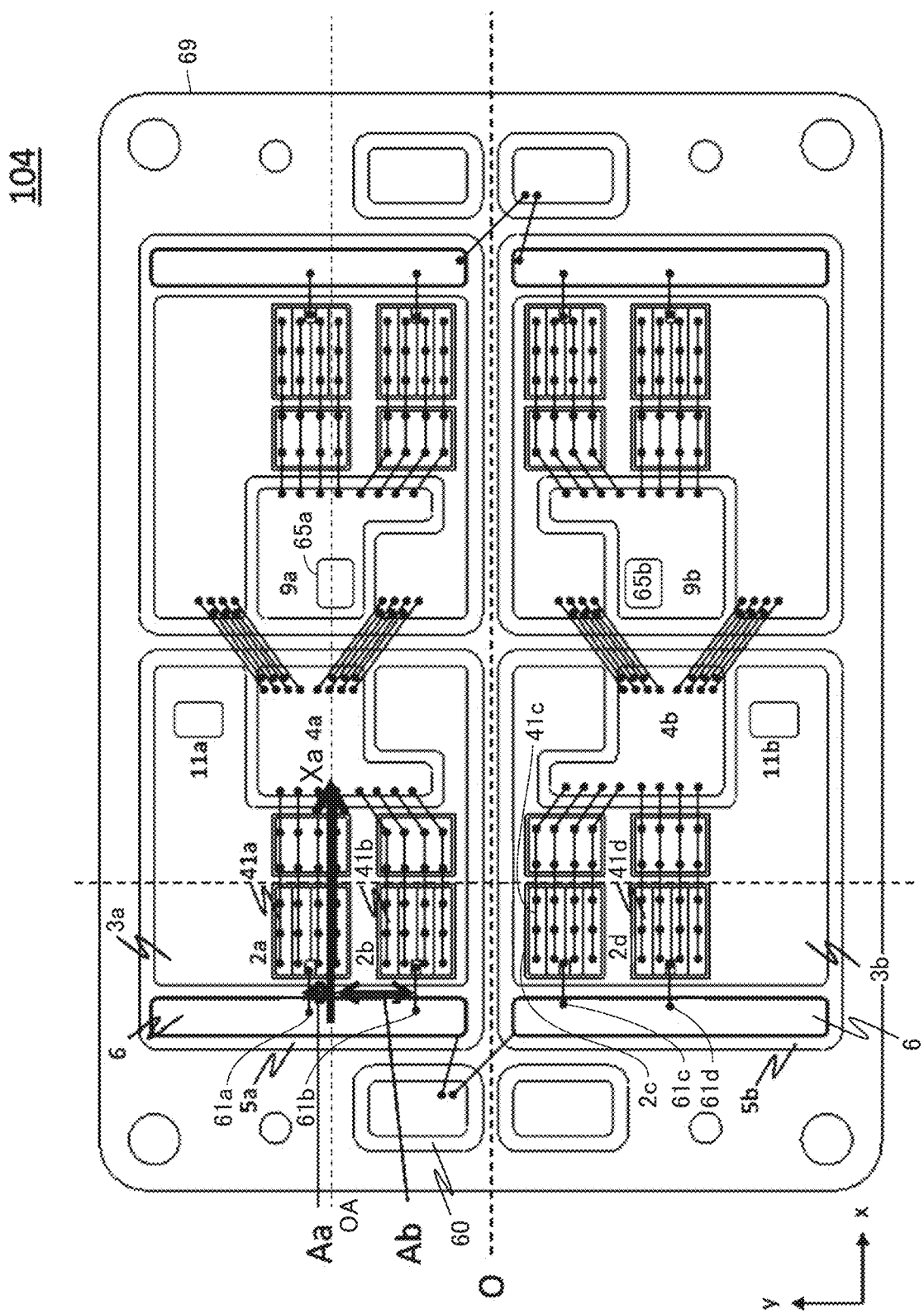
FIG. 24 is a diagram showing a current path of principal current in a proximal electrode part included in a positive electrode in embodiment 4.

In view of the above, in embodiment 4, gate control wires 61a, 61b for semiconductor switching elements 2a, 2b are arranged parallel to current path Xa of principal current in proximal electrode part 10AH of positive electrode 10a, as shown in FIG. 24. The direction of principal current through current path Xa in proximal electrode part 10AH (the positive direction in the x-axis) is the same as the direction of current flowing through gate control wire 61a and gate control wire 61b (the positive direction in the x-axis). Further, gate control wires 61a, 61b are arranged so that Aa<Ab is satisfied, where Aa denotes the distance from current path Xa of principal current in proximal electrode part 10AH of positive electrode 10a to gate control wire 61a for semiconductor switching element 2a, and Ab denotes the distance from current path Xa of principal current in proximal electrode part 10AH of positive electrode 10a to gate control wire 61b for semiconductor switching element 2b.

Figure 25:
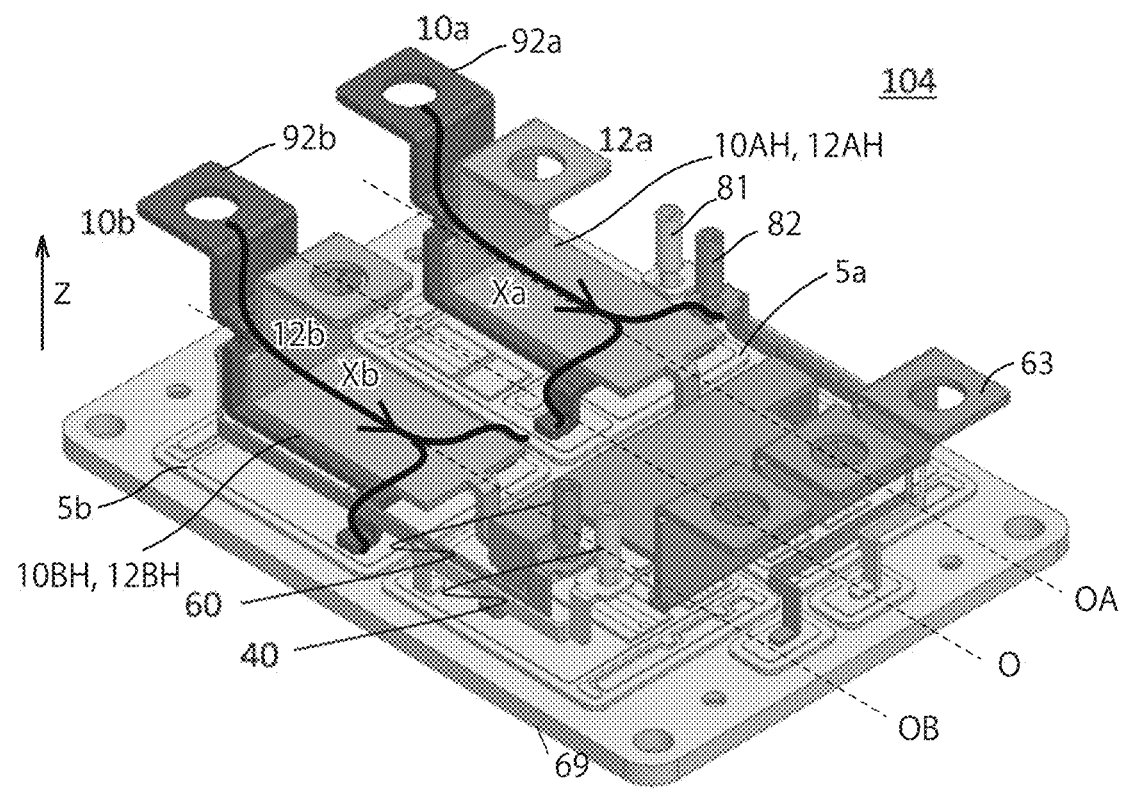
FIG. 25 is a diagram showing current paths of principal current in two positive electrodes in embodiment 4.
Figure 26:
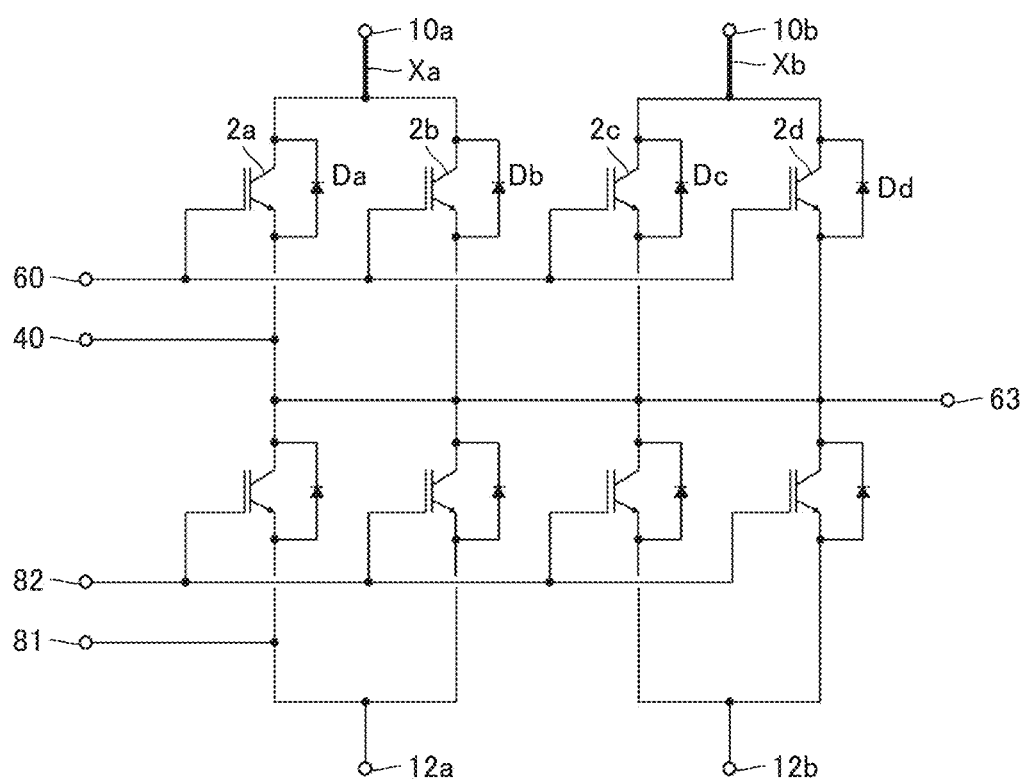
FIG. 26 is a diagram showing current paths of principal current in the two positive electrodes in embodiment 4.

FIG. 25 and FIG. 26 are diagrams showing a current path of principal current in positive electrodes 10a, 10b in embodiment 4.

In FIG. 25 and FIG. 26, as indicated by the thick lines, the current path of principal current in positive electrode 10a is the path from a terminal 92a of positive electrode 10a to positive electrode joint 11a. Proximal electrode part 10AH included in positive electrode 10a is symmetric with respect to symmetry line OA. Therefore, the current density is highest at symmetry line OA as the center line of proximal electrode part 10AH. The place where the current density is highest in proximal electrode part 10AH of positive electrode 10a is defined as current path Xa of principal current in proximal electrode part 10AH. The current path of principal current in positive electrode 10b is the path from a terminal 92b of positive electrode 10b to positive electrode joint 11b. Proximal electrode part 10BH included in positive electrode 10b is symmetric with respect to symmetry line OB. Therefore, the current density is highest at symmetry line OB as the center line of proximal electrode part 10BH. The place where the current density is highest in proximal electrode part 10BH of positive electrode 10b is defined as current path Xb of principal current in proximal electrode part 10BH.

With gate control wires 61a, 61b for semiconductor switching elements 2a, 2b being arranged in such a manner, when gate control wires 61a, 61b are linked with magnetic fluxes due to a variation with time of principal current flowing through current path Xa in proximal electrode part 10AH of positive electrode 10a, then induced electromotive force Ga is generated at gate control wire 61a for semiconductor switching element 2a, and induced electromotive force Gb is generated at gate control wire 61b for semiconductor switching element 2b. At this time, induced electromotive forces Ga, Gb are generated so that the potential is higher at gate pattern 6 than at the gates of semiconductor switching elements 2a, 2b. At this time, the generation of induced electromotive force increases with decreasing distance from the principal current flowing through current path Xa in proximal electrode part 10AH to the gate control wires for semiconductor switching elements 2a, 2b. Therefore, Ga>Gb is satisfied for induced electromotive forces Ga, Gb generated on gate control wires 61a, 61b for semiconductor switching elements 2a, 2b.

Since gate pattern 6 connecting gate control wires 61a, 61b for semiconductor switching elements 2a, 2b is orthogonal to current path Xa in proximal electrode part 10AH, an induced electromotive force is not generated on gate pattern 6. Accordingly, gate pattern 6 has the same potential. Therefore, gate potential Vga of semiconductor switching element 2a is lower than gate potential Vgb of semiconductor switching element 2b, thus satisfying Vga<Vgb.

Figure 27:
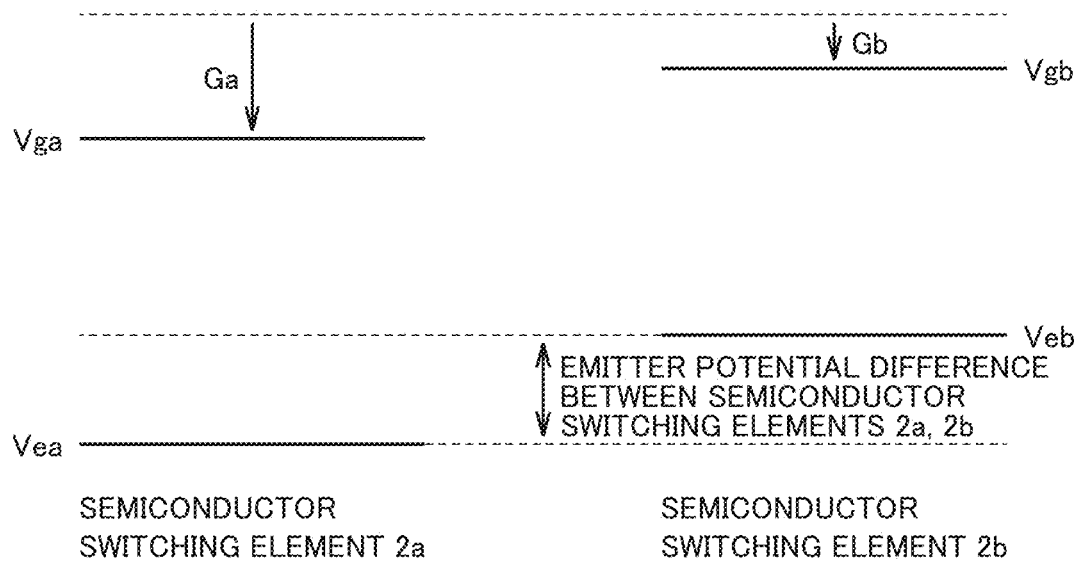
FIG. 27 is a diagram showing potentials of two semiconductor switching elements according to embodiment 4.

Thus, as shown in FIG. 27, the difference (Ga−Gb) arises between the induced electromotive forces generated at gate control wires 61a and 61b for semiconductor switching elements 2a and 2b, so as to reduce the difference (Veb−Vea) in gate-emitter voltage caused by the emitter inductance difference between semiconductor switching elements 2a and 2b. This results in reduction of the difference (Veb−Vea) in gate-emitter voltage between semiconductor switching elements 2a and 2b, thus equalizing the currents flowing through semiconductor switching elements 2a and 2b.

As described above, the present embodiment can equalize the currents flowing through the semiconductor switching elements, thus providing a long-life, reliable semiconductor module. Also, since an excessive current does not flow, the energy consumption can be reduced.

Embodiment 5

Figure 28:
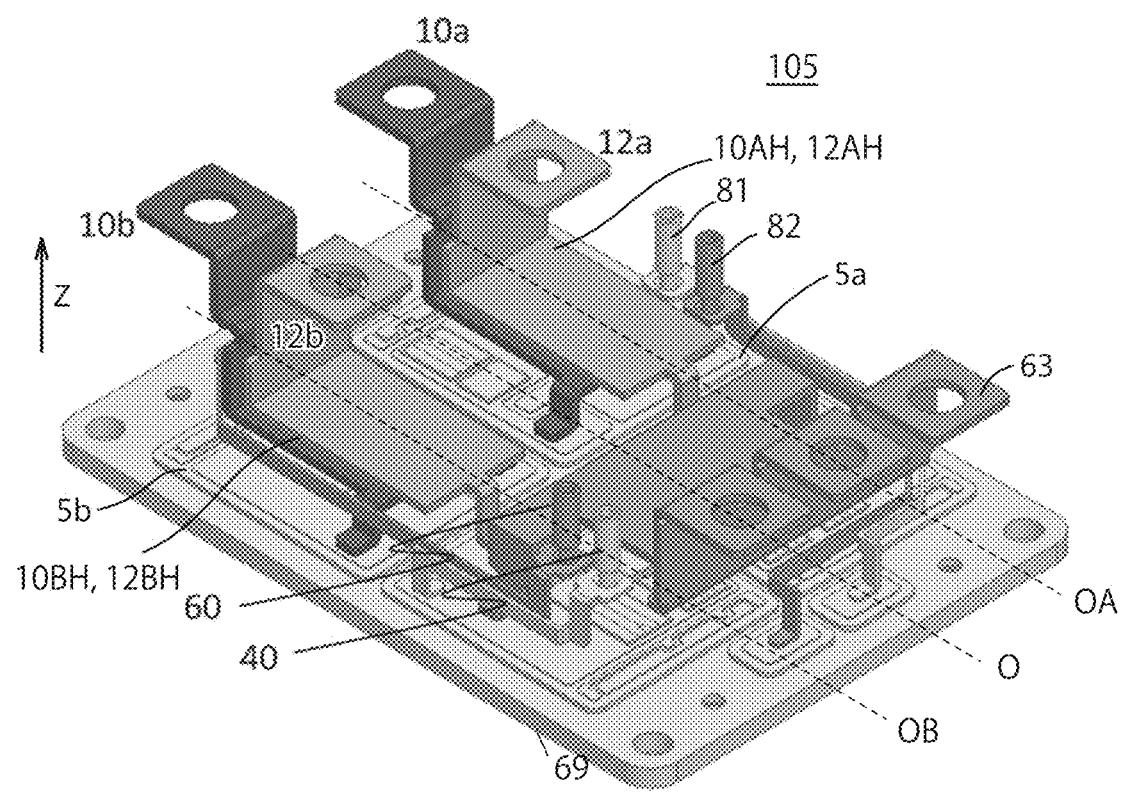
FIG. 28 is a perspective view showing an internal interconnection structure of a semiconductor module according to embodiment 5.
Figure 29:
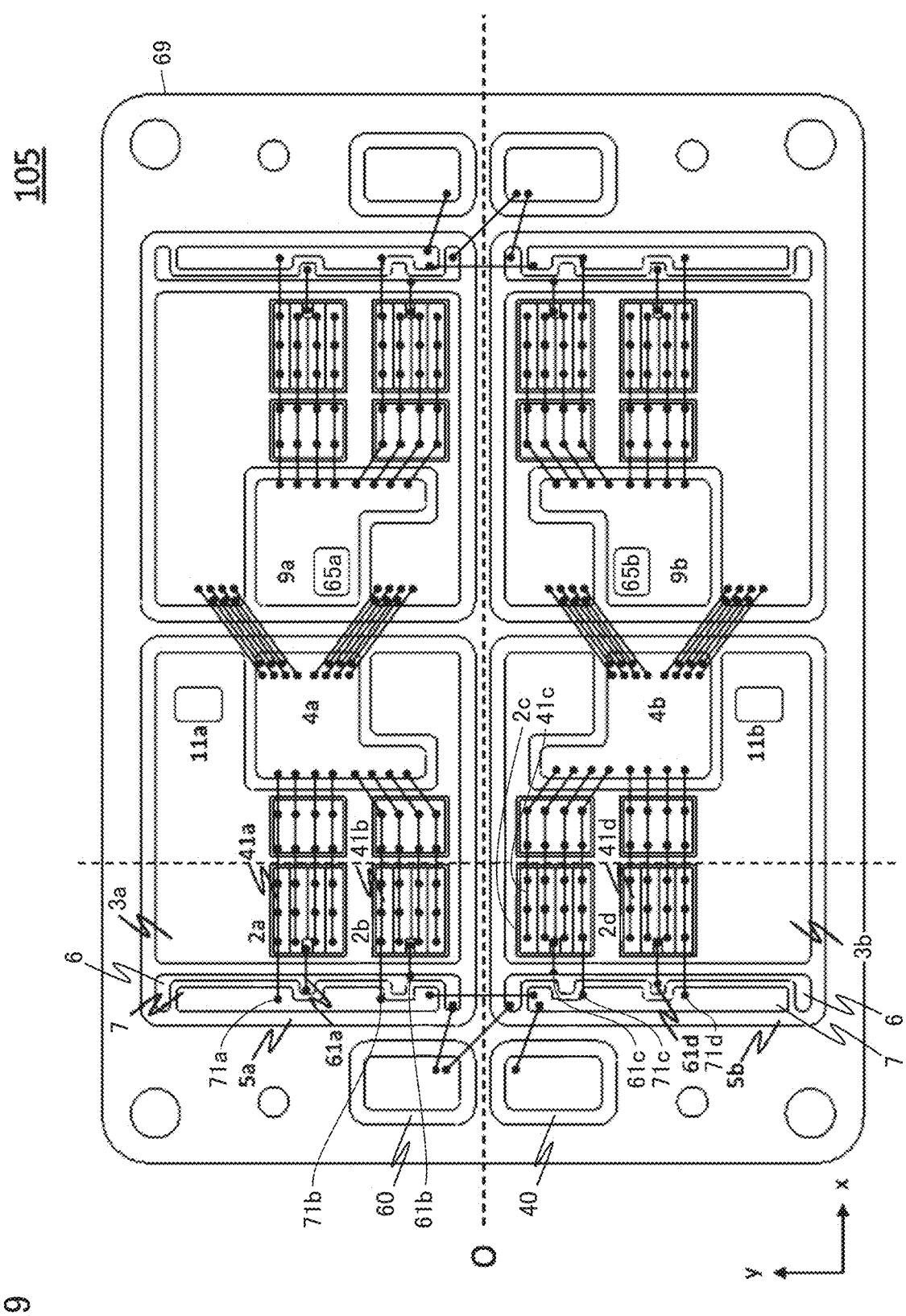
FIG. 29 is a top view of the semiconductor module in embodiment 5, but without an electrode portion.

FIG. 28 is a perspective view showing an internal interconnection structure of a semiconductor module 105 according to embodiment 5. FIG. 29 is a top view of semiconductor module 105 in embodiment 5, but without an electrode portion.

Semiconductor module 105 in embodiment 5 is different from semiconductor module 104 in embodiment 4 in that semiconductor module 105 further includes an emitter control pattern and emitter control wires. Emitter control electrode 40 for controlling semiconductor switching elements 2a, 2b, 2c, 2d is connected to emitter control pattern 7. Emitter control pattern 7 is connected to the emitters of semiconductor switching elements 2a, 2b, 2c, 2d via emitter control wires 71a, 71b, 71c, 71d. The other configuration in FIG. 28 and FIG. 29 is similar to that in FIG. 20 and FIG. 21, and thus the identical or corresponding parts are identically denoted, and the explanation of such parts is not repeated.

Figure 30:
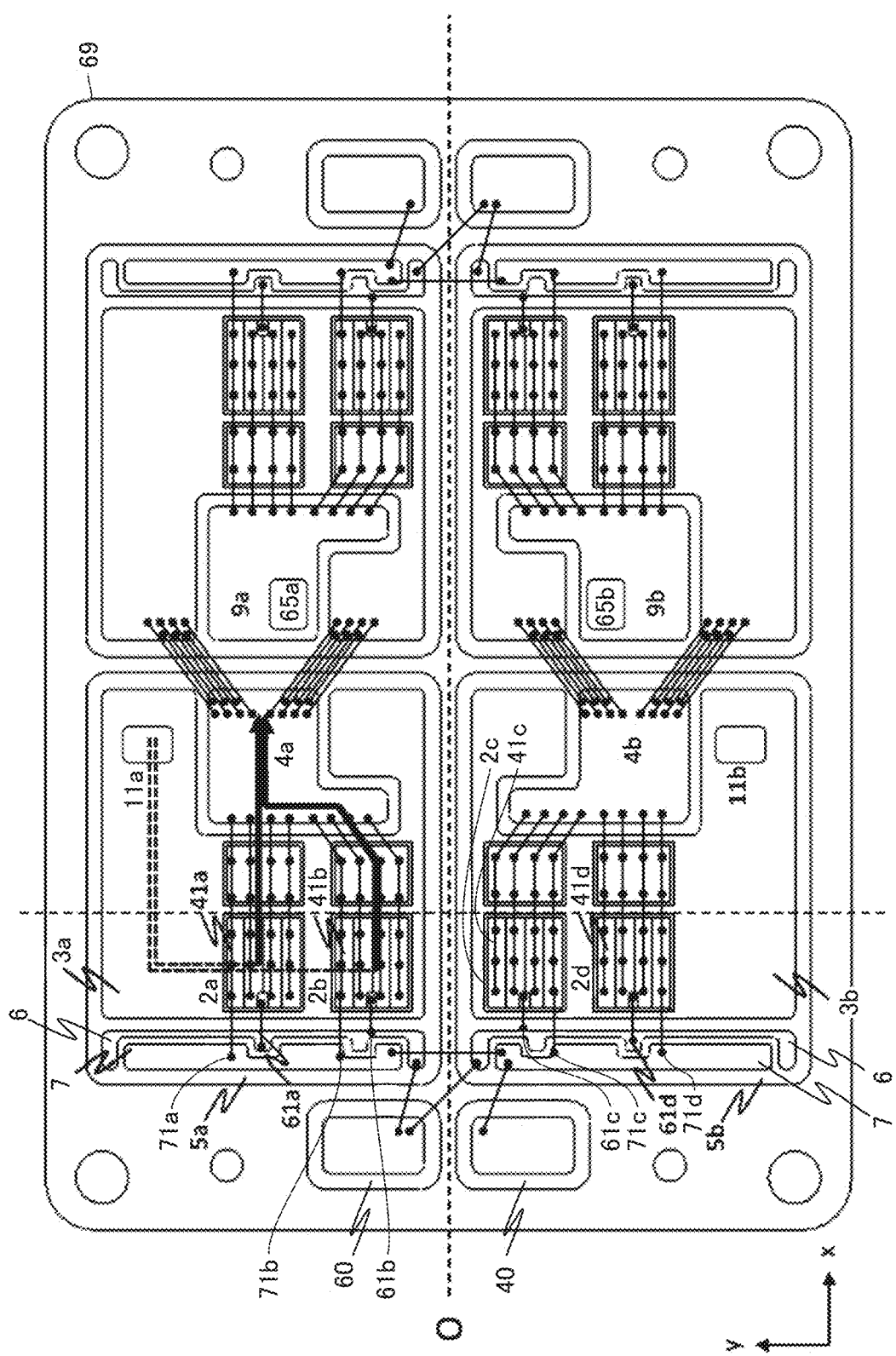
FIG. 30 is a diagram showing a place where a difference in emitter inductance arises between semiconductor switching elements in the semiconductor module in embodiment 5.

The operation of semiconductor module 105 shown in embodiment 5 at the time of turn-on is described with reference to FIG. 30. Semiconductor switching elements 2a, 2b are focused on and described, as in embodiment 1.

In embodiment 5, the emitter inductance of semiconductor switching element 2a is lower than the emitter inductance of semiconductor switching element 2b, as in embodiment 1. That is, La<Lb is satisfied, where La denotes the emitter inductance of semiconductor switching element 2a, and Lb denotes the emitter inductance of semiconductor switching element 2b. At this time, as in embodiment 1, when the semiconductor module is turned on and the main circuit current varies with time, gate-emitter voltage Vea of semiconductor switching element 2a is lower than gate-emitter voltage Veb of semiconductor switching element 2b, thus satisfying Vea<Veb.

Figure 31:
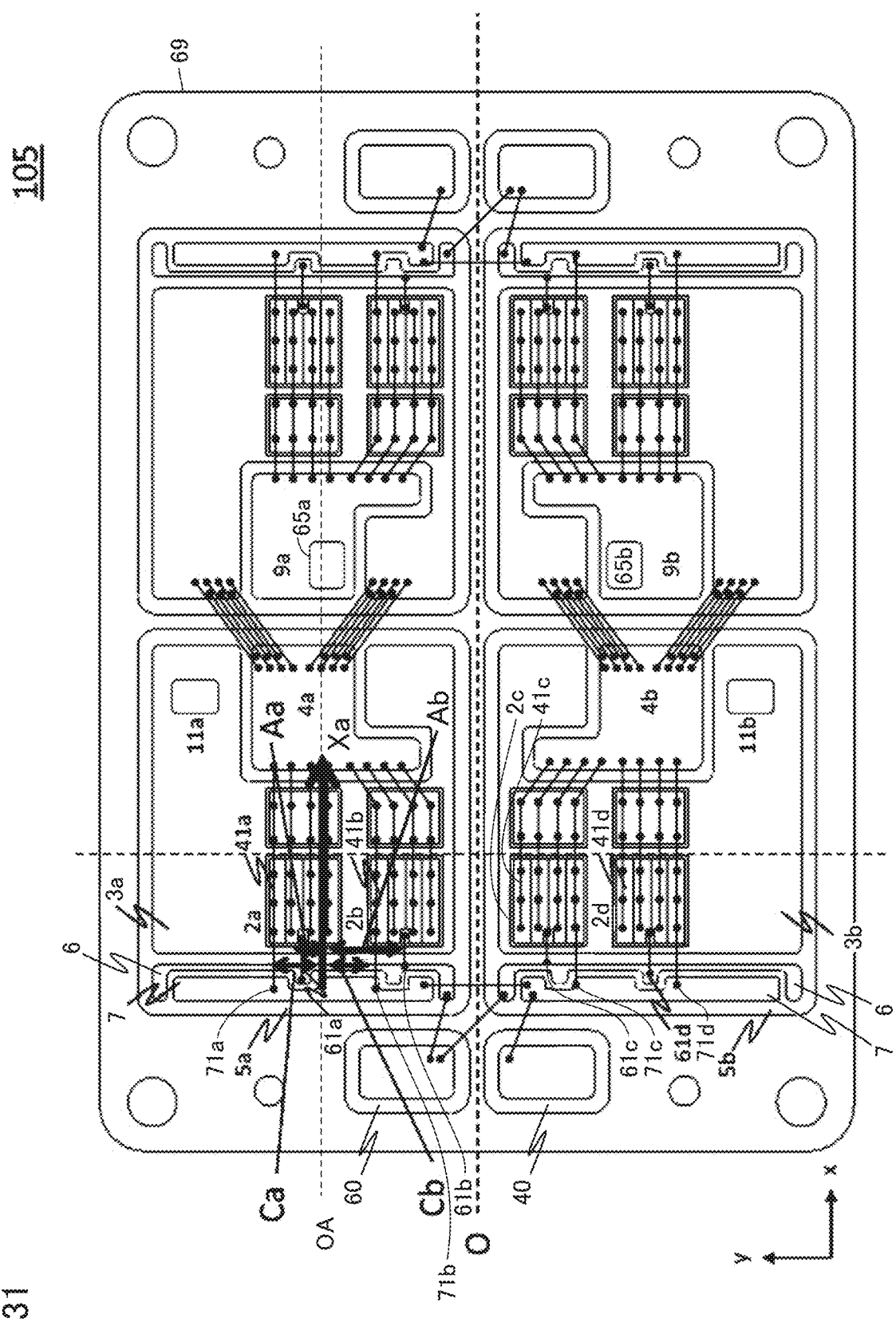
FIG. 31 is a diagram showing a current path of principal current in a proximal electrode part included in a positive electrode in embodiment 5.

In view of the above, in embodiment 5, gate control wires 61a, 61b and emitter control wires 71a, 71b for semiconductor switching elements 2a, 2b are arranged parallel to current path Xa of principal current in proximal electrode part 10AH of positive electrode 10a, as shown in FIG. 31. The direction of principal current through current path Xa in proximal electrode part 10AH (the positive direction in the x-axis) is the same as the direction of current flowing through gate control wires 61a, 61b (the positive direction in the x-axis). The direction of principal current through current path Xa in proximal electrode part 10AH (the positive direction in the x-axis) is opposite to the direction of current flowing through emitter control wires 71a, 71b (the negative direction in the x-axis).

Further, the distance from current path Xa of principal current in proximal electrode part 10AH of positive electrode 10a to gate control wire 61a for semiconductor switching element 2a is denoted by Aa, the distance from current path Xa of principal current in proximal electrode part 10AH of positive electrode 10a to emitter control wire 71a for semiconductor switching element 2a is denoted by Ca, the distance from current path Xa of principal current in proximal electrode part 10AH of positive electrode 10a to gate control wire 61b for semiconductor switching element 2b is denoted by Ab, and the distance from current path Xa of principal current in proximal electrode part 10AH of positive electrode 10a to emitter control wire 71b for semiconductor switching element 2b is denoted by Cb. The control wires are arranged so that Aa<Ab is satisfied.

With gate control wires 61a, 61b and emitter control wires 71a, 71b for semiconductor switching elements 2a, 2b being arranged in such a manner, when gate control wires 61a, 61b and emitter control wires 71a, 71b are linked with magnetic fluxes due to a variation with time of principal current flowing through current path Xa in proximal electrode part 10AH of positive electrode 10a, then induced electromotive force Ga is generated at gate control wire 61a for semiconductor switching element 2a, induced electromotive force Esa is generated at emitter control wire 71a for semiconductor switching element 2a, induced electromotive force Gb is generated at gate control wire 61b for semiconductor switching element 2b, and induced electromotive force Esb is generated at emitter control wire 71b for semiconductor switching element 2b. At this time, induced electromotive forces Ga, Gb are generated so that the potential is higher at gate pattern 6 than at the gates of semiconductor switching elements 2a, 2b. Further, induced electromotive forces Esa, Esb are generated so that the potential is higher at emitter control pattern 7 than at the emitters of semiconductor switching elements 2a, 2b. At this time, the generation of induced electromotive force increases with decreasing distance from the principal current flowing through current path Xa in proximal electrode part 10AH of positive electrode 10*a* to gate control wires 61*a*, 61*b* and emitter control wires 71*a*, 71*b* for semiconductor switching elements 2*a*, 2*b*. Therefore, Ga>Gb is satisfied for induced electromotive forces Ga, Gb generated on gate control wires 61*a*, 61*b* for semiconductor switching elements 2*a*, 2*b*.

Gate pattern 6 connecting gate control wires 61*a*, 61*b* for semiconductor switching elements 2*a*, 2*b* is orthogonal to current path Xa in proximal electrode part 10AH of positive electrode 10*a*. Emitter control pattern 7 connecting emitter control wires 71*a*, 71*b* is also orthogonal to current path Xa in proximal electrode part 10AH of positive electrode 10*a*. Therefore, an induced electromotive force is not generated on gate pattern 6 and emitter control pattern 7. Accordingly, the gate control wire connection portions on gate pattern 6 for semiconductor switching elements 2*a*, 2*b* have almost the same potential. Thus, gate potential Vga of semiconductor switching element 2*a* is higher than gate potential Vgb of semiconductor switching element 2*b*.

If electromotive forces Ga, Gb cause the gate-emitter voltages of semiconductor switching elements 2*a*, 2*b* to be equalized with each other, emitter control wires 71*a*, 71*b* for semiconductor switching elements 2*a*, 2*b* may be arranged so that Ca=Cb is satisfied.

If electromotive forces Ga, Gb cause (Veb−Vea)−(Vga−Vgb)>0, emitter control wires 71*a*, 71*b* for semiconductor switching elements 2*a*, 2*b* may be arranged so that Ca>Cb is satisfied.

If electromotive forces Ga, Gb cause (Veb−Vea)−(Vga−Vgb)<0, emitter control wires 71*a*, 71*b* for semiconductor switching elements 2*a*, 2*b* may be arranged so that Ca<Cb is satisfied.

As described above, the present embodiment can equalize the currents flowing through the semiconductor switching elements in a semiconductor module having an emitter control pattern and emitter control wires.

Embodiment 6

Figure 32:
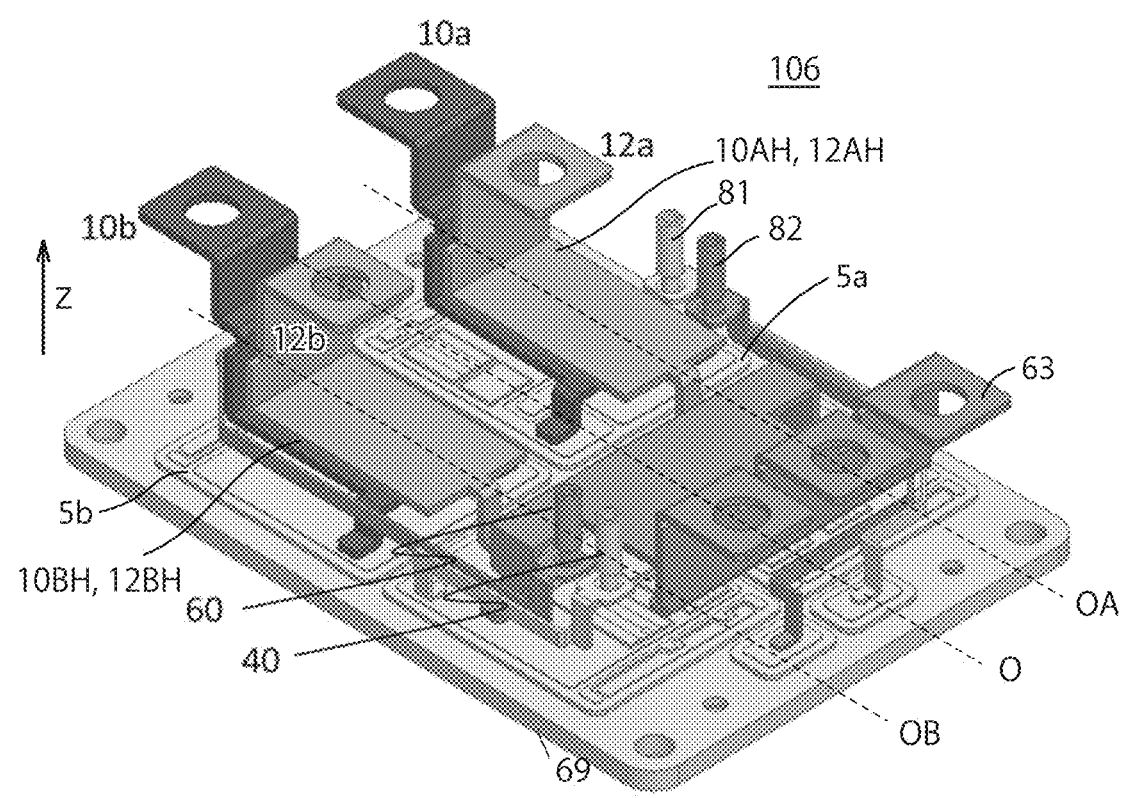
FIG. 32 is a perspective view showing an internal interconnection structure of a semiconductor module according to embodiment 6.
Figure 33:
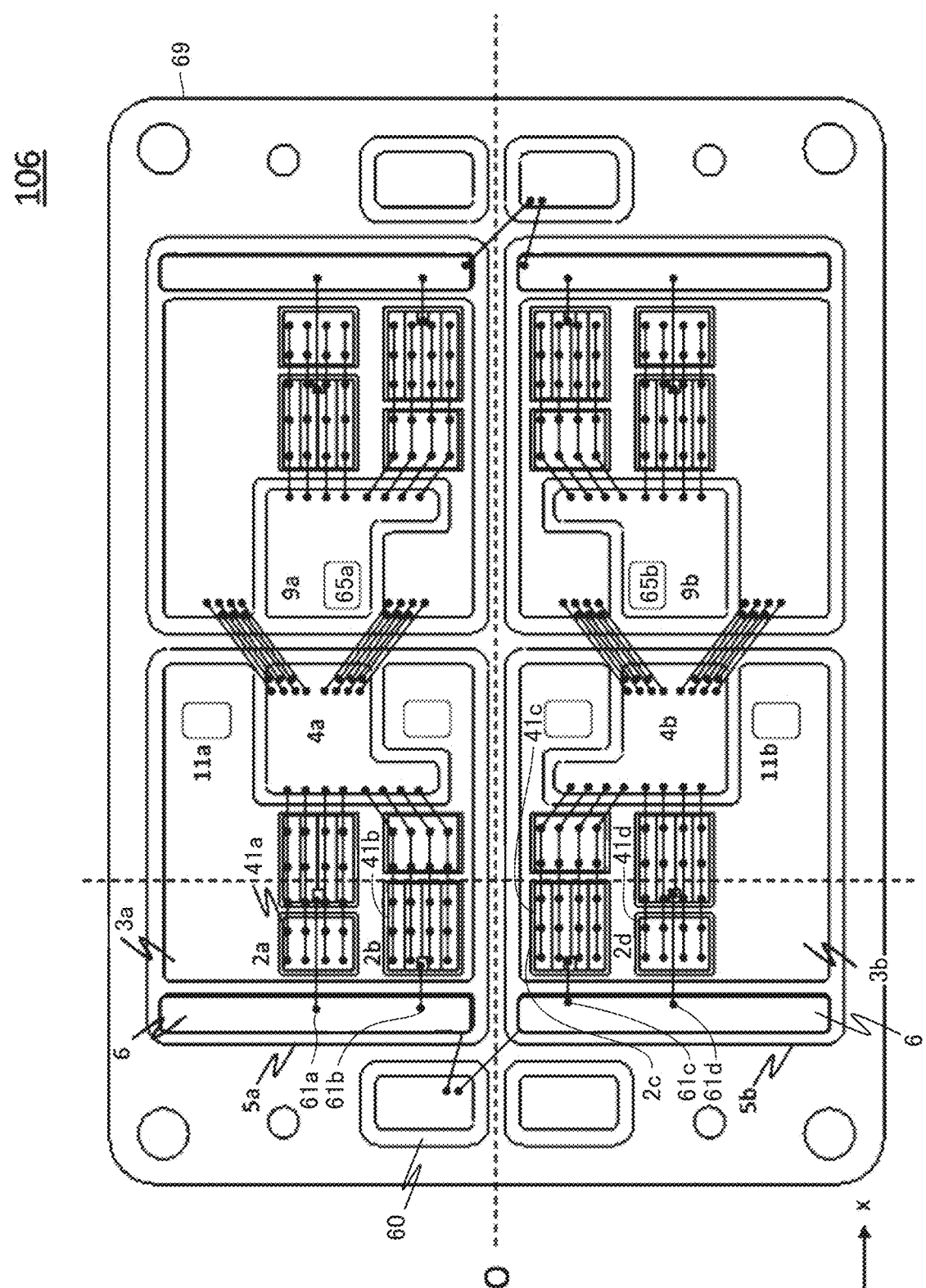
FIG. 33 is a top view of the semiconductor module in embodiment 6, but without an electrode portion.

FIG. 32 is a perspective view showing an internal interconnection structure of a semiconductor module 106 according to embodiment 6. FIG. 33 is a top view of semiconductor module 106 in embodiment 6, but without an electrode portion.

Semiconductor module 106 in embodiment 6 is different from semiconductor module 104 in embodiment 4 in the positions of semiconductor switching elements 2*a*, 2*d*. Specifically, the positions of semiconductor switching elements 2*a*, 2*d* in the x-axis direction are different from the positions of semiconductor switching elements 2*b*, 2*c* in the x-axis direction. The other configuration in FIG. 32 and FIG. 33 is similar to that in FIG. 20 and FIG. 21, and thus the identical or corresponding parts are identically denoted, and the explanation of such parts is not repeated.

Figure 34:
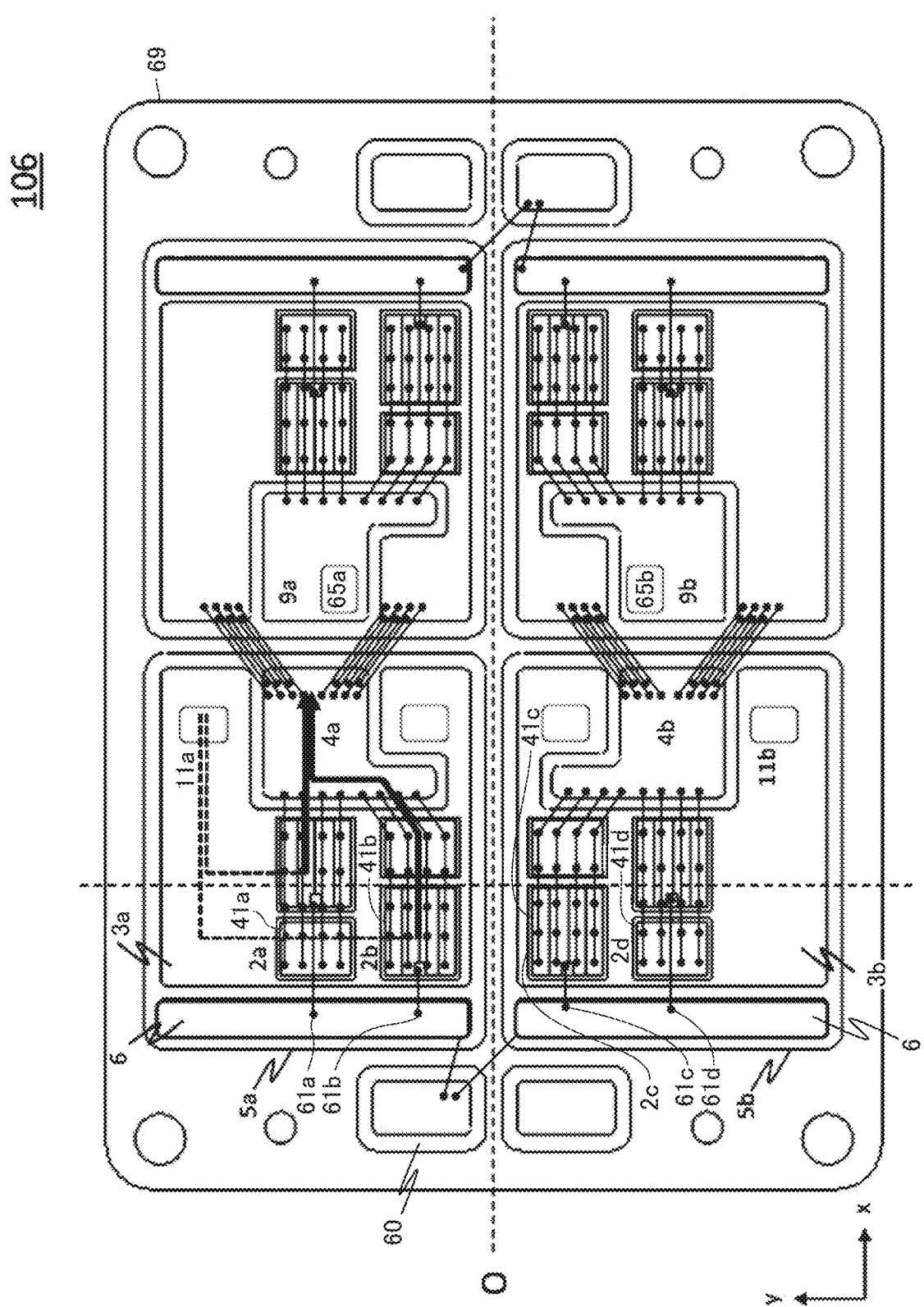
FIG. 34 is a diagram showing a place where a difference in emitter inductance arises between semiconductor switching elements in the semiconductor module in embodiment 6.

The operation of semiconductor module 106 shown in embodiment 6 at the time of turn-on is described with reference to FIG. 34. Semiconductor switching elements 2*a*, 2*b* are focused on and described, as in embodiment 1.

In embodiment 6, emitter wire 41*a* for semiconductor switching element 2*a* is shorter than emitter wire 41*b* for semiconductor switching element 2*b*. Accordingly, the emitter inductance of semiconductor switching element 2*a* is lower than the emitter inductance of semiconductor switching element 2*b*. That is, La<Lb is satisfied, where La denotes the emitter inductance of semiconductor switching element 2*a*, and Lb denotes the emitter inductance of semiconductor switching element 2*b*. At this time, when semiconductor module 106 is turned on and the principal current varies with time, emitter potential Vea of semiconductor switching element 2*a* is lower than emitter potential Veb of semiconductor switching element 2*b*, thus satisfying Vea<Veb.

Figure 35:
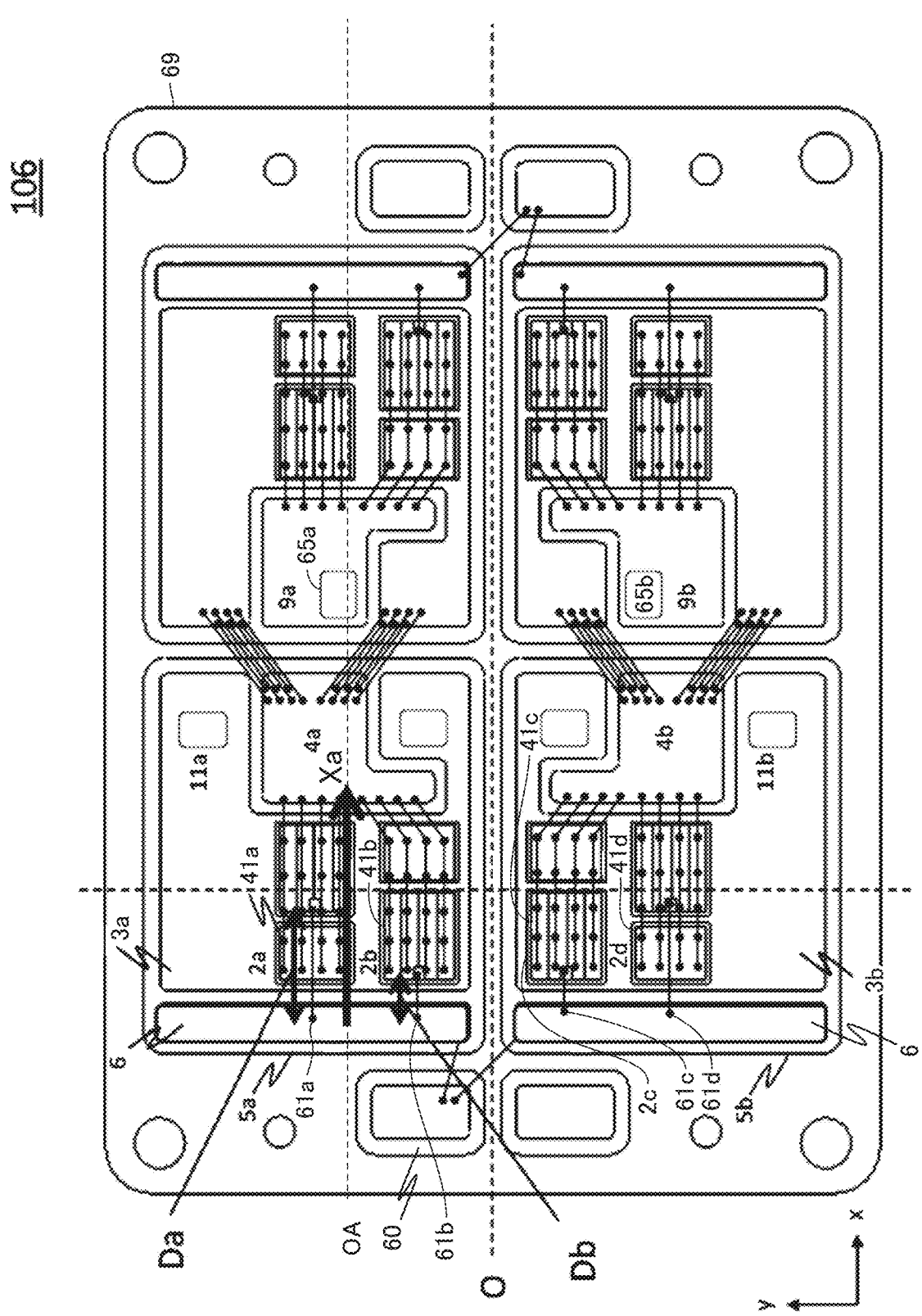
FIG. 35 is a diagram showing a current path of principal current in a proximal electrode part included in a positive electrode in embodiment 6.

In view of the above, in embodiment 6, gate control wires 61*a*, 61*b* for semiconductor switching elements 2*a*, 2*b* are arranged parallel to current path Xa of principal current in proximal electrode part 10AH of positive electrode 10*a*, as shown in FIG. 35. The direction of principal current through current path Xa in proximal electrode part 10AH (the positive direction in the x-axis) is the same as the direction of current flowing through gate control wires 61*a*, 61*b* (the positive direction in the x-axis).

The length of the part of gate control wire 61*a* that is parallel to current path Xa of principal current in proximal electrode part 10AH of positive electrode 10*a* (the length of gate control wire 61*a* if gate control wire 61*a* is parallel to current path Xa) is denoted by Da. The length of the part of gate control wire 61*b* that is parallel to current path Xa of principal current in proximal electrode part 10AH of positive electrode 10*a* (the length of gate control wire 61*b* if gate control wire 61*b* is parallel to current path Xa) is denoted by Db. Gate control wires 61*a*, 61*b* are connected to the gates of semiconductor switching elements 2*a*, 2*b* so that Da>Db is satisfied.

With gate control wires 61*a*, 61*b* for semiconductor switching elements 2*a*, 2*b* being arranged in such a manner, when gate control wires 61*a*, 61*b* are linked with magnetic fluxes due to a variation with time of principal current flowing through current path Xa in proximal electrode part 10AH of positive electrode 10*a*, then induced electromotive force Ga is generated at gate control wire 61*a* for semiconductor switching element 2*a*, and induced electromotive force Gb is generated at gate control wire 61*b* for semiconductor switching element 2*b*. At this time, induced electromotive forces Ga, Gb are generated so that the potential is higher at gate pattern 6 than at the gates of semiconductor switching elements 2*a*, 2*b*. At this time, the generation of induced electromotive force is greater when gate control wire 61*a* has a longer part parallel to current path Xa of principal current in proximal electrode part 10AH of positive electrode 10*a*. Therefore, Ga>Gb is satisfied for induced electromotive forces Ga, Gb generated on gate control wires 61*a*, 61*b* for semiconductor switching elements 2*a*, 2*b*.

Since gate pattern 6 connecting gate control wires 61*a*, 61*b* for semiconductor switching elements 2*a*, 2*b* is orthogonal to current path Xa of principal current in proximal electrode part 10AH of positive electrode 10*a*, an induced electromotive force is not generated on gate pattern 6. Accordingly, gate pattern 6 has the same potential. Therefore, gate potential Vga of semiconductor switching element 2*a* is lower than gate potential Vgb of semiconductor switching element 2*b*, thus satisfying Vga<Vgb.

Figure 36:
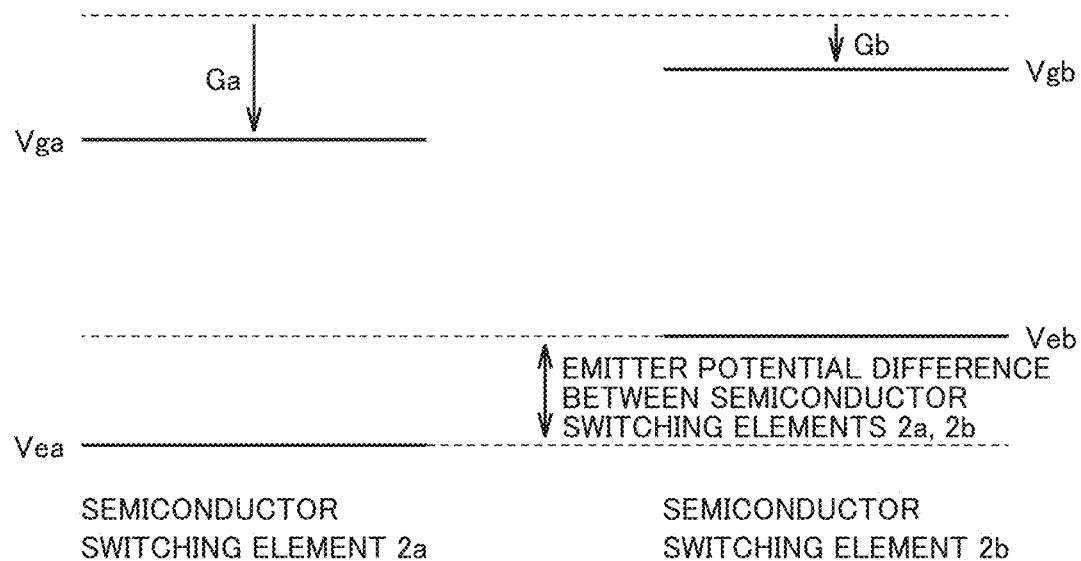
FIG. 36 is a diagram showing potentials of two semiconductor switching elements according to embodiment 6.

Thus, as shown in FIG. 36, the difference arises between induced electromotive forces Ga and Gb generated at gate control wires 61*a* and 61*b* for semiconductor switching elements 2*a* and 2*b*, so as to reduce the difference in emitter potential caused by the emitter inductance difference between semiconductor switching elements 2*a* and 2*b*. This results in reduction of the difference in gate-emitter voltage between semiconductor switching elements 2*a* and 2*b*, thus equalizing the currents flowing through semiconductor switching elements 2*a* and 2*b*.

As described above, the present embodiment can equalize the currents flowing through the semiconductor switching elements, thus providing a long-life, reliable semiconductor module. Further, the spaces left between the semiconductor switching elements can prevent the temperature rise that would be caused by thermal interference due to heat generation from the semiconductor switching elements. Thus, the reliability can be further enhanced.

Embodiment 7

Figure 37:
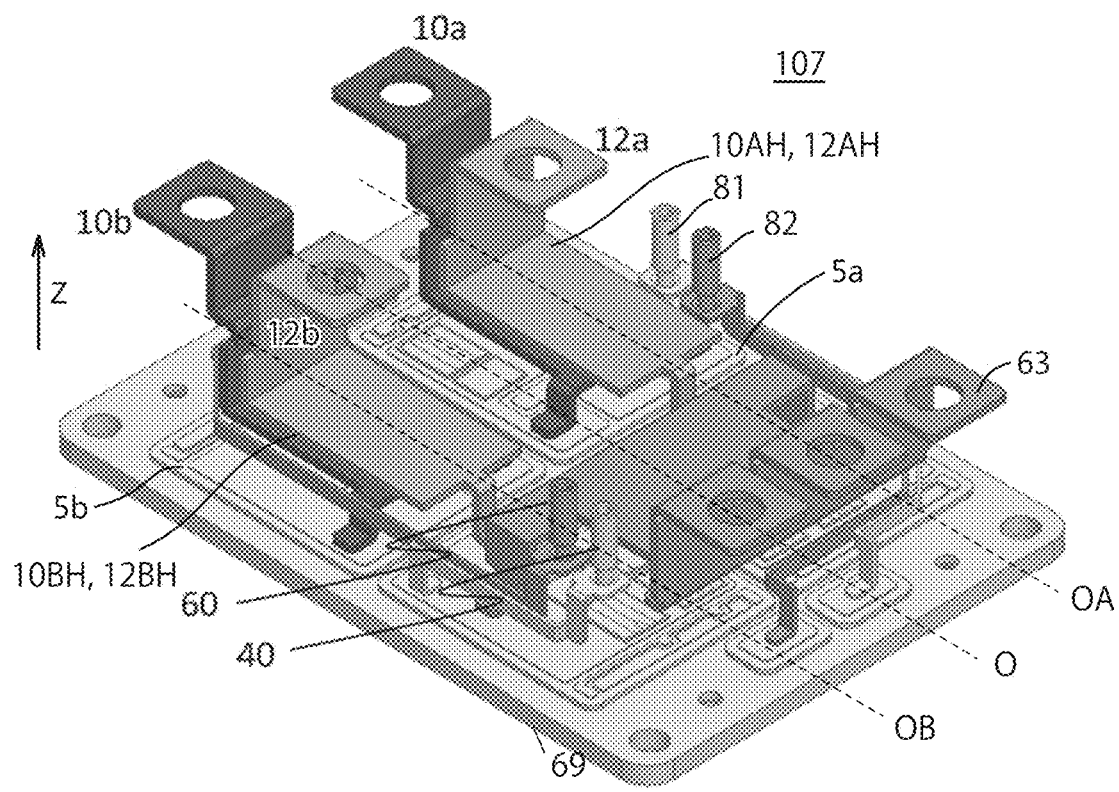
FIG. 37 is a perspective view showing an internal interconnection structure of a semiconductor module according to embodiment 7.
Figure 38:
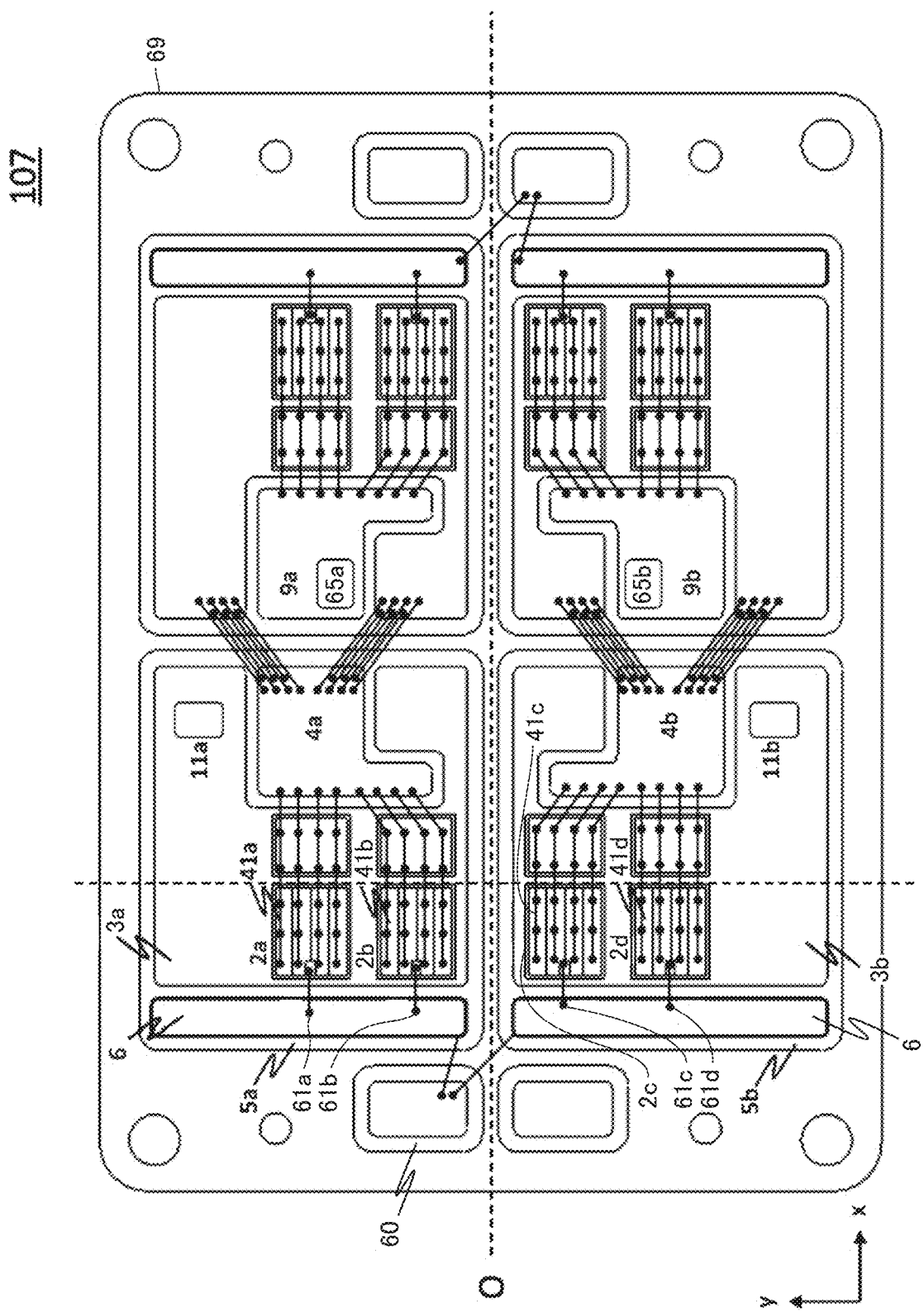
FIG. 38 is a top view of the semiconductor module in embodiment 7, but without an electrode portion.

FIG. 37 is a perspective view showing an internal interconnection structure of a semiconductor module 107 according to embodiment 7. FIG. 38 is a top view of semiconductor module 107 in embodiment 7, but without an electrode portion. The configuration in FIG. 37 and FIG. 38 is similar to that in FIG. 20 and FIG. 21, and thus the identical or corresponding parts are identically denoted, and the explanation of such parts is not repeated.

Figure 39:
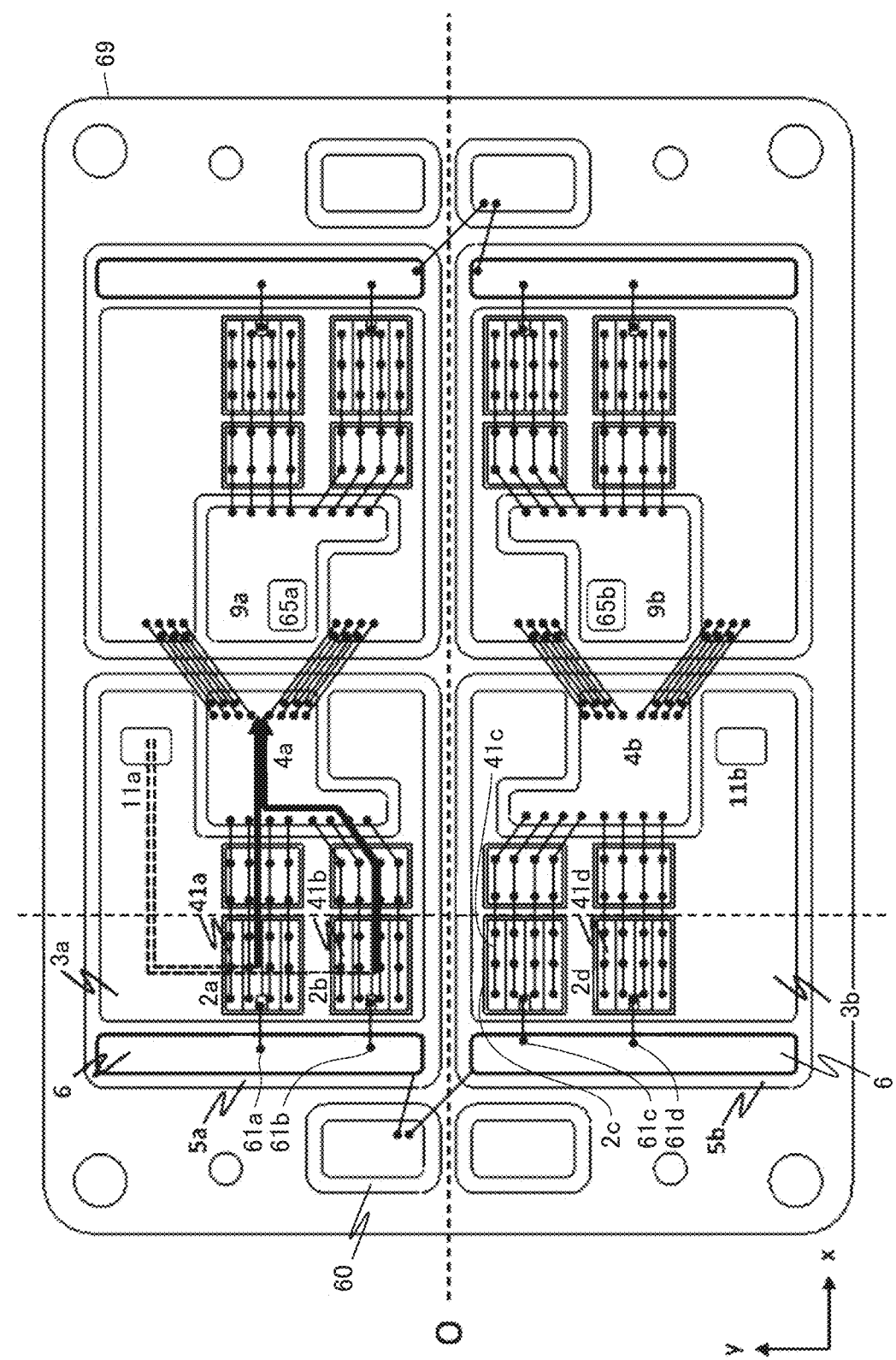
FIG. 39 is a diagram showing a place where a difference in emitter inductance arises between semiconductor switching elements in the semiconductor module in embodiment 7.

The operation of semiconductor module 107 shown in embodiment 7 at the time of turn-on is described with reference to FIG. 39. Semiconductor switching elements 2a, 2b are focused on and described, as in embodiment 1.

In embodiment 7, the emitter inductance of semiconductor switching element 2a is lower than the emitter inductance of semiconductor switching element 2b, as in embodiment 1. That is, La<Lb is satisfied, where La denotes the emitter inductance of semiconductor switching element 2a, and Lb denotes the emitter inductance of semiconductor switching element 2b. At this time, when semiconductor module 107 is turned on and the main circuit current varies with time, emitter potential Vea of semiconductor switching element 2a is lower than emitter potential Veb of semiconductor switching element 2b, thus satisfying Vea<Veb.

Figure 40:
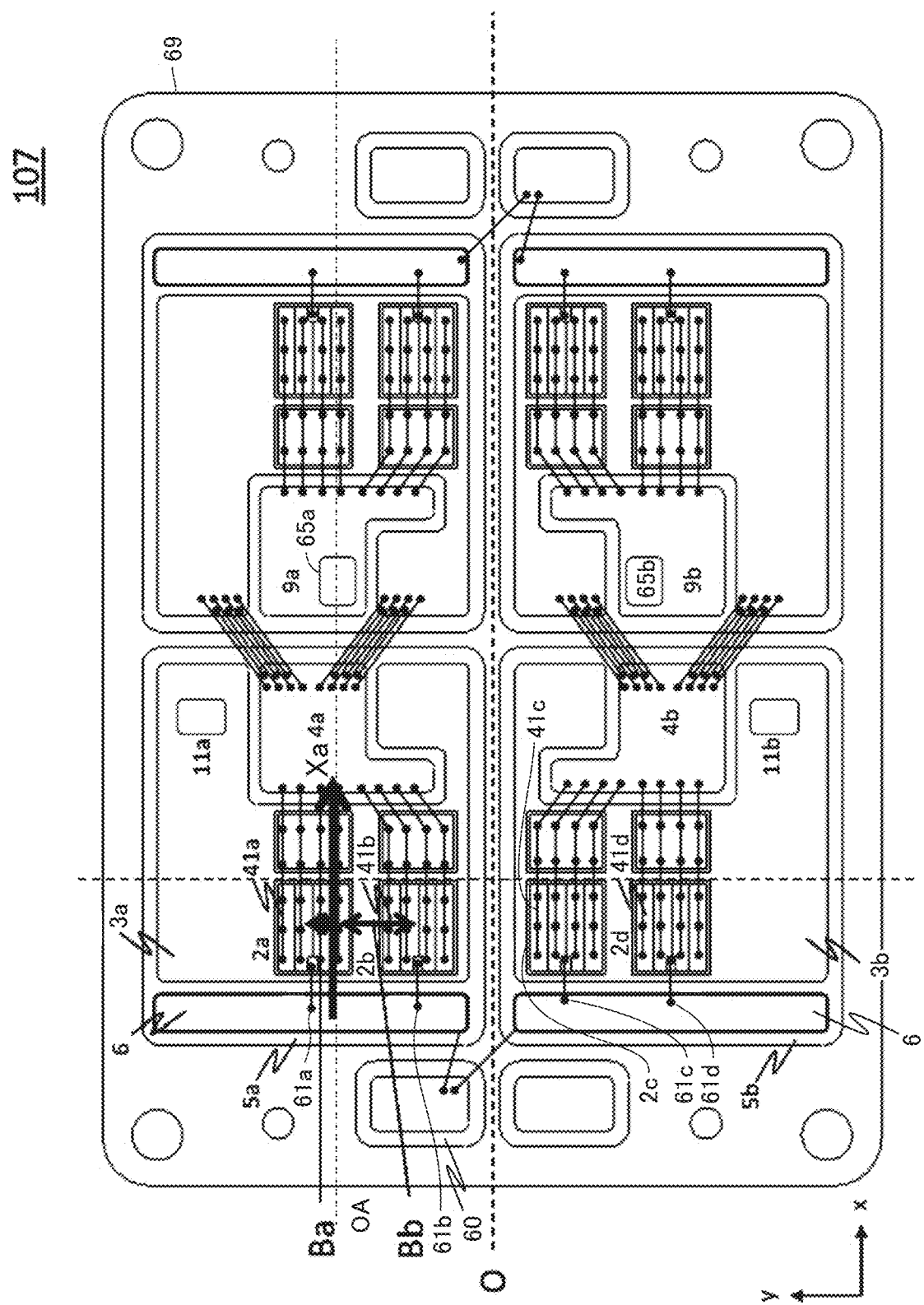
FIG. 40 is a diagram showing a current path of principal current in a proximal electrode part included in a positive electrode in embodiment 7.

In view of the above, in embodiment 7, emitter wires 41a, 41b for semiconductor switching elements 2a, 2b are arranged parallel to current path Xa of principal current in proximal electrode part 10AH of positive electrode 10a, as shown in FIG. 40. The direction of principal current through current path Xa in proximal electrode part 10AH (the positive direction in the x-axis) is the same as the direction of current flowing through emitter wires 41a, 41b (the positive direction in the x-axis). Further, semiconductor switching elements 2a, 2b are arranged so that Ba<Bb is satisfied, where Ba denotes the distance from current path Xa of principal current in proximal electrode part 10AH of positive electrode 10a to emitter wire 41a for semiconductor switching element 2a, and Bb denotes the distance from current path Xa of principal current in proximal electrode part 10AH of the positive electrode to emitter wire 41b for semiconductor switching element 2b.

In view of the above, in embodiment 7, emitter wires 41a, 41b for semiconductor switching elements 2a, 2b are arranged parallel to current path Xa of principal current in proximal electrode part 10AH of positive electrode 10a, as shown in FIG. 40. The direction of principal current through current path Xa in proximal electrode part 10AH (the positive direction in the x-axis) is the same as the direction of current flowing through emitter wires 41a, 41b (the positive direction in the x-axis). Further, semiconductor switching elements 2a, 2b are arranged so that Ba<Bb is satisfied, where Ba denotes the distance from current path Xa of principal current in proximal electrode part 10AH of positive electrode 10a to emitter wire 41a for semiconductor switching element 2a, and Bb denotes the distance from current path Xa of principal current in proximal electrode part 10AH of the positive electrode to emitter wire 41b for semiconductor switching element 2b.

Figure 41:
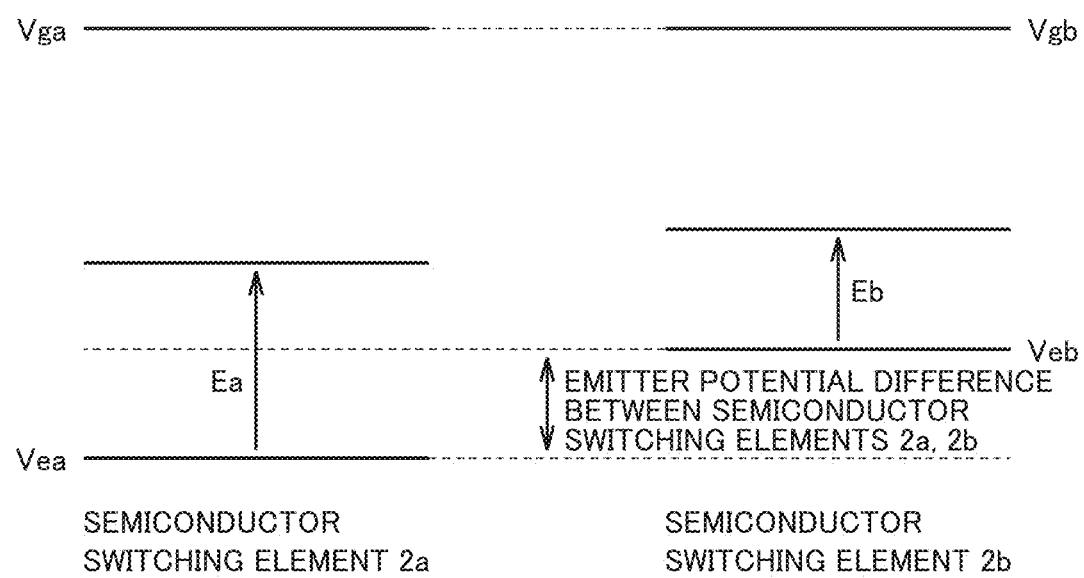
FIG. 41 is a diagram showing potentials of two semiconductor switching elements according to embodiment 7.

With emitter wires 41a, 41b for semiconductor switching elements 2a, 2b being arranged in such a manner, when emitter wires 41a, 41b are linked with magnetic fluxes due to a variation with time of current flowing through positive electrode 10a, then induced electromotive force Ea is generated at emitter wire 41a for semiconductor switching element 2a, and induced electromotive force Eb is generated at emitter wire 41b for semiconductor switching element 2b. At this time, induced electromotive forces Ea, Eb are generated so that the potential is higher at the emitters of semiconductor switching elements 2a, 2b than at emitter pattern 4a. At this time, the generation of induced electromotive force increases with decreasing distance from current path Xa of principal current flowing through proximal electrode part 10AH of positive electrode 10a to emitter wires 41a, 41b for semiconductor switching elements 2a, 2b. Therefore, Ea>Eb is satisfied for induced electromotive forces Ea, Eb generated on emitter wires 41a, 41b for semiconductor switching elements 2a, 2b. Thus, as shown in FIG. 41, the difference arises between induced electromotive forces Ea and Eb generated at emitter wires 41a and 41b for semiconductor switching elements 2a and 2b, so as to reduce the difference in emitter potential caused by the emitter inductance difference between semiconductor switching elements 2a and 2b. This results in reduction of the difference in gate-emitter voltage between semiconductor switching elements 2a and 2b, thus equalizing the currents flowing through semiconductor switching elements 2a and 2b.

As described above, the present embodiment can equalize the currents flowing through the semiconductor switching elements, thus providing a long-life, reliable semiconductor module. Also, since an excessive current does not flow, the energy consumption can be reduced.

Embodiment 8

Figure 42:
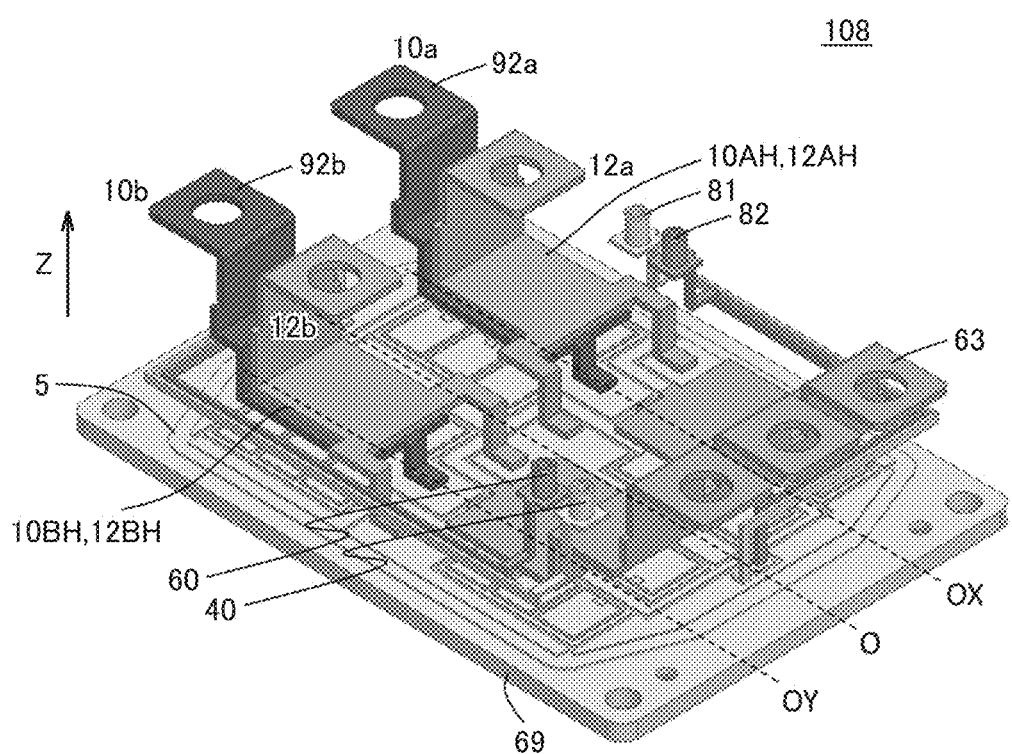
FIG. 42 is a perspective view showing an internal interconnection structure of a semiconductor module according to embodiment 8.
Figure 43:
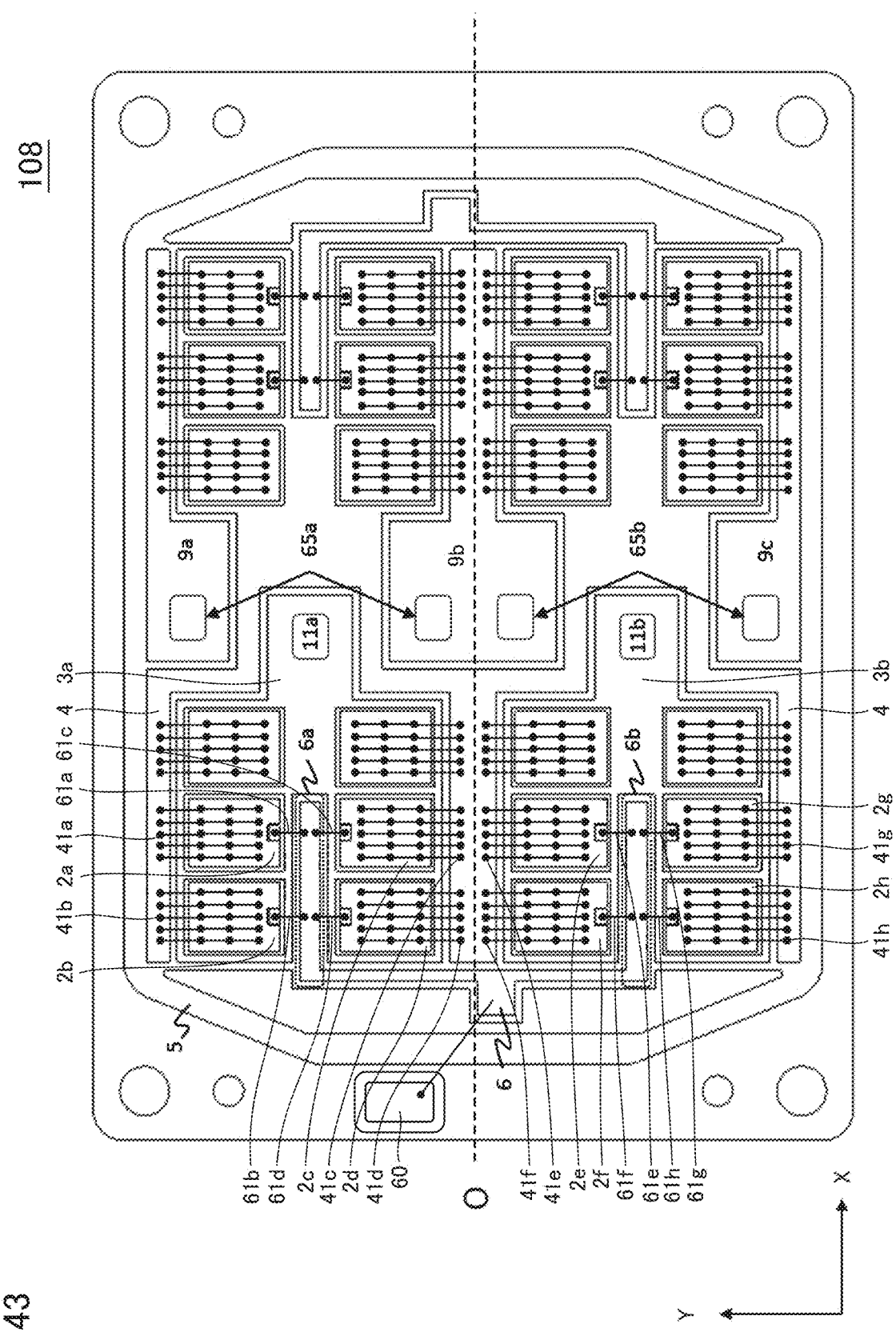
FIG. 43 is a top view of the semiconductor module in embodiment 8, but without an electrode portion.
Figure 44:
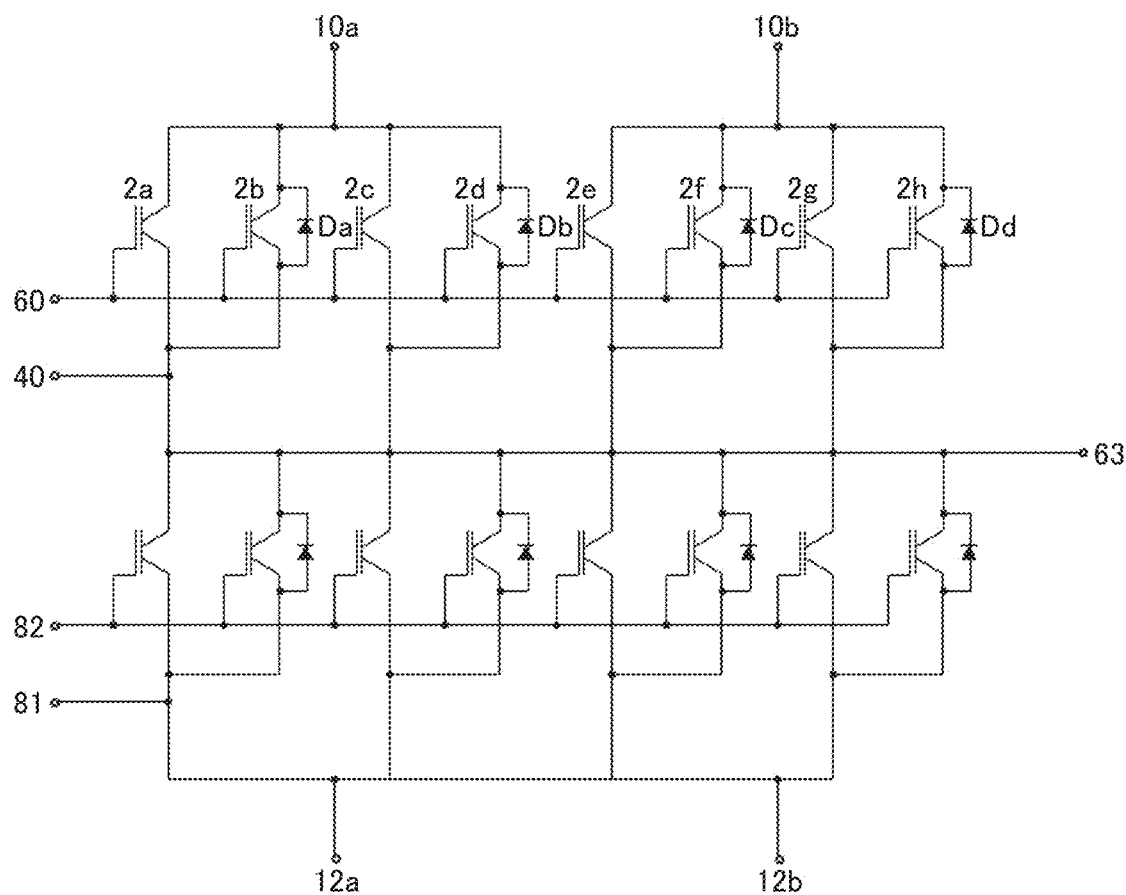
FIG. 44 is a circuit diagram of the main configuration of the semiconductor module in embodiment 8.

FIG. 42 is a perspective view showing an internal interconnection structure of a semiconductor module 108 according to embodiment 8. FIG. 43 is a top view of semiconductor module 108 in embodiment 8, but without an electrode portion. FIG. 44 is a circuit diagram of the main configuration of semiconductor module 108 in embodiment 8.

With reference to FIG. 42, semiconductor module 108 includes positive electrodes 10a, 10b, negative electrodes 12a, 12b, and output electrode 63. As to an upper arm, semiconductor module 108 further includes gate control electrode 60, emitter control electrode 40, semiconductor switching elements 2a, 2b, 2c, 2d, 2e, 2f, 2g, 2h, and diodes Da, Db, Dc, Dd.

Semiconductor switching elements 2a, 2b, 2c, 2d are connected in parallel between positive electrode 10a and negative electrode 12a. Semiconductor switching elements 2e, 2f, 2g, 2h are connected in parallel between positive electrode 10b and negative electrode 12b. Diodes Da, Db, Dc, Dd are connected in parallel to semiconductor switching elements 2a, 2b, 2c, 2d, 2e, 2f, 2g, 2h.

Gate control electrode 60 is connected to gate pattern 6. Gate control wires 61a, 61b, 61c, 61d are connected to a part 6a of gate pattern 6, and gate control wires 61e, 61f, 61g, 61h are connected to a part 6b of gate pattern 6. Gate control electrode 60 controls the gates of semiconductor switching elements 2a, 2b, 2c, 2d, 2e, 2f, 2g, 2h.

Emitter control electrode 40 controls the emitters of semiconductor switching elements 2a, 2b, 2c, 2d, 2e, 2f, 2g, 2h.

As to a lower arm, semiconductor module 108 has a configuration similar to that of the upper arm. FIG. 42 shows gate control electrode 82 and emitter control electrode 81 for the lower arm. In the following, the elements of the upper arm are described. Since the lower arm has the same configuration as the upper arm, the explanation is not repeated for the lower arm.

FIG. 42 shows a three-dimensional configuration including: base plate 69; positive electrodes 10a, 10b; negative electrodes 12a, 12b; insulating plate 5; output electrode 63; gate control electrode 60 and emitter control electrode 40 of the upper arm; and gate control electrode 82 and emitter control electrode 81 of the lower arm.

In FIG. 43, the lengthwise direction of base plate 69 is defined as an x-axis direction, and the widthwise direction of base plate 69 is defined as a y-axis direction. Semiconductor switching elements 2a, 2b, 2c, 2d, made of IGBT chips or the like, are disposed on collector pattern 3a on insulating plate 5. Semiconductor switching elements 2e, 2f, 2g, 2h are disposed on collector pattern 3b on insulating plate 5. The collectors of semiconductor switching elements 2a, 2b, 2c, 2d are connected to collector pattern 3a via solder or the like. The collectors of semiconductor switching elements 2e, 2f, 2g, 2h are connected to collector pattern 3b via solder or the like. Collector patterns 3a, 3b are disposed on insulating plate 5.

The emitters of semiconductor switching elements 2a, 2b, 2c, 2d, 2e, 2f, 2g, 2h are connected to emitter pattern 4 via emitter wires 41a, 41b, 41c, 41d, 41e, 41f, 41g, 41h. Emitter pattern 4 is disposed on insulating plate 5.

Emitter interconnections EMA, EMB, EMC, EMD, EME, EMF, EMG, EMH for semiconductor switching elements 2a, 2b, 2c, 2d, 2e, 2f, 2g, 2h are interconnections that connect the emitters of semiconductor switching elements 2a, 2b, 2c, 2d, 2e, 2f, 2g, 2h to negative electrode 12. Emitter interconnections EMA, EMB, EMC, EMD, EME, EMF, EMG, EMH include emitter wires 41a, 41b, 41c, 41d, 41e, 41f, 41g, 41h.

Positive electrode 10a is connected to collector pattern 3a via positive electrode joint 11a. Positive electrode 10b is connected to collector pattern 3b via positive electrode joint 11b.

Negative electrode 12a is connected to emitter patterns 9a, 9b for the semiconductor switching elements of the opposite arm (lower arm) via negative electrode joint 65a. Negative electrode 12b is connected to emitter patterns 9b, 9c for the semiconductor switching elements of the opposite arm (lower arm) via negative electrode joint 65b.

With reference to FIG. 42, the direction which is perpendicular to base plate 69 and insulating plate 5, and in which insulating plate 5 is placed is defined as a vertical direction (z-axis direction).

A part (part 10AH) of positive electrode 10a that is parallel to insulating plate 5 coincides in position with a part (part 12AH) of negative electrode 12a that is parallel to insulating plate 5, as seen in the vertical direction. The layer where part 10AH is disposed is located below the layer where part 12AH is disposed. Therefore, part 10AH is located closer to insulating plate 5 than part 12AH is. In embodiment 8, part 10AH is defined as a proximal electrode part. Similarly, a part (part 10BH) of positive electrode 10b that is parallel to insulating plate 5 coincides in position with a part (part 12BH) of negative electrode 12b that is parallel to insulating plate 5, as seen in the vertical direction. The layer where part 10BH is disposed is located below the layer where part 12BH is disposed. Therefore, part 10BH is located closer to insulating plate 5 than part 12BH is. In embodiment 8, part 10BH is defined as a proximal electrode part.

With reference to FIG. 43, gate control electrode 60 for controlling semiconductor switching elements 2a, 2b, 2c, 2d, 2e, 2f, 2g, 2h is connected to gate pattern 6. Gate pattern 6 is connected to the gates of semiconductor switching elements 2a, 2b, 2c, 2d, 2e, 2f, 2g, 2h via gate control wires 61a, 61b, 61c, 61d, 61e, 61f, 61g, 61h.

Further, emitter control electrode 40 for controlling semiconductor switching elements 2a, 2b, 2c, 2d, 2e, 2f, 2g, 2h is connected to emitter pattern 4.

The operation of semiconductor module 10X shown in embodiment 8 at the time of turn-on is described with reference to FIG. 45 to FIG. 48. In particular, the main circuit pattern on insulating plate 5, and positive electrode 10 and negative electrode 12 are generally symmetrical with respect to symmetry line O. The main circuit pattern on insulating plate 5 in the region above symmetry line O in the Y-axis direction, and positive electrode 10 and negative electrode 12 are generally symmetrical with respect to symmetry line OX. The main circuit pattern on insulating plate 5 in the region below symmetry line O in the Y-axis direction, and positive electrode 10 and negative electrode 12 are generally symmetrical with respect to symmetry line OY. Thus, semiconductor switching elements 2a, 2b are focused on and described.

In embodiment 8, emitter interconnection EMA connecting the emitter of semiconductor switching element 2a to negative electrode 12a may be different from emitter interconnection EMB connecting the emitter of semiconductor switching element 2b to negative electrode 12a in interconnection length or interconnection width, or in both interconnection length and interconnection width. In such a case, a difference may arise between the parasitic inductances (i.e., emitter inductances) on emitter interconnections EMA and EMB for semiconductor switching elements 2a and 2b.

Figure 45:
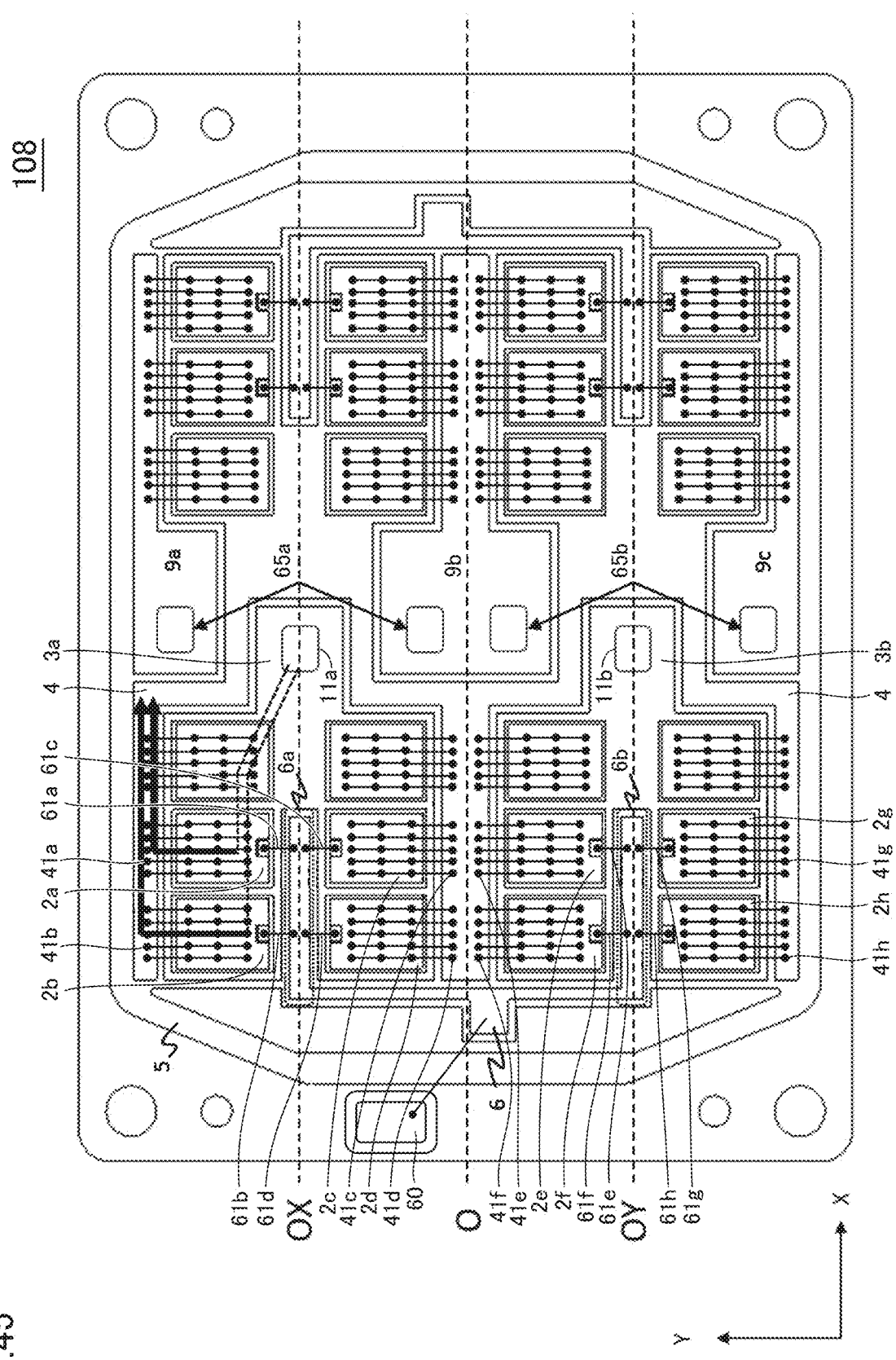
FIG. 45 is a diagram showing a place where a difference in emitter inductance arises between semiconductor switching elements in the semiconductor module in embodiment 8.

As shown in FIG. 45, at the thick arrow portions, there is a path length difference between the path from the emitter of semiconductor switching element 2b to negative electrode 12a, and the path from the emitter of semiconductor switching element 2a to negative electrode 12a. Accordingly, the emitter inductance of semiconductor switching element 2b is higher than the emitter inductance of semiconductor switching element 2a. That is, La<Lb is satisfied, where La denotes the emitter inductance of semiconductor switching element 2a, and Lb denotes the emitter inductance of semiconductor switching element 2b.

At this time, when semiconductor module 101 is turned on, a pulsed voltage is applied to the gates of semiconductor switching elements 2a to 2h simultaneously. Then, current i flowing from positive electrodes 10a, 10b to negative electrodes 12a, 12b (hereinafter also referred to as a principal current) varies with time. That is, current change $di/dt$ occurs.

When current change $di/dt$ occurs, induced electromotive force $Va = La \times di/dt$ is generated at emitter interconnection EMA for semiconductor switching element 2a based on emitter inductance La of semiconductor switching element 2a and current change $di/dt$. Also, induced electromotive force $Vb = Lb \times di/dt$ is generated at emitter interconnection EMB for semiconductor switching element 2b based on emitter inductance Lb of semiconductor switching element 2b and current change $di/dt$. Since La<Lb is satisfied, Va<Vb is satisfied. That is, where the emitter potential of semiconductor switching element 2a is denoted by Vea, and the emitter potential of semiconductor switching element 2b is denoted by Veb, Vea is lower than Veb due to the difference between the induced electromotive forces generated at emitter interconnections EMA and EMB for semiconductor switching elements 2a and 2b, thus satisfying Vea<Veb. A difference in emitter potential between two semiconductor switching elements 2a and 2b will cause a difference in gate-emitter voltage between two semiconductor switching elements 2a and 2b, thus unequalizing the currents flowing through semiconductor switching elements 2a and 2b connected in parallel.

Figure 46:
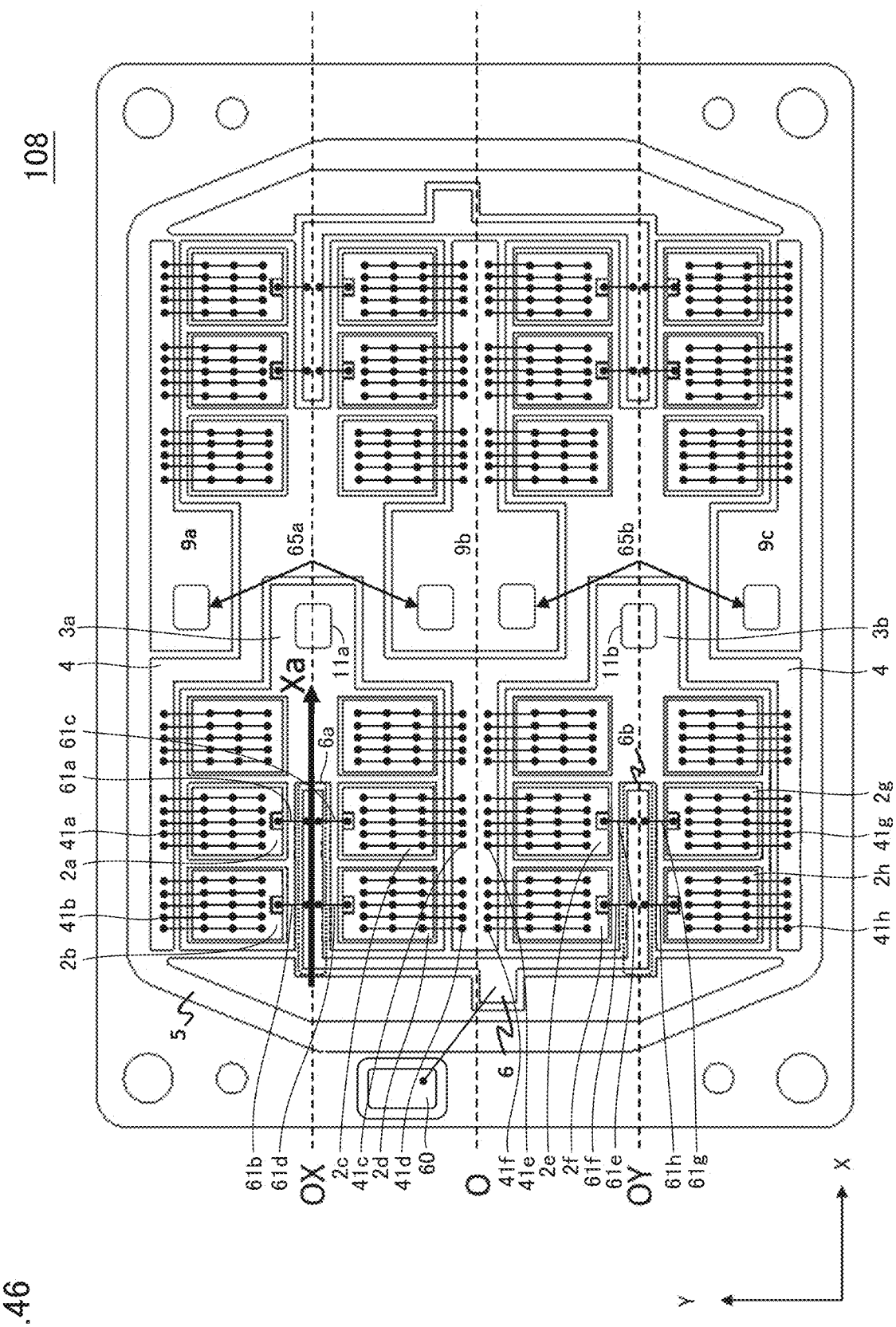
FIG. 46 is a diagram showing a current path of principal current in a proximal electrode part included in a positive electrode in embodiment 8.
Figure 47:
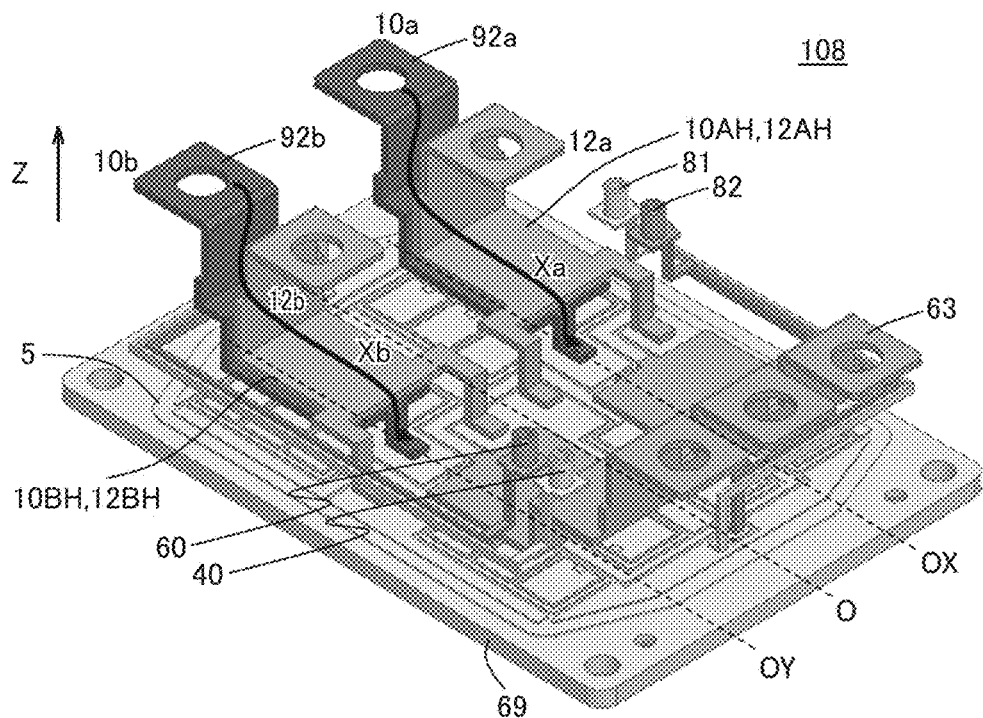
FIG. 47 is a diagram showing current paths of principal current in two positive electrodes in embodiment 8.
Figure 48:
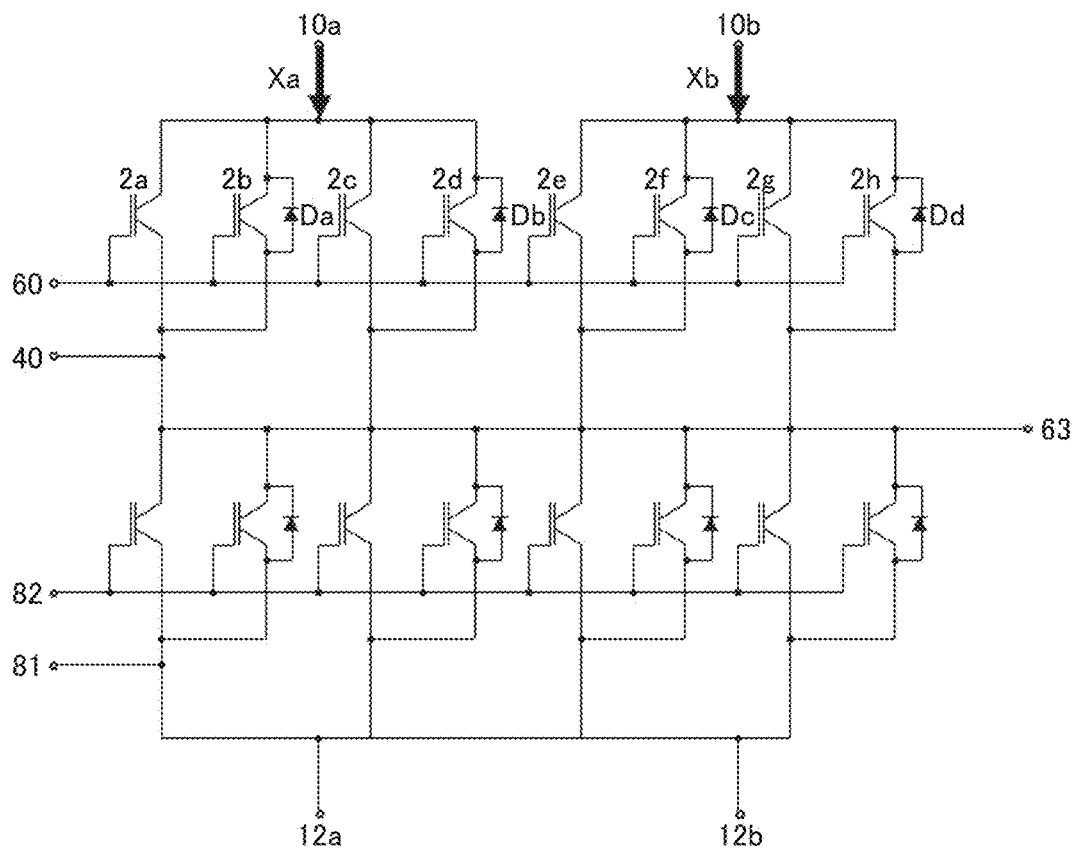
FIG. 48 is a diagram showing current paths of principal current in the two positive electrodes in embodiment 8.

In view of the above, in embodiment 8, part 6a of gate pattern 6 that connects gate control wires 61a, 61b for semiconductor switching elements 2a, 2b is arranged parallel to and below (in the vertical direction) current path Xa of principal current in proximal electrode part 10AH included in positive electrode 10a, as shown in FIG. 46. The direction of current through the current path of principal current in proximal electrode part 10AH (the positive direction in the x-axis) is the same as the direction of current flowing through part 6a (the positive direction in the x-axis).

With part 6a of gate pattern 6 that connects gate control wires 61a, 61b for semiconductor switching elements 2a, 2b being arranged in such a manner, when part 6a is linked with a magnetic flux due to a variation with time of principal current flowing through current path Xa in proximal electrode part 10AH of positive electrode 10a, an induced electromotive force GXa is generated at part 6a. At this time, induced electromotive force GXa is generated so that the potential is higher at the connection point between part 6a and gate control wire 61b than at the connection point between part 6a and gate control wire 61a.

Since gate control wires 61a, 61b for semiconductor switching elements 2a, 2b are orthogonal to current path Xa of principal current in proximal electrode part 10AH of positive electrode 10a, an induced electromotive force is not generated on gate control wires 61a, 61b. Accordingly, gate control wires 61a, 61b have almost the same potential. Therefore, gate potential Vga of semiconductor switching element 2a is lower than gate potential Vgb of semiconductor switching element 2b, thus satisfying Vga<Vgb.

Figure 49:
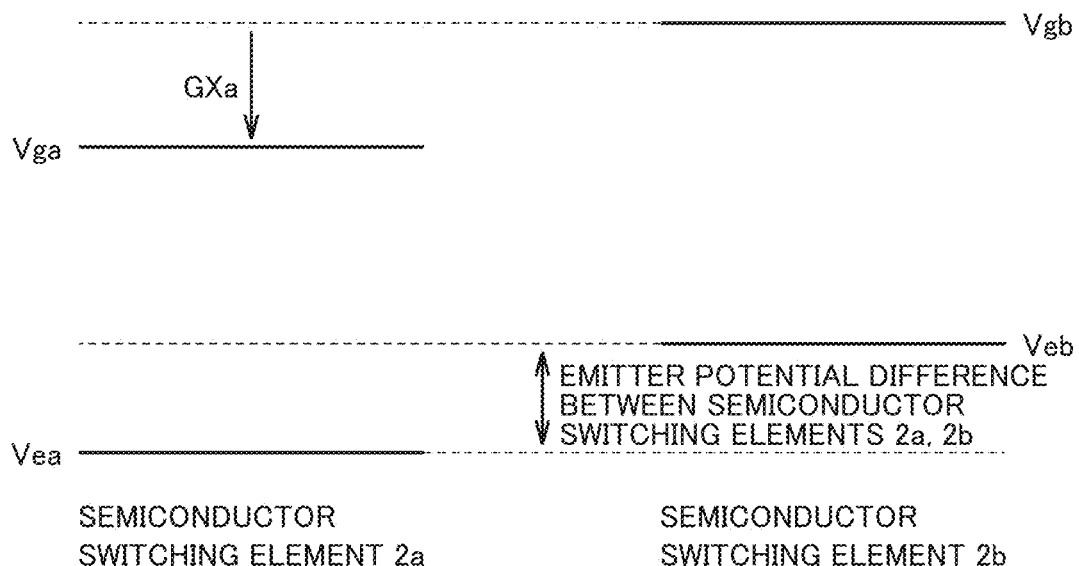
FIG. 49 is a diagram showing potentials of two semiconductor switching elements according to embodiment 8.

Thus, as shown in FIG. 49, induced electromotive force GXa generated at gate pattern 6a causes a difference (Vgb−Vga) between gate control wires 61a and 61b so as to reduce the difference (Veb−Vea) in gate-emitter voltage caused by the emitter inductance difference between semiconductor switching elements 2a and 2b. This results in reduction of the difference (Veb−Vea) in gate-emitter voltage between semiconductor switching elements 2a and 2b, thus equalizing the currents flowing through semiconductor switching elements 2a and 2b.

The above description considers the influences of current path Xa of principal current in proximal electrode part 10AH of positive electrode 10a, but does not consider the influences of the current path of principal current in negative electrode 12a. This is because the upper electrode in the vertical direction is remoter from the gate pattern than the lower electrode is. In other words, the upper electrode produces a much lower induced electromotive force at the gate pattern than the lower electrode.

As described above, the present embodiment can equalize the currents flowing through the semiconductor switching elements, thus providing a long-life, reliable semiconductor module. Also, since an excessive current does not flow, the energy consumption can be reduced.

Further, the present embodiment can equalize the heat generation among the semiconductor switching elements, preventing partially high heat generation from a particular semiconductor switching element. Accordingly, a small cooling structure suffices, thus reducing the weight. This can also reduce the size of the entire apparatus, thus reducing the size of the package. Such a small-size apparatus is eco-friendly because it produces less waste when discarded.

Embodiment 9

The present embodiment is an embodiment to which any of the above-described semiconductor devices in embodiments 1 to 8 is applied to a power conversion apparatus. As embodiment 9, a case in which the present invention is applied to a three-phase inverter is hereinafter described, although the present invention is not limited to a particular power conversion apparatus.

Figure 50:
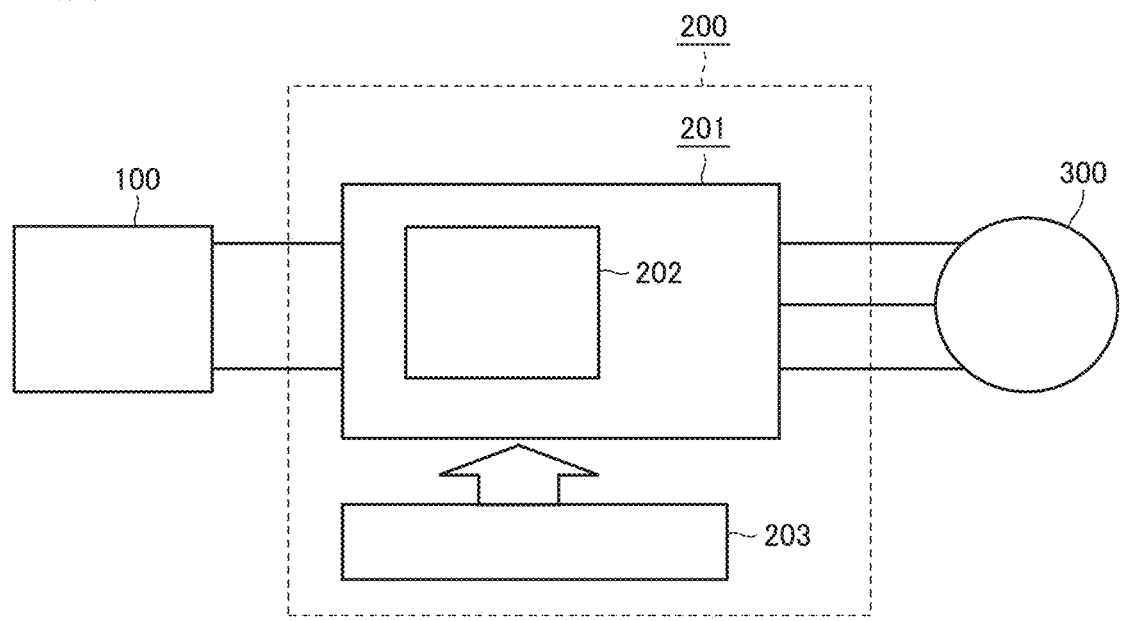
FIG. 50 is a block diagram showing a configuration of a power conversion system to which a power conversion apparatus according to embodiment 9 is applied.

FIG. 50 is a block diagram showing a configuration of a power conversion system to which a power conversion apparatus according to embodiment 9 is applied.

The power conversion system shown in FIG. 50 comprises a power source 100, a power conversion apparatus 200, and a load 300. Power source 100 is a DC power source to supply DC power to power conversion apparatus 200. Power source 100 may be of various types, such as a DC system, a solar battery, or a storage battery, or may be composed of a rectifier circuit and an AC-DC converter connected to an AC system. Alternatively, power source 100 may be composed of a DC-DC converter to convert DC power outputted from a DC system into predetermined power.

Power conversion apparatus 200 is a three-phase inverter connected between power source 100 and load 300. Power conversion apparatus 200 converts DC power supplied from power source 100 into AC power, and supplies the AC power to load 300. As shown in FIG. 50, power conversion apparatus 200 includes a main conversion circuit 201 to convert DC power into AC power and output the converted power, and a control circuit 203 to output a control signal to main conversion circuit 201 to control main conversion circuit 201.

Load 300 is a three-phase electric motor to be driven by AC power supplied from power conversion apparatus 200. Load 300 is not limited to a particular application but may be an electric motor for various types of electrical equipment. For example, load 300 is used as an electric motor for a hybrid vehicle, an electric vehicle, a railway vehicle, an elevator, or air-conditioning equipment.

Power conversion apparatus 200 is hereinafter described in detail. Main conversion circuit 201 includes switching elements and freewheel diodes (not shown). By switching the switching elements, main conversion circuit 201 converts DC power supplied from power source 100 into AC power, and supplies the AC power to load 300. Various specific circuit configurations of main conversion circuit 201 are possible. Main conversion circuit 201 in the present embodiment is a two-level three-phase full-bridge circuit including six switching elements and six freewheel diodes connected in anti-parallel to the respective switching elements. The switching elements and freewheel diodes of main conversion circuit 201 constitute semiconductor module 202 corresponding to any of the above-described embodiments. In six switching elements, each pair of switching elements are connected in series to form upper and lower arms. The pairs of upper and lower arms form the phases (U, V, and W phases) of the full-bridge circuit. The output terminals of the pairs of upper and lower arms, i.e., three output terminals of main conversion circuit 201 are connected to load 300.

Main conversion circuit 201 also includes a driving circuit (not shown) to drive each switching element. The driving circuit may be included in semiconductor module 202, or may be provided separately from semiconductor module 202. The driving circuit generates a driving signal for driving each switching element of main conversion circuit 201, and supplies the driving signal to the control electrode for the switching element of main conversion circuit 201. Specifically, the driving circuit outputs, to the control electrode for each switching element, a driving signal for turning on the switching element and a driving signal for turning off the switching element, in accordance with a control signal from later-described control circuit 203. For maintaining an on-state of a switching element, the driving signal is a signal for a voltage equal to or higher than the threshold voltage of the switching element (on-signal); whereas for maintaining an off-state of a switching element, the driving signal is a signal for a voltage equal to or lower than the threshold voltage of the switching element (off-signal).

Control circuit 203 controls each switching element of main conversion circuit 201 so that desired power is supplied to load 300. Specifically, control circuit 203 calculates the time (on-time) for which each switching element of main conversion circuit 201 should be in an on-state, based on the power to be supplied to load 300. For example, control circuit 203 may control main conversion circuit 201 by the PWM control in which the on-time of each switching element is modulated in accordance with the voltage to be outputted. Control circuit 203 outputs a control instruction (control signal) to the driving circuit in main conversion circuit 201, so that a switching element to be ON is given an on-signal and a switching element to be OFF is given an off-signal on each point of time. In accordance with this control signal, the driving circuit outputs the on-signal or off-signal as the driving signal to the control electrode for each switching element.

The power conversion apparatus in the present embodiment, to which any of semiconductor modules in embodiments 1 to 8 is applied as the switching elements and freewheel diodes of main conversion circuit 201, can increase the capacity (reliability).

Although the present embodiment describes a case in which the present invention is applied to a two-level three-phase inverter, the present invention is not limited to this but may be applied to various power conversion apparatuses. Instead of a two-level power conversion apparatus as in the present embodiment, the present invention may be applied to a three-level or multilevel power conversion apparatus. If power is supplied to a single-phase load, the present invention may be applied to a single-phase inverter. If power is supplied to, for example, a DC load, the present invention may be applied to a DC-DC converter or AC-DC converter.

A power conversion apparatus to which the present invention is applicable is not limited to a case in which the above-described load is an electric motor. It may be used as a power unit for an electric discharge machine, laser beam machine, induction cooker, or contactless feed system, for example. Further, it may be used as a power conditioner for a photovoltaic power system or electricity storage system, for example.

Variation Common to the Embodiments

The present invention is not limited to the above-described embodiments but includes the following variation, for example.

(1) Material of Semiconductor Switching Element

The semiconductor switching element may be a wide-gap semiconductor made of SiC (silicon carbide), GaN (gallium nitride), C (diamond) or the like, instead of Si (silicon). The wide-gap semiconductor switching element, which can operate with a high di/dt, is suitable for high-speed switching.

With the prior art, however, if high-speed switching is performed by utilizing the characteristics of the wide-gap semiconductor switching element, an induced electromotive force given by L×di/dt will be high. This causes wide variations in emitter potential between the semiconductor switching elements, thus causing wide variations in current between the semiconductor switching elements. The above-described embodiments, on the other hand, generates an induced electromotive force in at least one of the gate interconnection, the emitter interconnection EMA, and the emitter control interconnection, so as to reduce the emitter potential difference between the semiconductor switching elements. Thus, the currents between the semiconductor switching elements are equalized. As a result, the characteristics of the wide-gap semiconductor element, high suitability for high-speed switching, can be utilized.

(2) Direction of Principal Current and Direction of Wire Where Induced Electromotive Force is Generated For example, embodiment 1 is most effective when the current path of principal current in negative electrode 12 is parallel to and in the opposite direction to the gate control wire. This is, however, not mandatory. It is simply required that the vector of current flowing through the gate control wire include a component parallel (not perpendicular) to the current path of principal current flowing through negative electrode 12. The same applies to the other embodiments.

It should be understood that the embodiments disclosed herein are by way of example in every respect, not by way of limitation. The scope of the present invention is defined not by the above description but by the terms of the claims, and is intended to include any modification within the meaning and scope equivalent to the terms of the claims. The above embodiments describe the operation at the time of turn-on. However, it may be applied to the operation at the time of turn-off by reversing the direction of current. In this case, the same advantageous effects can be obtained. That is, the same advantageous effects can be obtained in both switching operations, turn-on and turn-off.

REFERENCE SIGNS LIST 2a, 2b, 2c, 2d: semiconductor switching element; 3a, 3b: collector pattern; 4a, 4b, 9a, 9b: emitter pattern; 5a, 5b: insulating plate; 6: gate pattern; 7: emitter control pattern; 10, 10a, 10b: positive electrode; 11a, 11b: positive electrode joint; 12, 12a, 12b: negative electrode; 41a, 41b, 41c, 41d: emitter wire; 61a, 61b, 61c, 61d: gate control wire; 60: gate control electrode; 63: output electrode; 65a, 65b: negative electrode joint; 69: base plate; 70: emitter control electrode; 71a, 71b, 71c, 71d: emitter control wire; 81: emitter control electrode; 82: gate control electrode; 100: power source; 200: power conversion apparatus; 201: main conversion circuit; 101 to 108, 202: semiconductor module; 203: control circuit; 300: load; Da, Db, Dc, Dd: diode

The invention claimed is:

1. A semiconductor module comprising: an insulating plate; a positive electrode; a negative electrode; a first semiconductor switching element and a second semiconductor switching element provided on the insulating plate and connected in parallel between the positive electrode and the negative electrode; a gate control electrode configured to control a gate of the first semiconductor switching element and a gate of the second semiconductor switching element; a gate pattern connected to the gate control electrode; a first gate control wire connecting the gate of the first semiconductor switching element to the gate pattern; a second gate control wire connecting the gate of the second semiconductor switching element to the gate pattern; an emitter pattern connected to the negative electrode; a first emitter wire connecting an emitter of the first semiconductor switching element to the emitter pattern; and a second emitter wire connecting an emitter of the second semiconductor switching element to the emitter pattern, a first emitter interconnection connecting the emitter of the first semiconductor switching element to the negative electrode being different in one or both of length and width from a second emitter interconnection connecting the emitter of the second semiconductor switching element to the negative electrode, at a time of switching, an induced electromotive force being generated at the first gate control wire and the second gate control wire, or at the gate pattern, or at the first emitter wire and the second emitter wire, by at least one of a current flowing through the positive electrode and a current flowing through the negative electrode, so as to reduce a difference between an emitter potential of the first semiconductor switching element and an emitter potential of the second semiconductor switching element caused by the difference of the emitter interconnections.

2. The semiconductor module according to claim 1, wherein at least one of the positive electrode and the negative electrode has a current path of principal current not perpendicular to the first gate control wire and not perpendicular to the second gate control wire.

3. The semiconductor module according to claim 2, wherein at least one of the positive electrode and the negative electrode has a current path of principal current parallel to the first gate control wire and parallel to the second gate control wire.

4. The semiconductor module according to claim 3, wherein
at the time of the switching, the emitter potential of the first semiconductor switching element is higher than the emitter potential of the second semiconductor switching element,
where a proximal electrode part is defined as one of two parts whichever is located closer to the insulating plate, one of the two parts being a part of the positive electrode that is parallel to the insulating plate, the other of the two parts being a part of the negative electrode that is parallel to the insulating plate,
the first gate control wire and the second gate control wire are parallel to the current path of principal current in the proximal electrode part,
a direction of current through the current path of principal current in the proximal electrode part is opposite to a direction of current flowing through the first gate control wire and the second gate control wire, and
the first gate control wire is located closer to the current path of principal current in the proximal electrode part than the second gate control wire is located.

5. The semiconductor module according to claim 3, wherein
at the time of the switching, the emitter potential of the first semiconductor switching element is higher than the emitter potential of the second semiconductor switching element,
where a proximal electrode part is defined as one of two parts whichever is located closer to the insulating plate, one of the two parts being a part of the positive electrode that is parallel to the insulating plate, the other of the two parts being a part of the negative electrode that is parallel to the insulating plate,
the first gate control wire and the second gate control wire are parallel to the current path of principal current in the proximal electrode part,
a direction of current through the current path of principal current in the proximal electrode part is the same as a direction of current flowing through the first gate control wire and the second gate control wire, and
the first gate control wire is located more remote from the current path of principal current in the proximal electrode part than the second gate control wire is located.

6. The semiconductor module according to claim 5, further comprising:
an emitter control electrode configured to control the emitter of the first semiconductor switching element and the emitter of the second semiconductor switching element;
an emitter control pattern connected to the emitter control electrode;
a first emitter control wire connecting the emitter of the first semiconductor switching element to the emitter control pattern; and
a second emitter control wire connecting the emitter of the second semiconductor switching element to the emitter control pattern, wherein
an induced electromotive force is generated at the first emitter control wire and the second emitter control wire, by at least one of a current flowing through the positive electrode and a current flowing through the negative electrode,
at the time of the switching, when a difference between the emitter potential of the first semiconductor switching element and the emitter potential of the second semiconductor switching element is equal to a difference between the induced electromotive force generated at the second gate control wire and the induced electromotive force generated at the first gate control wire, a distance between the current path of principal current in the proximal electrode part and the first emitter control wire is equal to a distance between the current path of principal current in the proximal electrode part and the second emitter control wire,
at the time of the switching, when the difference between the emitter potential of the first semiconductor switching element and the emitter potential of the second semiconductor switching element is larger than the difference between the induced electromotive force generated at the second gate control wire and the induced electromotive force generated at the first gate control wire, the distance between the current path of principal current in the proximal electrode part and the first emitter control wire is shorter than the distance between the current path of principal current in the proximal electrode part and the second emitter control wire, and
at the time of the switching, when the difference between the emitter potential of the first semiconductor switching element and the emitter potential of the second semiconductor switching element is smaller than the difference between the induced electromotive force generated at the second gate control wire and the induced electromotive force generated at the first gate control wire, the distance between the current path of principal current in the proximal electrode part and the first emitter control wire is longer than the distance between the current path of principal current in the proximal electrode part and the second emitter control wire.

7. The semiconductor module according to claim 3, wherein the first gate control wire is shorter than the second gate control wire.

8. The semiconductor module according to claim 1, wherein at least one of the positive electrode and the negative electrode has a current path of principal current that is perpendicular to the first gate control wire, perpendicular to the second gate control wire, and parallel to the gate pattern.

9. The semiconductor module according to claim 1, wherein at least one of the positive electrode and the negative electrode has a current path of principal current not perpendicular to the first emitter wire and not perpendicular to the second emitter wire.

10. The semiconductor module according to claim 8, wherein at least one of the positive electrode and the negative electrode has a current path of principal current parallel to the first emitter wire and parallel to the second emitter wire.

11. The semiconductor module according to claim 10, wherein
at the time of the switching, the emitter potential of the first semiconductor switching element is higher than the emitter potential of the second semiconductor switching element,
where a proximal electrode part is defined as one of two parts whichever is located closer to the insulating plate, one of the two parts being a part of the positive electrode that is parallel to the insulating plate, the other of the two parts being a part of the negative electrode that is parallel to the insulating plate,
the first emitter wire and the second emitter wire are parallel to the current path of principal current in the proximal electrode part,
a direction of current through the current path of principal current in the proximal electrode part is opposite to a direction of current flowing through the first emitter wire and the second emitter wire, and
the first emitter wire is located closer to the current path of principal current in the proximal electrode part than the second emitter wire is located.

12. The semiconductor module according to claim 10, wherein
at the time of the switching, the emitter potential of the first semiconductor switching element is higher than the emitter potential of the second semiconductor switching element,
where a proximal electrode part is defined as one of two parts whichever is located closer to the insulating plate, one of the two parts being a part of the positive electrode that is parallel to the insulating plate, the other of the two parts being a part of the negative electrode that is parallel to the insulating plate,
the first emitter wire and the second emitter wire are parallel to the current path of principal current in the proximal electrode part,
a direction of current through the current path of principal current in the proximal electrode part is the same as a direction of current flowing through the first emitter wire and the second emitter wire, and
the first emitter wire is located more remote from the current path of principal current in the proximal electrode part than the second emitter wire is located.

13. The semiconductor module according to claim 1, wherein each of the first semiconductor switching element and the second semiconductor switching element is a self-extinguishing semiconductor device made of wide-gap semiconductor having a wider band gap than silicon.

14. The semiconductor module according to claim 13, wherein the wide-gap semiconductor is any one of silicon carbide, gallium nitride, and diamond.

15. A power conversion apparatus comprising:
the semiconductor module according to claim 1;
a main conversion circuit configured to convert inputted power and output the converted power; and
a control circuit configured to output a control signal to the main conversion circuit to control the main conversion circuit.

16. The semiconductor module according to claim 1, wherein at the time of the switching, the emitter potential of the first semiconductor switching element is higher than the emitter potential of the second semiconductor switching element, where a proximal electrode part is defined as one of two parts whichever is located closer to the insulating plate, one of the two parts being a part of the positive electrode that is parallel to the insulating plate, the other of the two parts being a part of the negative electrode that is parallel to the insulating plate, the first gate control wire and the second gate control wire are parallel to the current path of principal current in the proximal electrode part, a direction of current through the current path of principal current in the proximal electrode part is opposite to a direction of current flowing through the first gate control wire and the second gate control wire, and the first gate control wire is located closer to the current path of principal current in the proximal electrode part than the second gate control wire is located.

17. The semiconductor module according to claim 1, wherein
at the time of the switching, the emitter potential of the first semiconductor switching element is higher than the emitter potential of the second semiconductor switching element,
where a proximal electrode part is defined as one of two parts whichever is located closer to the insulating plate, one of the two parts being a part of the positive electrode that is parallel to the insulating plate, the other of the two parts being a part of the negative electrode that is parallel to the insulating plate,
the first gate control wire and the second gate control wire are parallel to the current path of principal current in the proximal electrode part,
a direction of current through the current path of principal current in the proximal electrode part is the same as a direction of current flowing through the first gate control wire and the second gate control wire, and
the first gate control wire is located more remote from the current path of principal current in the proximal electrode part than the second gate control wire is located.

* * * * *